(12) United States Patent
Agrawal et al.

(10) Patent No.: US 11,522,564 B2
(45) Date of Patent: Dec. 6, 2022

(54) NEURAL NETWORKS FOR FORWARD ERROR CORRECTION DECODING

(71) Applicant: Telefonaktiebolaget LM Ericsson (publ), Stockholm (SE)

(72) Inventors: Navneet Agrawal, Jaipur (IN); Hugo Tullberg, Nyköping (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 354 days.

(21) Appl. No.: 16/625,205

(22) PCT Filed: Jun. 22, 2018

(86) PCT No.: PCT/IB2018/054627
§ 371 (c)(1),
(2) Date: Dec. 20, 2019

(87) PCT Pub. No.: WO2018/235050
PCT Pub. Date: Dec. 27, 2018

(65) Prior Publication Data
US 2021/0142158 A1 May 13, 2021

Related U.S. Application Data

(60) Provisional application No. 62/523,354, filed on Jun. 22, 2017.

(51) Int. Cl.
*H03M 13/45* (2006.01)
*H03M 13/00* (2006.01)
(Continued)

(52) U.S. Cl.
CPC ........... *H03M 13/45* (2013.01); *H03M 13/13* (2013.01); *H03M 13/616* (2013.01); *G06N 3/08* (2013.01)

(58) Field of Classification Search
CPC ........ G06N 3/08; G06N 3/0445; G06N 7/005; H03M 13/45; H03M 13/616;
(Continued)

(56) References Cited

U.S. PATENT DOCUMENTS

2008/0163025 A1* 7/2008 Djordjevic ............ H04L 27/186
714/755
2018/0121807 A1* 5/2018 Wick ................... G06N 3/0445
(Continued)

OTHER PUBLICATIONS

International Search Report and Written Opinion of the International Searching Authority, PCT/IB2018/054627, dated Oct. 22, 2018, 20 pages.
(Continued)

*Primary Examiner* — Thien Nguyen
(74) *Attorney, Agent, or Firm* — Sage Patent Group

(57) ABSTRACT

Methods and apparatus for training a neural network to recover a codeword and for decoding a received signal using a neural network are disclosed. According to examples of the disclosed methods, a syndrome check is introduced at even layers of the neural network during the training, testing and online phases. During training, optimisation of trainable parameters of the neural network is ceased after optimisation at the layer at which the syndrome check is satisfied. Examples of the method for training a neural network may be implemented via a proposed loss function. During testing and online phases, propagation through the neural network is ceased at the layer at which the syndrome check is satisfied.

25 Claims, 44 Drawing Sheets

(51) Int. Cl.
  *H03M 13/13* (2006.01)
  *G06N 3/08* (2006.01)
(58) Field of Classification Search
  CPC ............. H03M 13/6597; H03M 13/13; H03M 13/152; H03M 13/19; H03M 13/1111; H03M 13/1191
  See application file for complete search history.

(56) References Cited

U.S. PATENT DOCUMENTS

2018/0343017 A1\* 11/2018 Kumar ..................... G06N 3/08
2022/0004848 A1\* 1/2022 Hoydis .................. G06N 3/063

OTHER PUBLICATIONS

Nachmani, Eliya, et al., "Deep Learning Methods for Improved Decoding of Linear Codes," Cornell University Library, Jun. 21, 2017, 13 pages.

Ohtsuki, Tomoaki, "LDPC Codes in Communications and Broadcasting," IEICE Trans. Common., vol. E-90-B, No. 3, Mar. 2007, 2 pages.

Lugosch, Loren, et al., "Neural Offset Min-Sum Decoding," Cornell University Library, Jan. 20, 2017, 5 pages.

Nachmani, Eliya, et al., "Learning to Decode Linear Codes Using Deep Learning," 2016 $54^{th}$ Annual Allerton Conference on Communication, Control, and Computing, IEEE, Sep. 27, 2016, 6 pages.

Gruber, Tobias, et al., "On Deep Learning-Based Channel Decoding," Cornell University Library, Jan. 26, 2017, 6 pages.

Nachmani, Eliya, et al., "RNN Decoding of Linear Block Codes," Cornell University Library, Feb. 24, 2017, 7 pages.

Agrawal, Navneet, "Machine Intelligence in Decoding for Forward Error Correction Codes," Degree Project in Information and Communication Technology, KTH Royal Institute of Technology, Oct. 2, 2017, 82 pages.

Kschischang, Frank R., et al., Factor Graphs and the Sum-Product Algorithm, IEEE Transactions on Information Theory, vol. 47, No. 2, Feb. 2001, 22 pages.

Agrawal, Navneet, et al., "Neural Network Decoders," Jun. 20, 2017, 20 pages.

\* cited by examiner $$H = \begin{bmatrix} 1 & 0 & 0 & 1 & 0 & 0 & 0 \\ 1 & 1 & 0 & 0 & 1 & 0 & 0 \\ 0 & 0 & 1 & 0 & 1 & 1 & 1 \end{bmatrix}$$

NEURAL NETWORKS FOR FORWARD ERROR CORRECTION DECODING

CROSS REFERENCE TO RELATED APPLICATIONS

This application is a 35 U.S.C. § 371 national stage application of PCT International Application No. PCT/IB2018/054627 filed on Jun. 22, 2018, which in turns claims domestic priority to U.S. Provisional Patent Application No. 62/523,354, filed on Jun. 22, 2017, the disclosures and content of which are incorporated by reference herein in their entirety.

TECHNICAL FIELD

The present disclosure relates to a method for training a Neural Network to recover a codeword and to a method for decoding a received signal using a Neural Network. The present disclosure also relates to a controller for training a Neural Network to recover a codeword, a controller for decoding a received signal using a Neural Network, and to a computer program for carrying out methods for training a Neural Network and for decoding a received signal.

BACKGROUND

Generally, all terms used herein are to be interpreted according to their ordinary meaning in the relevant technical field, unless a different meaning is clearly given and/or is implied from the context in which it is used. All references to a/an/the element, apparatus, component, means, step, etc. are to be interpreted openly as referring to at least one instance of the element, apparatus, component, means, step, etc., unless explicitly stated otherwise. The steps of any methods disclosed herein do not have to be performed in the exact order disclosed, unless a step is explicitly described as following or preceding another step and/or where it is implicit that a step must follow or precede another step. Any feature of any of the embodiments disclosed herein may be applied to any other embodiment, wherever appropriate. Likewise, any advantage of any of the embodiments may apply to any other embodiments, and vice versa. Other objectives, features and advantages of the enclosed embodiments will be apparent from the following description.

Deep Neural networks may be used for the decoding of codes such as linear block codes. Examples of existing approaches for training neural networks for decoding of linear block codes are set out in Eliya Nachmani, Yair Be'ery, and David Burshtein, "Learning to Decode Linear Codes Using Deep Learning" (2016), and in Eliya Nachmani, Elad Marciano, David Burshtein, Yair Be'ery, "RNN Decoding of Linear Block Codes" (2017). These existing approaches implement a Factor Graph-based Sum Product Algorithm (SPA) as discussed in F. R. Kschischang, B. J. Frey and H. A. Loeliger, "Factor graphs and the sum-product algorithm," (2001). For certain families of codes, such as Bose-Chaudhuri-Hocquenghem (BCH) or Polar codes, which are of small to medium length (e.g., ~10 or ~100 bits), the SPA performs poorly owing to the presence of many cycles and trapping sets in the code graph. A Neural Network Decoder (NND) performs better than SPA for such codes. The NND learns to reduce the effect of artifacts such as cycles or trapping sets in the graph structure, by applying complimentary weights to the messages passed over edges of the graph which form cycles. Weights are learned through a training process. Training parameters such as Input/Target variables, Loss function, Regularization, and Optimizer etc., affect the performance of the network during testing and use. In existing approaches, training is performed using "Cross entropy loss/multi-loss functions".

There currently exist certain challenges, including, but not limited to the following:

1. The existing approaches propose training parameters that lead to reduction in Bit-Error-Rate (BER), but do not provide any explicit method for reducing Block-Error-Rate (BLER). In general, for successful decoding, an entire block needs to be correctly decoded.

2. The neural network used in existing approaches is trained end-to-end for the entire unrolled graph. This approach for training and testing may lead to additional computations and performance degradation.

SUMMARY

Certain aspects of the present disclosure and their embodiments may provide solutions to these or other challenges. According to certain embodiments, a new loss metric (or loss function) for training the network is disclosed. The proposed loss metric trains the network to reduce BLER instead of BER. The proposed loss metric may also lead to faster training and lesser computations in both training and testing process. An example of the loss metric performs a syndrome check at every even layer of the neural network (NN), and optimizes the NN to reduce the loss for only those layers where the syndrome check is not met. In this way, the NN is not penalized when a complete block is correctly decoded.

According to certain embodiments, a novel loss metric to train the neural network algorithm designed for decoding using SPA is also disclosed. As compared to standard loss metrics described prior related work such as that referenced above, this metric is designed to boost decoding success for complete codeword block, i.e., to reduce BLER.

According to certain embodiments, the solutions proposed herein can also be used for early detection of correct code words, and thus early termination of the decoding, which results in reduced computational load.

There are, proposed herein, various embodiments which address one or more of the issues disclosed herein. The solutions proposed herein may be embodied in any radio receiver, including, for instance, eNB, UE, or cloud implementation, in particular for short message communications.

According to a first aspect of the present disclosure, there is provided a method for training a Neural Network, NN, to recover a codeword of a Forward Error Correction, FEC, code from a received signal, wherein layers of the NN implement sequential iterations of the Sum Product Algorithm, SPA, and wherein the received signal comprises a transmitted codeword and added noise. The method comprises inputting to an input layer of the NN a representation of message bits obtained from a received noisy signal; propagating the representation through the NN; and optimising trainable parameters of the NN to minimise a loss function. Propagating the representation through the NN comprises, at even layers of the NN, generating an intermediate output representation; generating an intermediate output codeword from the intermediate output representation; and performing a syndrome check on the generated intermediate output codeword. Optimising trainable parameters of the NN to minimise a loss function comprises, if the syndrome check is satisfied, ceasing optimisation of the trainable parameters after optimisation at the layer at which the syndrome check is satisfied.

According to examples of the present disclosure, the steps of generating an intermediate output representation, generating an intermediate output codeword and performing a syndrome check may be performed at each even layer of the NN. According to examples of the present disclosure, the added noise may be Additive White Gaussian Noise, which may be artificially added to imitate a wireless communication channel.

According to examples of the present disclosure, performing a syndrome check on a generated intermediate output codeword may comprise checking whether the generated intermediate output codeword satisfies the conditions for a codeword to be a member of a codebook to which the training codeword belongs. According to examples of the present disclosure, performing a syndrome check may comprise multiplying a vector of the generated intermediate output codeword by the parity check matrix for the code to which the training codeword belongs and checking whether the resulting vector is a null vector. If the resulting vector is a null vector then the syndrome check is satisfied.

According to examples of the present disclosure, optimising trainable parameters of the NN to minimise a loss function may comprise minimising the loss function calculated on the basis of at least one intermediate output representation selected from the set comprising intermediate output representations available at layers up to and including the layer at which the syndrome check is satisfied.

According to examples of the present disclosure, example optimisation methods for minimising the loss function may include stochastic gradient descent methods According to examples of the present disclosure, the loss function may be a cross entropy loss function calculated on the basis of the intermediate output representation at the layer at which the syndrome check is satisfied.

According to examples of the present disclosure, the loss function may comprise:

$$\text{Loss} = \frac{-1}{N} \sum_{v=1}^{N} I_{\{\hat{o}_{i,v} \times H^T = 0^T\}} (t_v \log(o_{i,v}) + (1 - t_v) \log(1 - o_{i,v}))$$

wherein: N is the number of bits in the transmitted codeword,
I{f} is the indicator function,
H is the parity check matrix of the code to which the transmitted codeword belongs,
o(i,v) is the output representation of the NN at the i-th layer of the network corresponding to the v-th bit in the transmitted codeword,
$\hat{o}_{i,v}$ is a vector of the intermediate output codeword at the i-th layer, and N is the target value of the v-th bit of the transmitted codeword.

According to examples of the present disclosure, the loss function may be a cross entropy multi-loss function calculated on the basis of all intermediate output representations at layers up to and including the layer at which the syndrome check is satisfied.

According to examples of the present disclosure, the loss function may comprise:

$$\text{Loss} = \frac{-1}{MN} \sum_{i=2,4,\ldots}^{2M} \left( \sum_{v=1}^{N} (t_v \log(o_{i,v}) + (1 - t_v) \log(1 - o_{i,v})) \right)$$

wherein: N is the number of bits in the transmitted codeword,
o(i,v) is the output representation of the NN at the ith layer of the network corresponding to v-th bit in the transmitted codeword,
tv is the target value of the with bit of the transmitted codeword,
2L is the number of hidden layers in the NN, and
if the syndrome check is satisfied at an even layer k: 0<k<2L, then 2M=k, else 2M=2L.

According to examples of the present disclosure, the training codeword may comprise a codeword of a binary linear block code.

According to examples of the present disclosure, the representation of message bits obtained from a received noisy signal that is input to the input layer of the NN may comprise an array of Log-Likelihood Ratios, LLRs, of the individual message bits obtained from the received noisy signal.

According to examples of the present disclosure, the NN may comprise a Neural Network Decoder, NND.

According to examples of the present disclosure, the method may further comprise using an optimal SNR range for training the NN to achieve optimal performance for a code and communication channel under consideration.

According to another aspect of the present disclosure, there is provided a method for decoding a received signal using a Neural Network, NN, wherein layers of the NN implement sequential iterations of the Sum Product Algorithm, SPA, and wherein the received signal comprises a transmitted codeword of a Forward Error Correction, FEC, code and added noise. The method comprises inputting to an input layer of the NN a representation of message bits obtained from the received noisy signal; propagating the representation through the NN; and outputting a recovered codeword from the NN. Propagating the received signal through the NN comprises, at even layers of the NN: generating an intermediate output representation; generating an intermediate output codeword from the intermediate output representation; and performing a syndrome check on the generated intermediate output codeword. Propagating the received signal through the NN further comprises, if the syndrome check is satisfied: ceasing propagation of the representation through the NN at the layer at which the syndrome check is satisfied, and identifying the intermediate output codeword for which the syndrome check is satisfied as the recovered codeword for outputting from the NN.

According to examples of the present disclosure, performing a syndrome check on a generated intermediate output codeword may comprise checking whether the generated intermediate output codeword satisfies the conditions for a codeword to be a member of a codebook to which the transmitted codeword belongs. According to examples of the present disclosure, performing a syndrome check may comprise multiplying a vector of the generated intermediate output codeword by the parity check matrix for the code to which the training codeword belongs and checking whether the resulting vector is a null vector. If the resulting vector is a null vector then the syndrome check is satisfied.

According to examples of the present disclosure, the transmitted codeword may comprise a codeword of a binary linear block code.

According to examples of the present disclosure, the representation of message bits obtained from a received noisy signal that is input to the input layer of the NN may comprise an array of Log-Likelihood Ratios, LLRs, of the individual message bits obtained from the received noisy signal.

According to examples of the present disclosure, the NN may comprise a Neural Network Decoder, NND.

According to examples of the present disclosure, the transmitted codeword may comprise at least one of a test codeword received during a testing phase of the NN and/or a codeword received during an online phase of the NN.

According to another aspect of the present disclosure, there is provided a computer program comprising instructions which, when executed on at least one processor, cause the at least one processor to carry out a method according to any one of the preceding aspects or examples of the present disclosure.

According to another aspect of the present disclosure, there is provided a carrier containing a computer program according to the preceding aspect of the present disclosure, wherein the carrier comprises one of an electronic signal, optical signal, radio signal or computer readable storage medium.

According to another aspect of the present disclosure, there is provided a computer program product comprising non transitory computer readable media having stored thereon a computer program according to a preceding aspect of the present disclosure.

According to another aspect of the present disclosure, there is provided a controller for training a Neural Network, NN, to recover a codeword of a Forward Error Correction, FEC, code from a received signal, wherein layers of the NN implement sequential iterations of the Sum Product Algorithm, SPA, and wherein the received signal comprises a transmitted codeword and added noise. The controller comprises a processor and a memory, the memory containing instructions executable by the processor such that the controller is operable to input to an input layer of the NN a representation of message bits obtained from a received noisy signal; propagate the representation through the NN; and optimise trainable parameters of the NN to minimise a loss function. Propagating the representation through the NN comprises, at even layers of the NN: generating an intermediate output representation; generating an intermediate output codeword from the intermediate output representation; and performing a syndrome check on the generated intermediate output codeword. Optimising trainable parameters of the NN to minimise a loss function comprises, if the syndrome check is satisfied, ceasing optimisation of the trainable parameters after optimisation at the layer at which the syndrome check is satisfied.

According to examples of the present disclosure, the controller may be further operable to carry out a method according to any one of the preceding aspects or examples of the present disclosure.

According to another aspect of the present disclosure, there is provided a controller for training a Neural Network, NN, to recover a codeword of a Forward Error Correction, FEC, code from a received signal, wherein layers of the NN implement sequential iterations of the Sum Product Algorithm, SPA, and wherein the received signal comprises a transmitted codeword and added noise. The controller is adapted to input to an input layer of the NN a representation of message bits obtained from a received noisy signal; propagate the representation through the NN; and optimise trainable parameters of the NN to minimise a loss function. Propagating the representation through the NN comprises, at even layers of the NN: generating an intermediate output representation; generating an intermediate output codeword from the intermediate output representation; and performing a syndrome check on the generated intermediate output codeword. Optimising trainable parameters of the NN to minimise a loss function comprises, if the syndrome check is satisfied, ceasing optimisation of the trainable parameters after optimisation at the layer at which the syndrome check is satisfied.

According to examples of the present disclosure, the controller may be further adapted to carry out a method according to any one of the preceding aspects or examples of the present disclosure.

According to another aspect of the present disclosure, there is provided a controller for decoding a received signal using a Neural Network, NN, wherein layers of the NN implement sequential iterations of the Sum Product Algorithm, SPA, and wherein the received signal comprises a transmitted codeword of a Forward Error Correction, FEC, code and added noise. The controller comprises a processor and a memory, the memory containing instructions executable by the processor such that the controller is operable to: input to an input layer of the NN a representation of message bits obtained from the received noisy signal; propagate the representation through the NN; and output a recovered codeword from the NN. Propagating the representation through the NN comprises, at even layers of the NN: generating an intermediate output representation; generating an intermediate output codeword from the intermediate output representation; and performing a syndrome check on the generated intermediate output codeword. Propagating the representation through the NN further comprises, if the syndrome check is satisfied: ceasing propagation of the representation through the NN at the layer at which the syndrome check is satisfied, and identifying the intermediate output codeword for which the syndrome check is satisfied as the recovered codeword for outputting from the NN.

According to examples of the present disclosure, the controller may be further operable to carry out a method according to any one of the preceding aspects or examples of the present disclosure.

According to another aspect of the present disclosure, there is provided a controller for decoding a received signal using a Neural Network, NN, wherein layers of the NN implement sequential iterations of the Sum Product Algorithm, SPA, and wherein the received signal comprises a transmitted codeword of a Forward Error Correction, FEC, code and added noise. The controller is adapted to: input to an input layer of the NN a representation of message bits obtained from the received noisy signal; propagate the representation through the NN; and output a recovered codeword from the NN. Propagating the representation through the NN comprises, at even layers of the NN: generating an intermediate output representation; generating an intermediate output codeword from the intermediate output representation; and performing a syndrome check on the generated intermediate output codeword. Propagating the received signal through the NN further comprises, if the syndrome check is satisfied: ceasing propagation of the representation through the NN at the layer at which the syndrome check is satisfied, and identifying the intermediate output codeword for which the syndrome check is satisfied as the recovered codeword for outputting from the NN.

According to examples of the present disclosure, the controller may be further operable to carry out a method according to any one of the preceding aspects or examples of the present disclosure.

According to examples of the present disclosure, the controller may comprise a virtualized network function.

According to another aspect of the present disclosure, there is provided a base station comprising a controller according to any one of the preceding aspects or examples of the present disclosure.

According to another aspect of the present disclosure, there is provided a wireless device comprising a controller according to any one of the preceding aspects or examples of the present disclosure.

According to another aspect of the present disclosure, there is provided a system comprising a plurality of network nodes configured to: receive a signal comprising a transmitted codeword of a Forward Error Correction, FEC, code and added noise; input to an input layer of a Neural Network, NN, a representation of message bits obtained from the received noisy signal, wherein layers of the NN implement sequential iterations of the Sum Product Algorithm, SPA; propagate the representation through the NN; and output a recovered codeword from the NN. Propagating the representation through the NN comprises, at even layers of the NN: generating an intermediate output representation; generating an intermediate output codeword from the intermediate output representation; and performing a syndrome check on the generated intermediate output codeword. Propagating the representation through the NN further comprises, if the syndrome check is satisfied: ceasing propagation of the representation through the NN at the layer at which the syndrome check is satisfied, and identifying the intermediate output codeword for which the syndrome check is satisfied as the recovered codeword for outputting from the NN.

According to examples of the present disclosure, the system may comprise a base station node and a processing node, and wherein the base station node is configured to receive the signal and the processing node is configured to propagate the representation through the NN and output a recovered codeword from the NN.

According to examples of the present disclosure, the processing node may be a virtual node in the Cloud, and the base station may forward the received signal to the processing node for decoding, with the processing node forwarding the recovered codeword back to the base station or to another node.

Certain embodiments may provide one or more of the following technical advantages. Examples of the proposed solutions provide robustness towards learning for reducing BLER by introducing penalty in case of decoding failure. Examples of the proposed solutions also improve the training process by pushing the network to learn correct weights early on. In testing phase, the network can provide syndrome values at every iteration, which can be used as an early stopping criteria. Other technical advantages may also be provided, and certain embodiments may provide some, none, or all of the advantages listed above.

BRIEF DESCRIPTION OF THE DRAWINGS

For a better understanding of the present invention, and to show more clearly how it may be carried into effect, reference will now be made, by way of example, to the following drawings, in which.

DETAILED DESCRIPTION

Some of the embodiments contemplated herein will now be described more fully with reference to the accompanying drawings. Other embodiments, however, are contained within the scope of the subject matter disclosed herein, the disclosed subject matter should not be construed as limited to only the embodiments set forth herein; rather, these embodiments are provided by way of example to convey the scope of the subject matter to those skilled in the art.

The solutions proposed herein may be embodied in any radio receiver, including, for instance, eNB, UE, or cloud implementation. More specifically, the proposed solutions are applicable to any communication channel and any error-correcting code, though examples are given for adds Additive White Gaussian Noise (AWGN) channels, and Hamming and Polar codes.

An example communication system and neural network decoding algorithms are described below, followed by a description of training an example neural network decoder according to an experimental setup. There then follows a discussion of methods of training a neural network and decoding using a neural network according to examples of the present disclosure. A discussion of experimental results is then presented. Further discussion of linear block codes, decoding, the Sum Product Algorithm and the SPA over Neural Networks is included in an additional information section at the end of the detailed description.

System Model and Algorithm Description

Communication System

The communication model described herein is based on the Binary Additive White Gaussian Noise (BI-AWGN) channel and Binary Phase Shift Keying (BPSK) modulation. The rate of the code is defined as R, and codeword and source lengths as (n, k) respectively, where n>k. A binary message m=[m1, ..., mk]:mi∈{0, 1} is encoded to a binary codeword s=[s1, ..., sn]:si∈{0, 1}, and BPSK modulated to signal x=[(−1)s]:xi∈{−1, 1}. Noise of the channel is given as Signal to Noise Ratio (SNR) in decibels (dB). Standard deviation (sigma) of the Gaussian noise in AWGN channel with BPSK modulation, is obtained by the following formula.

$$\sigma = \sqrt{\left(2 * 10^{\frac{SNR_{dB}}{10}}\right)^{-1}} \quad (1.1)$$

The log-likelihood ratio (LLR) for received bits after demodulation is given by:

$$LLR(y_i) = \frac{P(x_i = +1 \mid y_i)}{P(x_i = -1 \mid y_i)} \quad (1.2)$$
$$= \exp - \frac{1}{2\sigma^2}(y_i - 1)^2 - (y_i + 1)^2$$
$$= \frac{2 * y_i}{\sigma^2}$$

where xi and yi are the ith bits of transmitted and received signal x and y respectively. The LLR of received bits thus provides the likelihood that a received bit is 0 as opposed to 1. For convenience, in the following discussion LLR(yi) is written as $I_i$.

Figure 1:
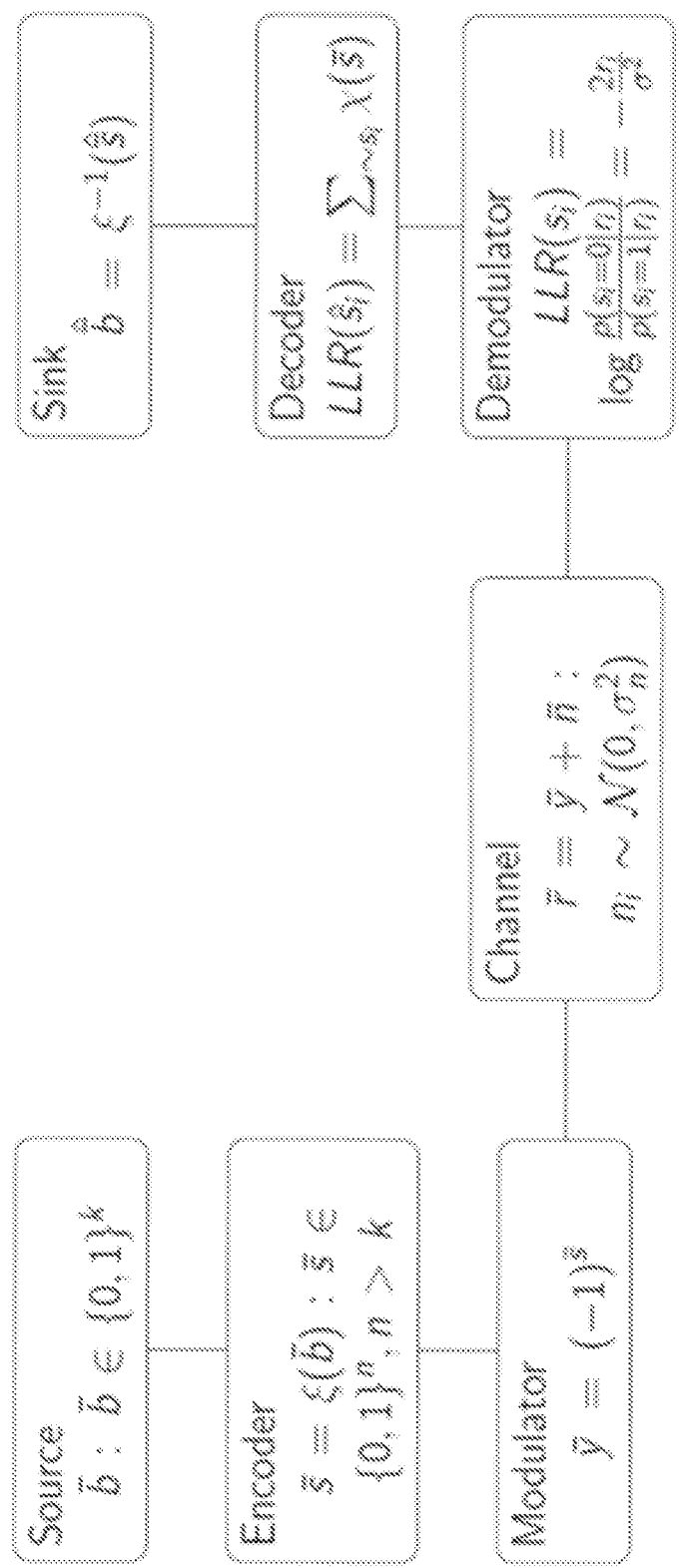
FIG. 1 illustrates a communication system model.

As shown in FIG. 1, the channel adds AWGN to the transmitted signal. The decoder uses the structure of the linear block code to recover information received in error.

Decoder Design

The following text discusses methods used for recovering bits through the decoding process.

Tanner Graph Representation of Code

The decoder takes the LLR values as input, and returns decision on corrected bits. The decoding follows the renowned Belief Propagation (BP) algorithm. The messages (or beliefs) are updated by passing the messages over the edges of the graph representation of the code called the Tanner graph. Tanner graph is a bipartite graph of parity check matrix H of the code, where the columns of parity check matrix are the variable nodes v, and the rows are the check nodes c in the graph. An edge connects the variable node vj to check node ci when there is a 1, instead of 0, at (i, j) position in H. Any linear block code can be represented as a Tanner graph.

For example, consider [7,4] hamming code with parity check matrix H as shown below and illustrated in the upper part of FIG. 2.

$$H = \begin{bmatrix} 1 & 0 & 1 & 1 & 1 & 0 & 0 \\ 1 & 1 & 1 & 0 & 0 & 1 & 0 \\ 0 & 1 & 1 & 1 & 0 & 0 & 1 \end{bmatrix} \quad (1.3)$$

Figure 2:
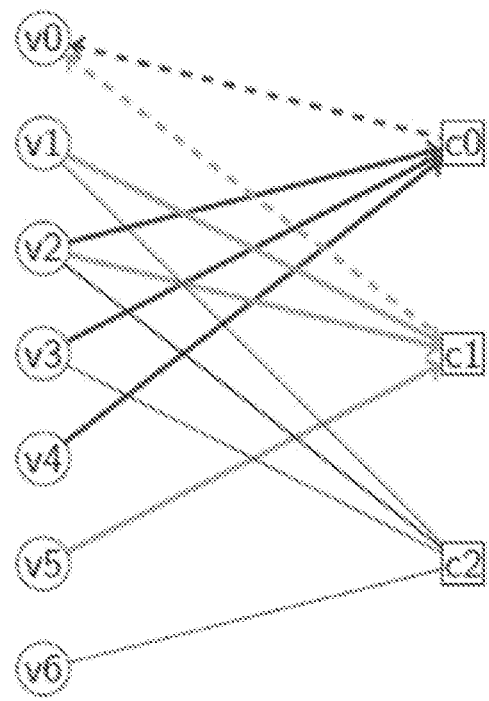
FIG. 2 illustrates the parity check matrix of a Hamming (7, 4) code and Tanner graph of the parity check matrix.

The tanner graph given by this matrix is shown in the lower half of FIG. 2. The edges of the Tanner graph may be numbered from 1 to 12, corresponding to the ones in the parity check matrix counted row-wise. Edges {1, 5; 2, 7} form a cycle between variable nodes {v0, v2} and check nodes {c0, c1}, and edges {1, 5; 6, 9; 2, 7, 10} form a trapping set between variable nodes {v0, v1, v2} and check nodes {c0, c1, c2}.

Sum Product Algorithm (SPA)

The decoder uses a soft-iterative decoding technique called SPA. SPA operates on sum-product semi-ring for iterative decoding, which leads to bit-wise Maximum a posteriori probability (MAP) decoding. The messages are passed over the factor graph represented by the Tanner graph, to update the likelihood ratios. In general, the method utilizes the fact that at any particular check node, the sum of the bit values (0 or 1) coming from all connecting nodes must be 0 modulo 2 (in GF(2) field). That is:

$$\bigoplus_{i \in D_g} (y_i) = 0 \quad (1.4)$$

where ⊕ represents the binary sum over GF(2) field, and $D_g$ is the set of all variable nodes connected to $c_g$ check node.

The LLR value of any variable nodes is the belief of that node being 0 rather than 1.

$$P(y_i = 0) = \frac{1}{1 + \exp(-l_i)} \quad (1.5)$$

Considering a variable node $v_k$ connected to check node $c_g$, let $D_g$ denote the set of all the variable nodes connected to check node $c_g$. Using check node $c_g$ (equation 1.4), we can find $P_e(vk=0, c_g/Ii)\forall i \in (D_g \backslash v_k)$. (The notation $i \in D_g \backslash v_k$ to denote that i belongs to the set $D_g$ excluding $v_k$.) $P_e(v_k, c_G)$ is called the extrinsic probability of variable node $v_k$ given by the check performed at check node $c_g$. To ease the notations, $v_k$ and $c_g$ are denoted as k and g respectively in the following discussion. Taking an example of check node with 3 incident variable nodes ($v_1$, $v_2$, $v_3$):

$$P_e(v_3 = 0) = P(v_1 \oplus v_2 = 0) \quad (1.6)$$
$$= P_e(v_1 = 0) \cdot P(v_2 = 0) + (1 - P(v_1 = 0)) \cdot (1 - P(v_2 = 0))$$
$$= \frac{1}{2} + \frac{1}{2} \prod_{k' \in \{1,2\}} (2P(v_{k'}) - 1)$$

It can be proved by induction that for any set $D_g$, the extrinsic information, $E(k, g) = P_e(k, g)$ is given by:

$$E(k, g) = \frac{1}{2} + \frac{1}{2} \prod_{k' \in D_g} (2P(k', g) - 1) \quad (1.7)$$

where $P_e(k, g)$ and $P(kt, g)$ are probabilities of variable (bit) node k and k' being zero, respectively, and $E(k, g)$ is the extrinsic information (LLR) passed from check node g to variable node k.

Converting to LLR instead of probabilities, and using the relationship, $$\tan \frac{1}{2} \log\left(\frac{1-p}{p}\right) = 1 - 2p \quad (1.8)$$

we get from 1.7, $$E(k, g) = 2\tanh^{-1} \prod_{k' \in D_g \setminus k} \tanh\left(\frac{M(k', g)}{2}\right) \quad (1.9)$$

where M (k', g) is the information (LLR) passed by variable node kt to check node g, without the information E(kt, g) that is already present at the check node g. That is, $$M(k', g) = \sum_{g' \in B_k \setminus g} E(k', g') + I_{k'} \quad (1.10)$$

where $B_k$ is the set of all check nodes connected to variable node k and $I_{k'}$ is the initial LLR value at variable node k'.
SPA Algorithm
The following is an example of the SPA algorithm:
Initialize:
Set $M(k, g) = I_k \forall k, g$.
Step 1:
Check if parity is satisfied for a hard decision using current LLR values. Hard decision vector ŝ is given by:

$$s_k = \begin{cases} 0, & l_k > 0 \\ 1, & \text{otherwise} \end{cases} \quad (1.11)$$

Syndrome check vector S is given by:
$$S = \hat{s} \cdot H^T \quad (1.12)$$

*Check ⇒ If S=0, then the codeword ŝ is returned as output by the decoder. Else, continue to next step.
Step 2:
Pass information on edge from variable node k to check node g
The LLR values are passed to check nodes, where we find the probability that a check is satisfied, if the corresponding variable node is 0 or 1.
Calculate E(k, g) as per equation 1.9.

Step 3:
Update Variable Nodes
The extrinsic information is passed back to variable nodes, and LLRs are variable nodes are updated as:

$$L_k = L_k + \sum_{i \in B_k} E_{k,i} \quad (1.13)$$

where $B_k$ is a set of all check nodes connected to k variable node. The information passed by variable node to check node in step 2 does not contain extrinsic information that is already available at the check node. The value of M (k, g) is updated using equation 1.10.
Loop:
Move to Step 1
Cycles and Trapping Sets
SPA works optimally for codes with Tanner graphs that form a tree when represented as a factor graph. In tree structured factor graphs, variable relationships can be factored exactly, hence leading to optimal solution through iterative message-passing over marginalization of joint probabilities. However, codes represented by graphs with no-cycles have low minimum distance, and hence perform poorly. This can be explained through the following argument.

Lemma: A binary linear code C, with rate r and the Tanner graph forming a tree, contains at least $$\frac{2r-1}{2} n$$

codewords of hamming weight 2.

Proof: The graph of C contains n variable nodes (corresponding to each codeword), and (1−r)n check nodes. Total number of nodes in the tree is 2n−nr. Hence average number of edges connected to each variable node is upper bounded by 2−r. Each internal variable node (variable node that are not leaf nodes) has degree at least 2. It follows that the number of leaf variable nodes must be greater than nr (proof: x+2(n−x)≤2n−nr⇒x≥nr). Since every leaf variable node is connected to only one check node, we have at least rn−(1−r)n=(2r−1)n leaf variable nodes that are connected to check nodes with multiple adjacent variable nodes. Each of these (2r−1)n leaf variable nodes has a pair of another leaf variable node, which give rise to a codeword of weight 2 for rates above one-half. Even for codes with rate less than one-half, tree structured Tanner graph based codes contain low-weight codewords.

SPA, or more general Belief Propagation (BP) algorithms, tend to show a rapid decrease in performance at higher SNR values, quantified as error-floor. This characteristic of codes is due to two major artifacts of the code or Tanner graphs. One is the minimum distance of the code, and other is the Trapping sets or Stopping sets. A trapping set T is a subset of variable nodes V such that all neighbors of T, i.e. all check nodes connected to T, are connected to T at least twice. Trapping sets leads to situations from which SPA fails to recover. The support set of a codeword (set of locations where xi=1,i∈ 1, . . . , n) is a trapping set. However, a trapping set does not always correspond to the support set of a codeword. An example of cycle and trapping set is shown in FIG. 2.

SPA thus provides a sub-optimal method to implement the decoder of FIG. 1. Owing to the presence of cycles in the graphical structure of good linear block codes, performance of SPA is unsatisfactory. Codes represented by graphs with no-cycles have low minimum distance, and hence perform poorly. Deep Neural Network-based solutions have been proposed to improve performance of SPA for codes with cycles. A brief description of algorithms for neural network decoder implementation is provided below.

Neural Network Decoder

The following discussion provides a brief explanation of the working of neural networks, and of a neural network decoder based on SPA.

SPA Based Neural Network Decoder

In order to mitigate the effect of cycles or trapping sets in the Tanner graphs, the discriminative data-driven approach of Neural Networks may be used. The iterative graph based SPA algorithm is implemented using neural networks by defining the hidden nodes of the neural network as the edges of the tanner graph. Hence each hidden layer in the neural network corresponds to a message passing from either variable node to check node (odd layer), or check node to variable node (even layer). The message is passed over the edges a fixed number of times, which corresponds to the maximum number of iterations in the SPA. Each odd hidden layer computes extrinsic information using (1.9), and each even layer updates L and M values using (1.13) and (1.10), respectively. According to examples of the present disclosure, a check may be performed at even layer to verify the syndrome matching.

A Neural network decoder (NND) works in a very similar manner to the SPA algorithm, except that the operations are performed on an edge instead of a node of the tanner graph. The basic operations can be divided into operations at odd and even hidden layers of the network. In the following section we will discuss the SPA based NND (SPA-NND) algorithm. The notations used in SPA algorithm are continued here as well. Additional notations will be defined as they are used.

SPA-NND Architecture

Given, Parity check matrix H of size [n–k, n], where n, k∈I.
$D_g$: Set of all variable nodes connected to check node g.
$B_k$: Set of all check nodes connected to variable node k.
$E(S_1, S_2)$: Set of edges between elements of $S_1$ and $S_2$.
$V(E)$: Set of variable nodes connected to E.
$C(E)$: Set of check nodes connected to E.

Layer sizes:
   Input layer size=no. of variable nodes=n
   Hidden (odd, even) layer size=no. of 1s in H=$n_e$=$\Sigma_{row, col}$H
   Output layer size=no. of variable nodes=n
   Sparse matrices defining connections between nodes
   Input to First hidden (even) layer=$W_{i2e}$ of size [n, ne]
(Connect a variable node with edge nodes in the first hidden layer corresponding to those edges which are emanating from the check nodes adjacent to the variable node, except the edge that directly connects the variable node and the check node.)

$$W_{i2e}(i, j) = \begin{cases} 1, & \text{if } i \in \{D_g\} \forall g \in C(j \notin \varepsilon C(i, C(j))) \\ 0, & \text{otherwise} \end{cases} \quad (1.14)$$

Hidden (even) to (odd) layer=$W_{e2o}$ of size [ne, ne] (Connecting an edge emanating from a check node, and another edge emanating from the variable node that is adjacent to the check node, except the edge that directly connects the check node and the variable node.)

$$W_{e2o}(i, j) = \begin{cases} 1, & \text{if } j \in \varepsilon(D_{C(i)} \setminus C(i)) \\ 0, & \text{otherwise} \end{cases} \quad (1.15)$$

Hidden (odd) to (even)layer layer=$W_{o2e}$ of size [ne, ne] (Connecting an edge emanating from a variable node, and another edge emanating from the check node that is adjacent to the variable node, except the edge that directly connects the variable node and the check node.)

$$W_{2e}(i, j) = \begin{cases} 1, & \text{if } j \in \varepsilon(B_{V(i)} \setminus V(i)) \\ 0, & \text{otherwise} \end{cases} \quad (1.16)$$

Hidden (even) to Output layer=$W_{e2x}$ of size [ne, n] (Connecting an edge emanating from a check node, and a variable node that is adjacent to the check node)

$$W_{e2x}(i, j) = \begin{cases} 1, & \text{if } i \in \varepsilon(B_{V(j)}) \\ 0, & \text{otherwise} \end{cases} \quad (1.17)$$

Input to hidden (even) layer—$W_{i2h}$=$W^T_{e2x}$ of size [n, ne] (Connecting a variable input node and an edge emanating from the check node adjacent to the variable node.)

$$W_{i2h}(i, j) = \begin{cases} 1, & \text{if } j \in \varepsilon(B_{V(i)}) \\ 0, & \text{otherwise} \end{cases} \quad (1.18)$$

Having set the parameters for designing the NND, the operations in Neural network are described below.

Odd layer Output at jth node at layer m:

$$x^m_{odd}[j] = \tanh\left(\frac{1}{2}\tilde{W}^m_{i2h}(v, j) \times l[v] + \sum_{j' \in \varepsilon} \tilde{W}^m_{o2e}[j, j'] \times x^{m-1}_{even}[j']\right) \quad (1.19)$$

where v=V(j).
Even layer output at jth node at layer m:

$$x^m_{even}[j] = 2\tanh^{-1}\left(\prod_{j' \in \varepsilon(B_{V(j)} \setminus V(j))} x^m_{odd}[j']\right) \quad (1.20)$$

The final output layer operation is given by:

$$x_{last}[i] = \tilde{W}_{i2h}[i, j] \times l[i] + \sum_{i' \in \varepsilon} \tilde{W}_{e2x}[i, i'] \times x_{even}[j'] \quad (1.21)$$

where j, j' are edges that connect the variable nodes i, i', respectively. The weights $\tilde{W}$ denote the weights trained by the neural network.

Figure 3:
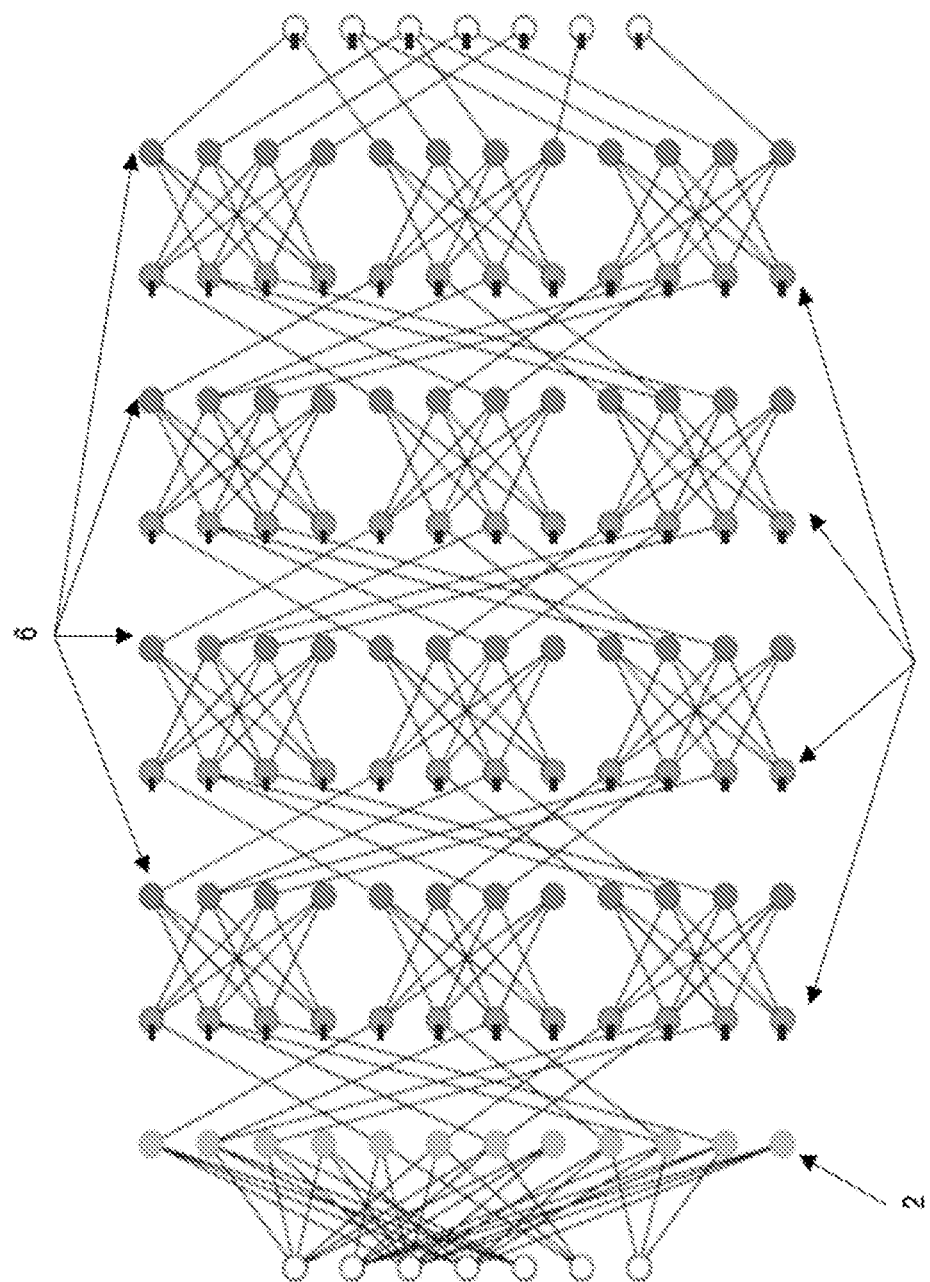
FIG. 3 illustrates a SPA-NND architecture for the Hamming (7, 4) code of FIG. 2.

An example of the above described SPA-NND neural network structure and design for a (7,4) Hamming code is shown in FIG. 3. The neural network has nine hidden layers, corresponding to five full iterations of the SPA. The first hidden layer 2 applies operations of odd and even layers at a single node. The hidden layers labelled 4 are odd hidden layers, and layers labelled 6 are even hidden layers. The bold black rectangles besides the odd layer nodes represent the addition of input LLRs at this iteration.

Training

A neural network is trained to optimise trainable parameters within the network (weights) for a particular code and communication channel. There follows below a brief discussion of training parameters for a neural network.

SNR

The Signal to Noise Ratio (SNR) value defines the errors in the training input data. If SNR is high, the training data will contain many errors. A NND trained using high SNR data will fail to recognize and resolve graph artefacts, and hence will not perform well. On the other hand, a NND trained with data with very low SNR might not see any error at all, and training will not result in any learning. This means that it is desirable to train NND with a training set designed using SNR value (or range) such that NND gives best performance in the usual SNR range during the test phase.

Optimiser

An optimisation function is used to update trainable parameters in order to minimise a predetermined loss function (as discussed below).

Training Length

Training length varies with the type and length of the code.

Trained Weights

Only the weights that define the structure of the Tanner graph are trained. The initialization of weight can be either fixed (1.0) or can be random.

Loss Functions

Cross Entropy Loss

Cross entropy loss functions are loss metrics applied for a network that give probability of a binary target vector. This type of loss function penalizes the weights based on the probability of the target bit.

$$\text{Loss} = -\frac{1}{N}\sum_{v=1}^{N} t_v \log(O_x) + (1 - t_v)\log(1 - O_v) \quad (2.2)$$

where $t_v \in \{0, 1\}$, $v=[1, \ldots, N]$ is the target bit value, and $o_v \in (0, 1]$ is probability output by the network's last layer.

Cross Entropy Multi-Loss

This loss function takes advantage of the fact that SPA algorithm provides check after every iteration. Here the network is penalized for wrong output at every iteration, hence pushing the network to learn weights early.

$$\text{Loss} = -\frac{1}{N}\sum_{i=1}^{2L-1}\sum_{v=1}^{N} t_v \log(o_{i,v}) + (1 - t_v)\log(1 - o_{i,v}) \quad (2.3)$$

where $o_{i,v}$ $i=[1, 3, \ldots 2L-1]$ is the output at odd layer i, calculated from $x_{i,e}$ using $$o_{i,v} = \sigma\left(\sum_{e=(v,e)} x_{i,e}\right) \quad (2.4)$$

Examples of the present disclosure provide methods for training a neural network and for decoding using a neural network, wherein layers of the neural network implement sequential iterations of the SPA. The neural network may in some examples be a neural network such as is discussed above.

Figure 4:
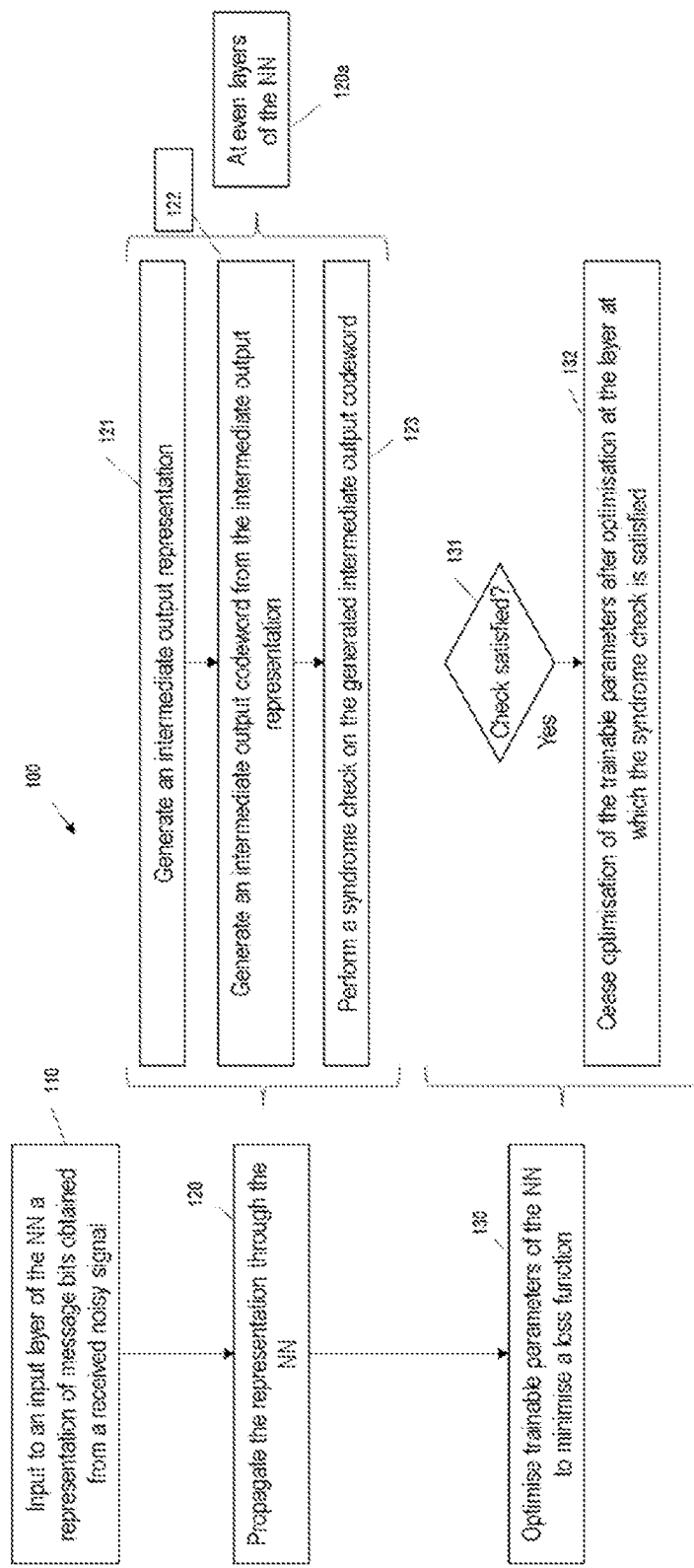
FIG. 4 is a flow chart illustrating process steps in a method for training a neural network according to an example of the present disclosure.

FIG. 4 illustrates process steps in a first example of a method 100 for training a Neural Network (NN) to recover a codeword of a Forward Error Correction (FEC) code from a received signal. As discussed above, layers of the NN implement sequential iterations of the SPA. The received signal comprises a transmitted codeword and added noise. In some examples, the added noise may be AWGN, which may in some examples be artificially added to imitate a wireless communication channel. Referring to FIG. 4, in a first step 110, the method comprises inputting to an input layer of the NN a representation of message bits obtained from a received noisy signal. The method then comprises, at step 120, propagating the representation through the NN, and, at step 130, optimising trainable parameters of the NN to minimise a loss function. As illustrated in FIG. 4, propagating the representation through the NN comprises, at even layers of the NN as illustrated at 120*a*, generating an intermediate output representation at step 121, generating an intermediate output codeword from the intermediate output representation at step 122, and performing a syndrome check on the generated intermediate output codeword at step 123. Optimising trainable parameters of the NN to minimise a loss function comprises, if the syndrome check at step 123 is found to be satisfied at step 131, ceasing optimisation of the trainable parameters after optimisation at the layer at which the syndrome check is satisfied at step 132. It will be appreciated that in some examples of the method 100, the steps 121 to 123 may be performed at every even layer of the NN.

Examples of the present disclosure thus introduce a syndrome check at even layers of the neural network during the training phase, and cease optimisation of trainable parameters of the neural network after optimisation at the layer at which the syndrome check is satisfied. Examples of the present invention may be applied to the training of a neural network for recovery of a codeword from a range of different FEC codes, including both binary and non-binary codes.

Figure 5:
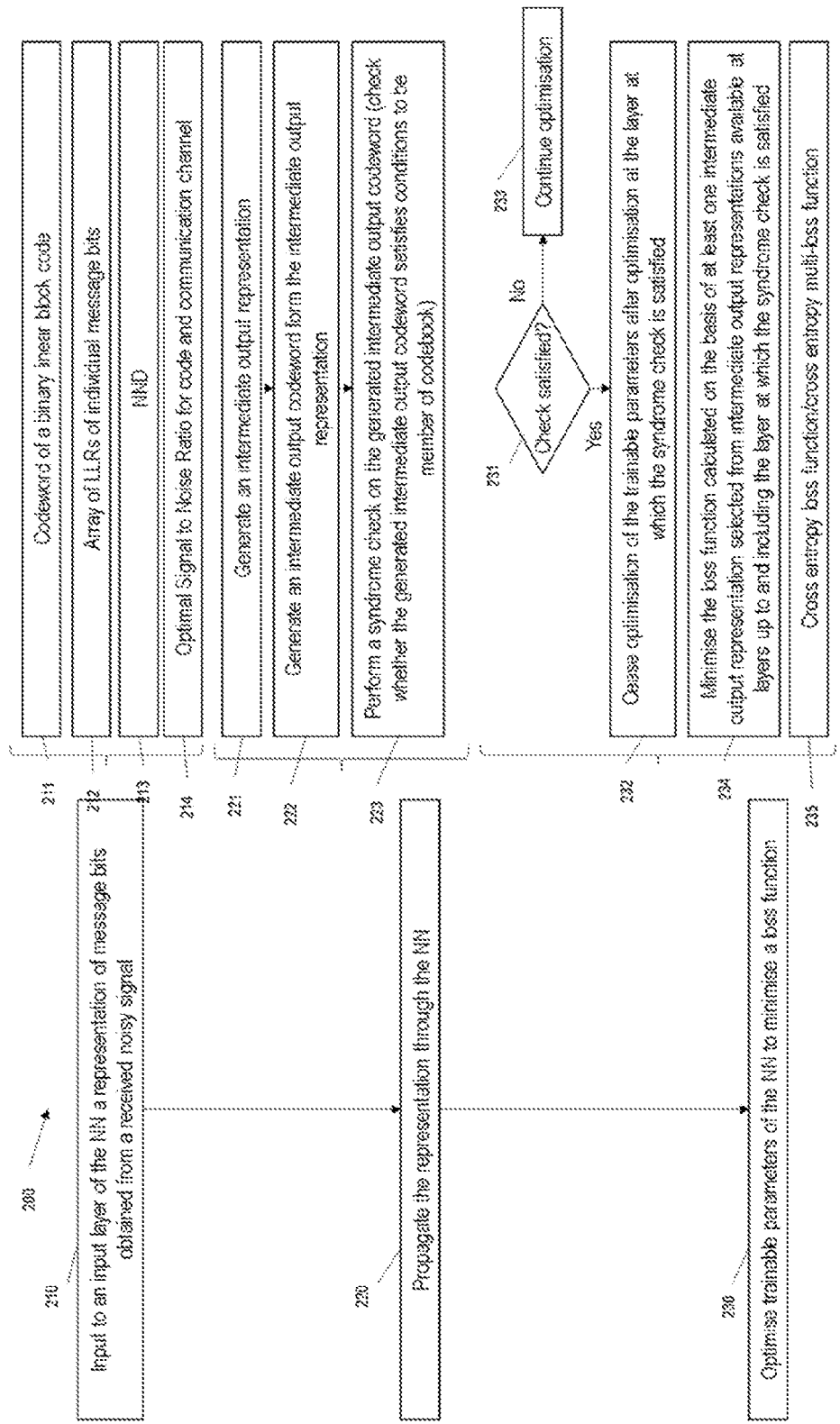
FIG. 5 is a flow chart illustrating process steps in another example of method for training a neural network according to an example of the present disclosure.

FIG. 5 is a flow chart illustrating another example of a method 200 for training a Neural Network (NN) to recover a codeword of a Forward Error Correction (FEC) code from a received signal. The method 200 of FIG. 5 provides one example of how the steps of the method 100 of FIG. 4 may be implemented and supplemented. As discussed above, layers of the NN of the method of FIG. 5 implement sequential iterations of the SPA. The received signal comprises a transmitted codeword and added noise. In some examples, the added noise may be AWGN, which may in some examples be artificially added to imitate a wireless communication channel. Referring to FIG. 5, in a first step 210, the method comprises inputting to an input layer of the NN a representation of message bits obtained from a received noisy signal. As illustrated at step 211, the received noisy signal may include a codeword of a binary linear block code, which the NN may be trained to recover. As illustrated at 212, the representation of message bits obtained from the received noisy signal may comprise an array of Log-Likelihood Ratios (LLRs) of the individual message bits obtained from the received noisy signal. As discussed above, in the case of a binary code, the LLRs provide the logarithm of the ratio between the probability that a particular transmitted bit was a 0 and the probability that it was 1. As illustrated at 213, in some examples, the NN may comprise a Neural Network Decoder, which as discussed above is based on a closed form analytical expression of SPA obtained for binary codes. For non-binary codes, requiring simultaneous operation over multiple variations at a time, translation to a neural network has not yet been documented, however the steps of the method 100 and/or 200 are equally applicable to the non-binary case.

As illustrated in step 214, the method 200 may comprise using an optimal SNR range for training the NND to achieve optimal performance for a code and communication channel under consideration. Modern FECs tend to have a "waterfall region" of SNR in which the code performance improves dramatically, that is the error rate falls rapidly from being equivalent to guessing to being almost zero. The optimal SNR range depends both upon the FEC code being used and the communication channel over which it is transmitted. Methods according to the present disclosure may therefore use the optimal SNR range for training the NN to achieve optimal performance for the code and channel under consideration.

The method 200 further comprises propagating the representation of message bits through the NN at step 220 and optimising trainable parameters of the NN to minimise a loss function at step 230. As discussed above, propagating the representation through the NN may comprise forwarding the representation (for example the LLRs) through the layers of the NN, such that the representations are updated according to the operations performed at the different layers of the NN. According to the present disclosure, propagating the representation through the NN comprises performing steps 221 to 223 at even layers of the NN, and may comprise performing these steps at every even layer of the NN. Step 221 comprises generating an intermediate output representation and step 222 comprises generating an intermediate output codeword from the intermediate output representation. In the case of a binary FEC represented by LLRs, step 222 may comprise assembling a hard decision vector on the basis of the LLRs at that layer. In step 223, a syndrome check is performed on the generated intermediate output codeword. The syndrome check comprises checking whether the generated intermediate output codeword satisfied conditions to be a member of the codebook of the relevant code. As discussed above, this may comprise multiplying a vector of the intermediate output codeword by the parity check matrix of the code to which the transmitted codeword belongs and checking whether or not the resulting vector is a null vector.

If the syndrome check is not found to be satisfied in step 231, then the codeword has not yet been recovered, and optimising trainable parameters of the NN to minimise a loss function comprises continuing with optimising of the trainable parameters at step 233 as the representation is propagated through the NN. If the syndrome check is found to be satisfied at step 231, then the method 200 ceases optimisation of the trainable parameters after optimisation at the layer at which the syndrome check is satisfied, as shown in step 232.

As illustrated at step 234, optimising trainable parameters of the NN to minimise a loss function may comprise minimising the loss function calculated on the basis of at least one intermediate output codeword selected from the set of intermediate output codewords available at layers up to an including the layer at which the syndrome check is satisfied. The loss function may in some examples be a cross entropy loss function, or a cross entropy multi-loss function, as illustrated at 235. In the case of a cross entropy loss function, the loss function may be minimised on the basis of the intermediate output codeword at the layer at which the syndrome check is satisfied. In the case of a cross entropy multi loss function, the loss function may be minimised on the basis of all intermediate output codewords at layers up to an including the layer at which the syndrome check is satisfied.

In some examples of the method 200, the loss function which is minimised to optimise trainable parameters may be a cross entropy loss function as set out below:

$$\text{Loss} = -\frac{1}{N}\sum_{v=1}^{N} I_{\{\hat{o}_{i,v} \times H^T = 0^T\}} (t_v \log(o_{i,v}) + (1 - t_v)\log(1 - o_{i,v}))$$

where N is the number of bits in the transmitted codeword,

I{f} is the indicator function, whose value is 1 if {f} is true and 0 otherwise, H is the parity check matrix of the code to which the transmitted codeword belongs, o(i,v) is the output representation of the NN at the i-th layer of the network corresponding to the v-th bit in the transmitted codeword, $\hat{o}_{i,v}$ is a vector of the intermediate output codeword at the i-th layer, and tv is the target value of the v-th bit of the transmitted codeword.

In the case of a binary code with LLR representations, o(i,v) is the LLR for the v-th bit in the transmitted codeword at the i-th layer of the NN, that is the likelihood of the v-th bit being a 1 rather than a 0 as output by the i-th layer of the NN. In this case, $\hat{o}_{i,v}$ is the hard decision vector of the output of the NN at the i-th layer. The target value tv of the v-th bit of the transmitted codeword is the actual value (1 or 0 in the binary case) of the v-th bit of the transmitted codeword. In the above loss function, the indicator function implements the syndrome check introduced according to examples of the present disclosure. According to the above loss function, if the syndrome check is satisfied, the output of the indicator function will be 1, and if the syndrome check is not satisfied, the output of the indicator function will be 0. The loss is therefore calculated only on the basis of the intermediate output representation at the layer at which the syndrome check is satisfied. In some examples of the present disclosure, the indicator function may be omitted, and the limitation that the loss function is be calculated only at the layer at which the syndrome check is satisfied may be imposed via the neural network training algorithm. In such examples, the i-th layer as discussed above is the layer at which the syndrome check is satisfied.

In further examples of the method 200, the loss function which is minimised to optimise trainable parameters may be a cross entropy multi-loss function as set out below:

$$\text{Loss} = \frac{-1}{MN} \sum_{i=2,4,\ldots}^{2M} \left( \sum_{v=1}^{N} (t_v \log(o_{i,v}) + (1 - t_v)\log(1 - o_{i,v})) \right)$$

where N is the number of bits in the transmitted codeword, o(i,v) is the output representation of the NND at the ith layer of the network corresponding to v-th bit in the transmitted codeword, tv is the target value of the with bit of the transmitted codeword,
2L is the number of hidden layers in the NND, and
if the syndrome check is satisfied at an even layer k: $0 < k < 2L$, then $2M = k$, else $2M = 2L$.

As for the cross entropy loss function discussed above, in the case of a binary code with LLR representations, o(i,v) is the LLR for the v-th bit in the transmitted codeword at the i-th layer of the NN, that is the likelihood of the v-th bit being a 1 rather than a 0 as output by the i-th layer of the NN. The target value tv of the v-th bit of the transmitted codeword is the actual value (1 or 0 in the binary case) of the v-th bit of the transmitted codeword. The above cross entropy multi-loss function includes contributions from all even layers up to and including the layer at which the syndrome check is satisfied.

Figure 6:
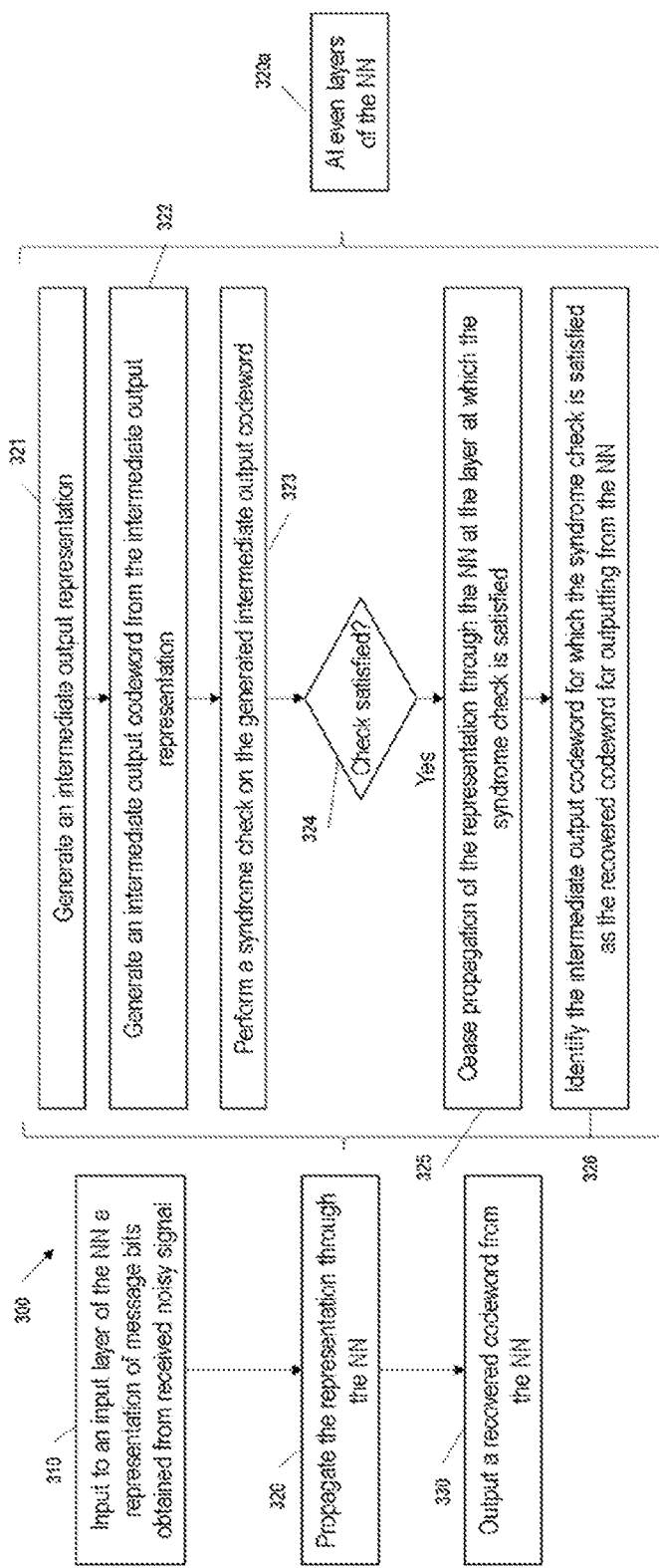
FIG. 6 is a flow chart illustrating process steps in a method for decoding using a neural network according to an example of the present disclosure.

FIG. 6 illustrates process steps in a first example of a method 300 for decoding a received signal using a Neural Network (NN). Layers of the NN implement sequential iterations of the SPA and the received signal comprises a transmitted codeword of a FEC code and added noise. In some examples, the added noise may be AWGN, which may in some examples be artificially added to imitate a wireless communication channel. Referring to FIG. 6, in a first step 310, the method comprises inputting to an input layer of the NN a representation of message bits obtained from the received noisy signal. The method then comprises, at step 320, propagating the representation through the NN, and, at step 330, outputting a recovered codeword from the NN. As illustrated in FIG. 6, propagating the representation through the NN comprises, at even layers of the NN as illustrated at 320a, generating an intermediate output representation at step 321, generating an intermediate output codeword from the intermediate output representation at step 322, and performing a syndrome check on the generated intermediate output codeword at step 323. If the syndrome check at step 323 is satisfied at step 324, the method comprises ceasing propagation of the representation through the NN at the layer at which the syndrome check is satisfied at step 325 and identifying the intermediate output codeword for which the syndrome check is satisfied as the recovered codeword for outputting from the NN at step 326. It will be appreciated that in some examples of the method 300, the steps 321 to 325 may be performed at every even layer of the NN. The transmitted codeword may comprise a test codeword received during a testing phase of the NN and/or a codeword received during an online phase of the NND Examples of the present disclosure thus introduce a syndrome check at even layers of the neural network during the online decoding phase and/or during the testing phase, and cease propagation of the representation of message bits through the NN at the layer at which the syndrome check is satisfied. Examples of the present invention may be applied to the operation of a neural network for recovery of a codeword from a range of different FEC codes, including both binary and non-binary codes.

Figure 7:
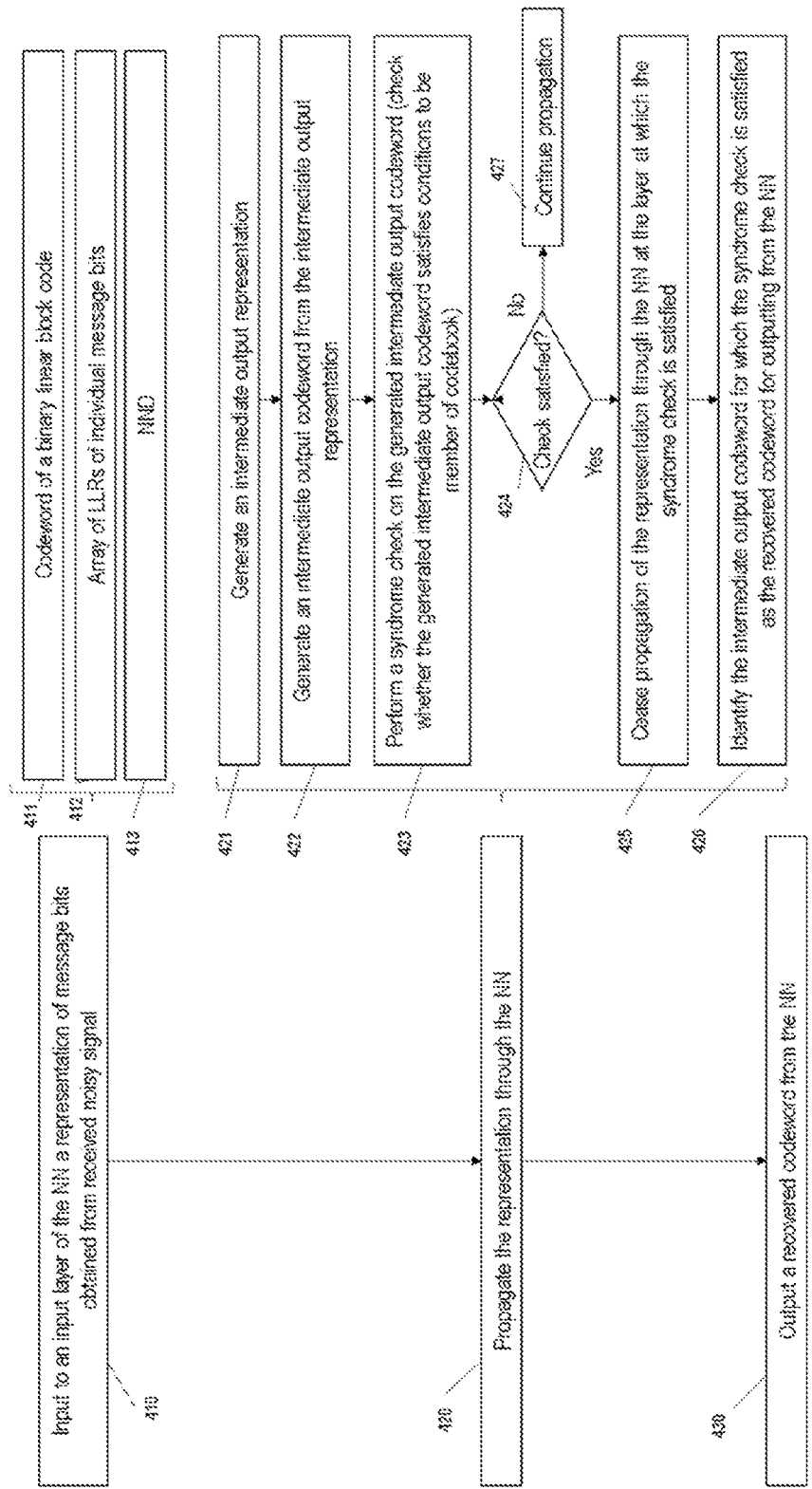
FIG. 7 is a flow chart illustrating process steps in another example of method for decoding using a neural network according to an example of the present disclosure.

FIG. 7 is a flow chart illustrating another example of a method 400 for decoding a received signal using a Neural Network (NN). The method 400 of FIG. 7 provides one example of how the steps of the method 300 of FIG. 6 may be implemented and supplemented. As discussed above, layers of the NN of the method of FIG. 7 implement sequential iterations of the SPA. The received signal comprises a transmitted codeword of a FEC code and added noise. In some examples, the added noise may be AWGN, which may in some examples be artificially added to imitate a wireless communication channel. Referring to FIG. 7, in a first step 410, the method comprises inputting to an input layer of the NN a representation of message bits obtained from the received noisy signal. As illustrated at step 411, the received noisy signal may include a codeword of a binary linear block code, which the NN may be trained to recover. As illustrated at 412, the representation of message bits obtained from the received noisy signal may comprise an array of Log-Likelihood Ratios (LLRs) of the individual message bits obtained from the received noisy signal. As discussed above, in the case of a binary code, the LLRs provide the logarithm of the ratio between the probability that a particular transmitted bit was a 0 and the probability that it was 1. As illustrated at 413, in some examples, the NN may comprise a Neural Network Decoder, which as discussed above is based on a closed form analytical expression of SPA obtained for binary codes. For non-binary codes, requiring simultaneous operation over multiple variations at a time, translation to a neural network has not yet been documented, however the steps of the method 300 and/or 400 are equally applicable to the non-binary case.

The method 400 further comprises propagating the representation of message bits through the NN at step 420 and outputting a recovered codeword from the NN at step 430. As discussed above, propagating the representation through the NN may comprise forwarding the representation (for example the LLRs) through the layers of the NN, such that the representations are updated according to the operations performed at the different layers of the NN. According to the present disclosure, propagating the representation through the NN comprises performing steps 421 to 426 at even layers of the NN, and may comprise performing these steps at every even layer of the NN. Step 421 comprises generating an intermediate output representation and step 422 comprises generating an intermediate output codeword from the intermediate output representation. In the case of a binary FEC represented by LLRs, step 422 may comprise assembling a hard decision vector on the basis of the LLRs at that layer. In step 423, a syndrome check is performed on the generated intermediate output codeword. The syndrome check comprises checking whether the generated intermediate output codeword satisfied conditions to be a member of the codebook of the relevant code. If the syndrome check is not satisfied, then the codeword has not yet been recovered, and propagation of the representation through the NN continues at step 427. If the syndrome check is satisfied at step 424, then the method 400 ceases propagation of the representation through the NN at the layer at which the syndrome check is satisfied in step 425 and identifies the intermediate output codeword for which the syndrome check is satisfied as the recovered codeword for outputting from the NN in step 426.

Figure 8:
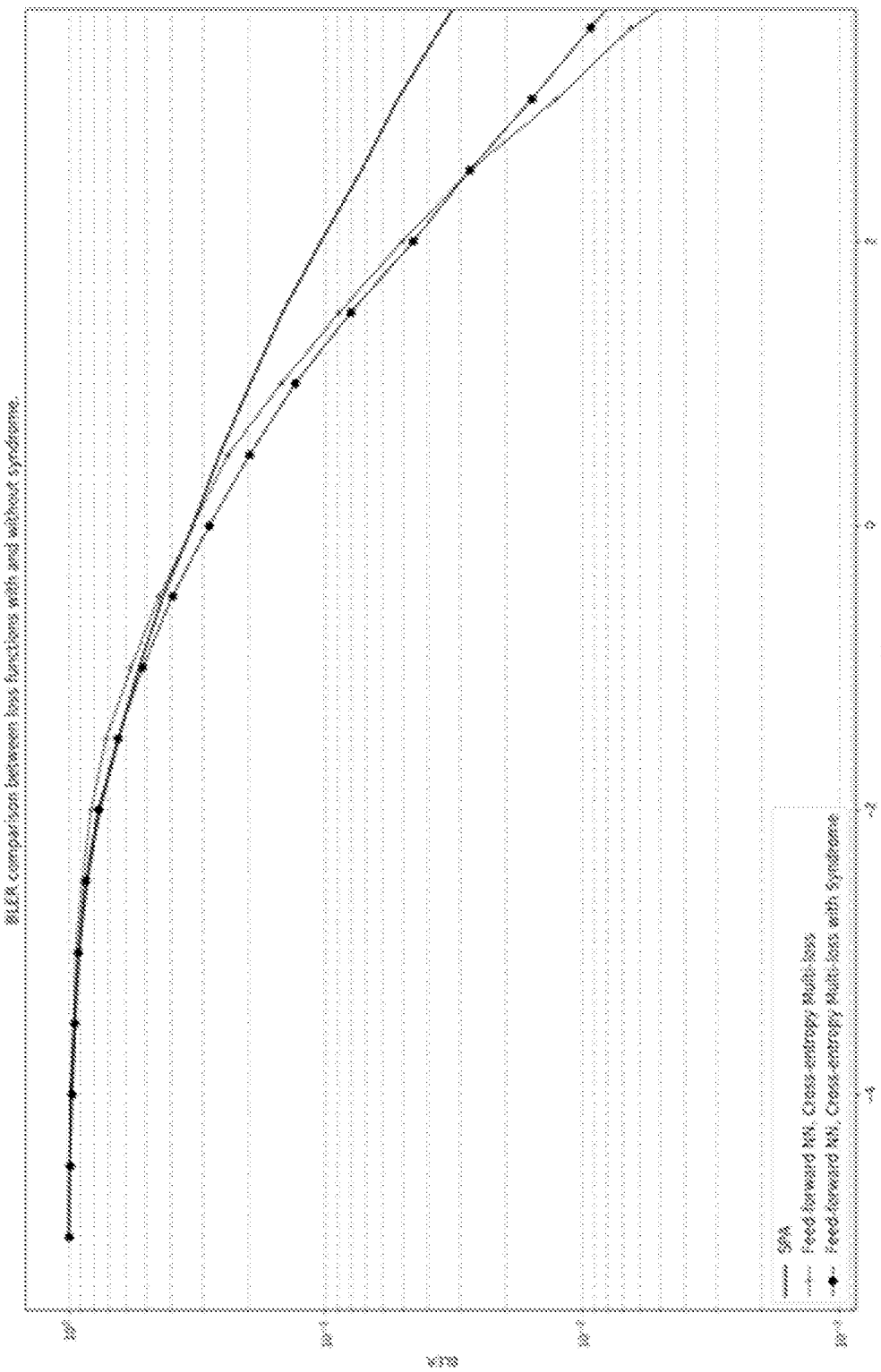
FIG. 8 is a graph comparing Block Error Rate (BLER) for different loss functions for a Polar [32,16] code.

FIG. 8 is a graph comparing Block Error Rate (BLER) for different loss functions for a Polar [32,16] code. The solid curve in FIG. 8 illustrates performance of the SPA algorithm. The curve with circular graph points illustrates performance for a network trained with loss function with syndrome according to examples of the present disclosure. The following training parameters were used for the illustrated testing:
Architecture: Neural network decoder
TRAIN CODEWORDS: ZEROS
WEIGHT INITIALIZER: FIXED
CLIP SIZE: 20
LOSS FUNCTION: cross entropy multiloss or cross entropy multiloss function with
syndrome
OPTIMIZER: RMSPropOptimizer
NUMBER OF ITERATIONS: 5

LEARNING RATE: 0.01
SNR TRAINING: [1.0]
NUMBER OF INPUTS IN TRAINING BATCH: 120
LENGTH OF TRAINING: 262144

Tests were performed using the trained network weights and architecture. The results in FIG. 8 show that there is improvement in BLER in low SNR range of [−2,2] for a network trained in accordance with examples of the present disclosure, that is trained using method incorporating a syndrome check, implemented in this example using a cross entropy multi-loss function with syndrome.

Methods according to the present disclosure may reduce the computations required in training, testing and decoding using neural networks. In the training phase, examples of the present disclosure train the network to reduce BLER, as for successful decoding, the recovery of a complete codeword is generally required. The introduction of a syndrome check at even layers of the network, and ceasing optimisation of trainable parameters after optimisation at the layer at which the syndrome check is satisfied, force the network to optimise for decoding of a complete codeword. If the complete codeword is decoded, as indicated by the syndrome check, then no further optimisation is performed, reducing both training time and training computational load. In the online and testing phases, examples of the present disclosure allow for early detection of correct codewords via a syndrome check. By ceasing propagation through the NN after a successful syndrome check, and identifying the intermediate output codeword that satisfies the syndrome check as the recovered codeword, examples of the present disclosure allow for early termination of decoding in both the testing and online phases, so reducing computational load and improving decoding speed.

Figure 9:
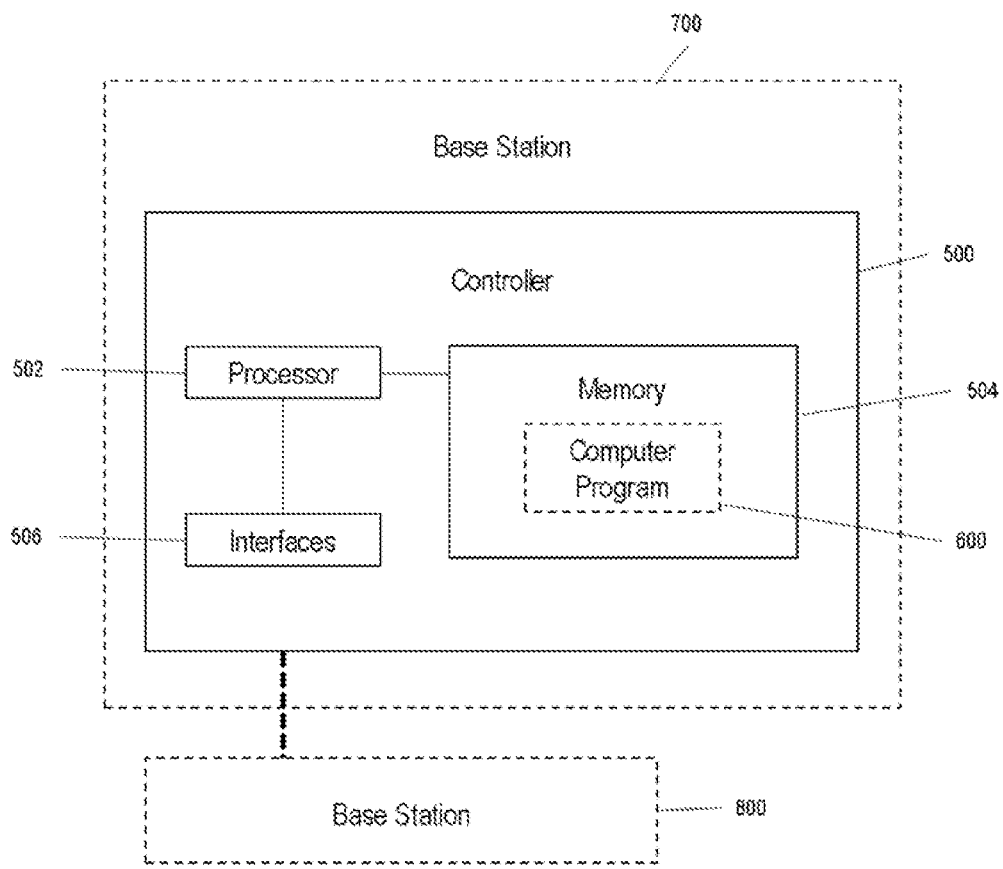
FIG. 9 is a block diagram illustrating functional units in an a controller according to an example of the present disclosure.

The methods 100, 200, 300, 400 may be performed by a controller which may be hosted within a base station or a wireless device. In some examples, the controller may be virtualised and may be hosted on the Cloud in a centralised or distributed manner as appropriate. FIG. 9 is a block diagram illustrating an example controller 300 which may implement the methods 100, 200, 300 and/or 400 according to examples of the present disclosure, for example on receipt of suitable instructions from a computer program 600. Referring to FIG. 9, the controller comprises a processor or processing circuitry 502, a memory 504 and interfaces 506. The memory 504 contains instructions, for example in the form of computer program 600, executable by the processor 502 such that the controller is operative to conduct the steps of the method 100, 200, 300 and or 400. As illustrated in FIG. 9, the controller may in some examples be comprised within a base station 700, or wireless device (not shown). In other examples, the controller may be hosted within another network node such as a processing node, and/or on the cloud, and may be operable for communication with a base station 800 or wireless device (not shown). In such examples, the base station or wireless device may be operable to receive a signal comprising a codeword and to forward the received signal to the controller. The controller may be operable to perform the steps of the method 100, 200, 300 and/or 400 to recover the codeword from the received signal and to forward the recovered codeword to the base station or wireless device or to another node within a communication network.

Figure 10:
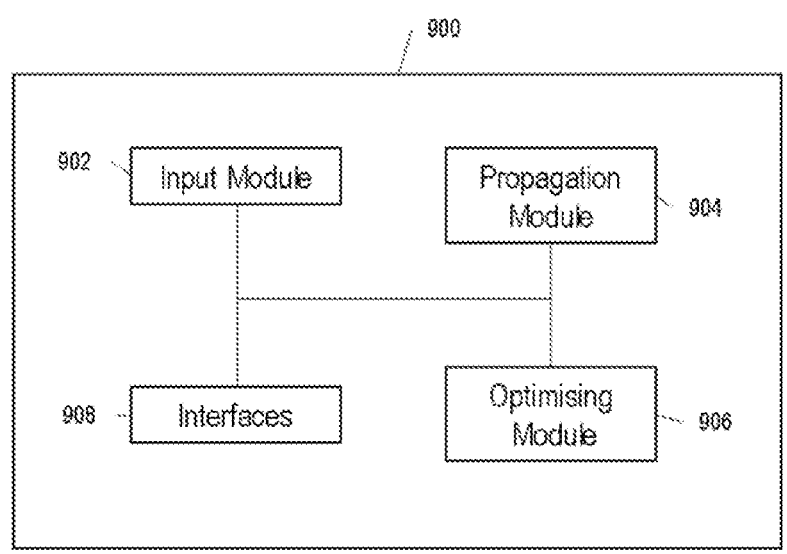
FIG. 10 is a block diagram illustrating functional units in another example of controller according to an example of the present disclosure.

FIG. 10 illustrates functional modules in another example of controller 900 which may execute examples of the methods 100 and/or 200 of the present disclosure, for example according to computer readable instructions received from a computer program. It will be understood that the modules illustrated in FIG. 10 are functional modules and may be realised in any appropriate combination of hardware and/or software. The modules may comprise one or more processors and may be integrated to any degree.

Referring to FIG. 10, the controller 900 comprises an input module for inputting to an input layer of a NN a representation of message bits obtained from a received noisy signal. The controller 900 further comprises a propagation module for propagating the representation through the NN and an optimising module for optimising trainable parameters of the NN to minimise a loss function. The controller 900 further comprises interfaces 908. The propagating module is for propagating the representation through the NN by, at even layers of the NN, generating an intermediate output representation, generating an intermediate output codeword from the intermediate output representation, performing a syndrome check on the generated intermediate output codeword, and, if the syndrome check is satisfied, ceasing optimisation of the trainable parameters after optimisation at the layer at which the syndrome check is satisfied.

Figure 11:
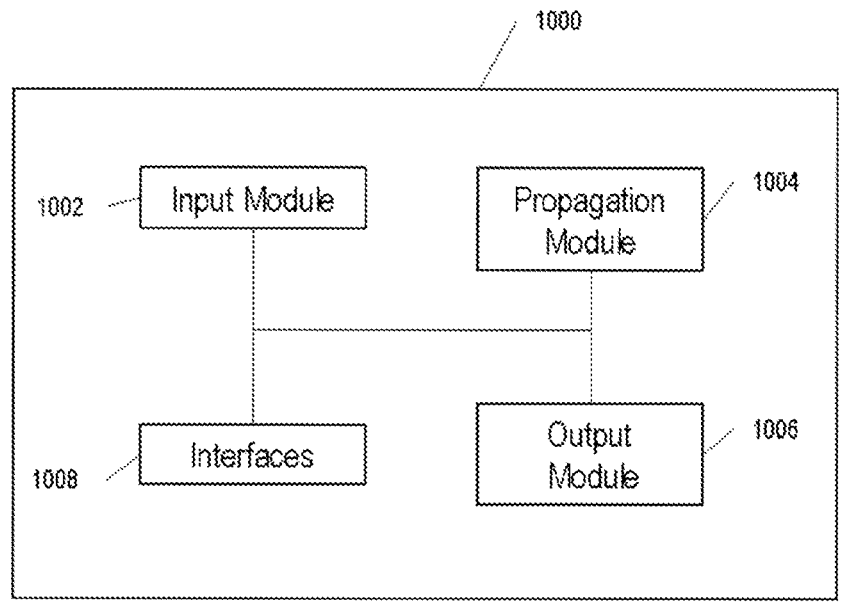
FIG. 11 is a block diagram illustrating functional units in another example of controller according to an example of the present disclosure.

FIG. 11 illustrates functional modules in another example of controller 1000 which may execute examples of the methods 300 and/or 400 of the present disclosure, for example according to computer readable instructions received from a computer program. It will be understood that the modules illustrated in FIG. 11 are functional modules and may be realised in any appropriate combination of hardware and/or software. The modules may comprise one or more processors and may be integrated to any degree.

Referring to FIG. 11, the controller 1000 comprises an input module for inputting to an input layer of a NN a representation of message bits obtained from a received noisy signal. The controller 1000 further comprises a propagation module for propagating the representation through the NN and an output module 1006 for outputting a recovered codeword from the NN. The controller 1000 further comprises interfaces 1008. The propagating module is for propagating the representation through the NN by, at even layers of the NN, generating an intermediate output representation, generating an intermediate output codeword from the intermediate output representation, performing a syndrome check on the generated intermediate output codeword, and, if the syndrome check is satisfied, ceasing propagation of the representation through the NN at the layer at which the syndrome check is satisfied, and, identifying the intermediate output codeword for which the syndrome check is satisfied as the recovered codeword for outputting from the NN.

Figure 12:
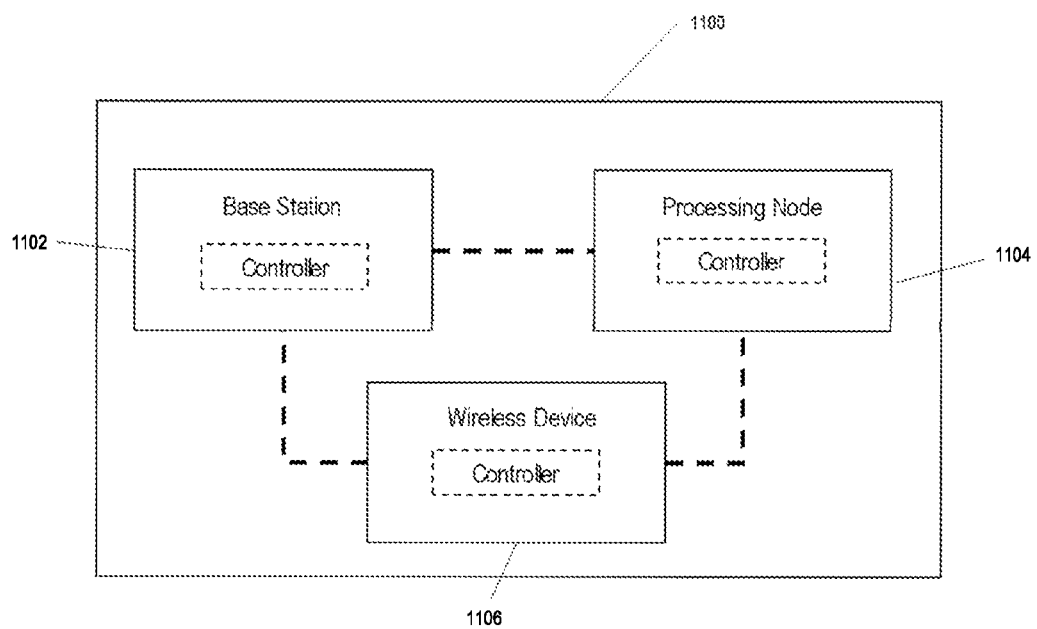
FIG. 12 is a block diagram illustrating nodes in a system according to an example of the present disclosure.

FIG. 12 illustrates a system 1100 comprising a base station 1102, a processing node 1104 and a wireless device 1106. The processing node 1104 may be a physical or virtual processing node. Any one or more of the base station 1102, processing node 1104 and/or wireless device 1106 may comprise a controller such as a controller 500, 900, and/or 1000 as described above. According to examples of the system 1100, the base station 1102 and/or wireless device 1106 may be operable to receive a signal comprising a codeword and to forward the received signal to the processing node. The controller within the processing node may be operable to perform the steps of the method 100, 200, 300 and/or 400 to recover the codeword from the received signal and to forward the recovered codeword to the base station or wireless device or to another node within a communication network.

There now follows a more extensive discussion of experimental training and testing of neural networks including neural networks operating according to examples of the present disclosure. The neural networks comprise neural network decoders (NND) as described in the present disclosure. The NNDs are trained using various different codes and their results, when implementing examples of the present disclosure and when implementing other training and decoding methods, are compared with those of a Belief Propagation decoder implementing the same number of iterations as are implemented by the layers of the NND.

Training and Experimental Setup

The network is trained on various different codes—Hamming (7,4), Polar (32,16), BCH (63,45), and LDPC (96,48). The results from NND are compared with a BP decoder implementing same number of iterations.

Experiment

Environment

Tensorflow implementation in Python 2.7 is used to train and test NND. BP decoder implementation used is developed by Radford M. Neal. The implementation is in C.

Resources

The resources to run the experiments are provided by Ericsson.

Training Parameters

SNR

As discussed above, SNR value defines the errors in the training input data. If SNR is high, the training data will contain many errors. A NND trained using high SNR data will fail to recognize and resolve graph artefacts, and hence will not perform well. On the other hand, NND trained with data with very low SNR might not see any error at all, and training will not result in any learning. This means that NND shouolpd be trained with a training set designed using SNR value (or range) such that NND gives best performance in the usual SNR range during the test phase.

In order to quantitatively justify the choice of training SNR value (or range), the performance metric called Normalized Validation Error (NVE) is used.

$$NVE(v_t) = \frac{1}{N}\sum_{i=1}^{N}\frac{BER_{NND}(v_t, v_{v,i})}{BER_{BP}(v_{v,i})} \quad (2.1)$$

where $v_t$, $v_{v,i}$ are SNR values of training and validation sets, and $BER_{NND}$ and $BER_{BP}$ are BER values calculated with given training and validation set SNR values for NND and BP algorithms, respectively.

Figure 13:
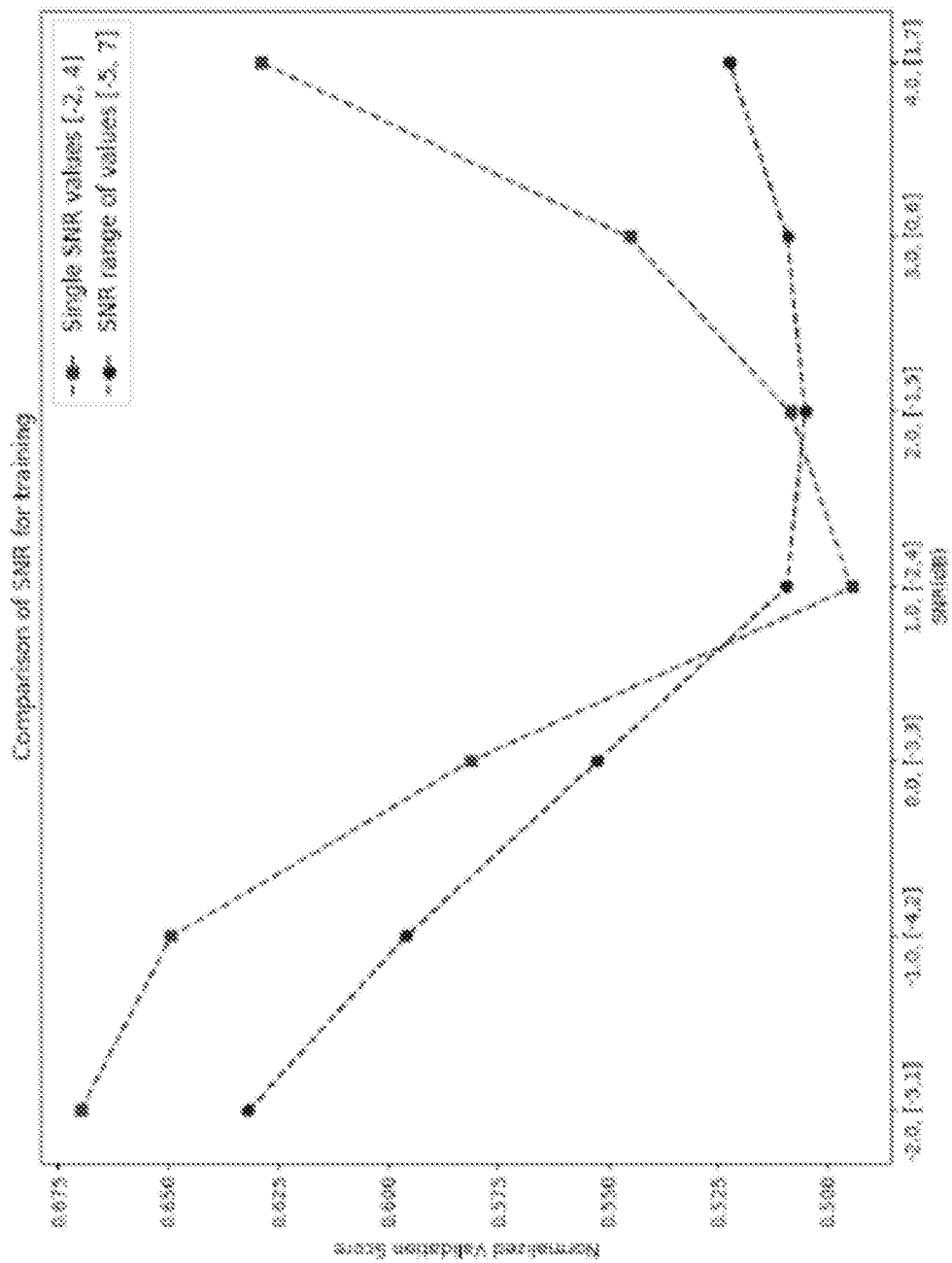
FIG. 13 is a graph illustrating a comparison of different SNR values for training.

FIG. 13 is a graph illustrating a comparison of different SNR values for training. Experimental results have shown that SNR range of values from [1.0, 6.0] provide best results during training.

Optimizer

The NND is trained using RMSPropOptimizer. A learning rate of 0.001 is used.

Training Length

Training length varies with type and length of the code. However, the network is trained for fixed number of steps=262,144 (=218), which is more than the number of steps required for NND loss function to converge for codes considered here. Convergence is faster for Recurrent neural network, and network using Syndrome check loss function. Training is performed on batch of input data. A batch length of 120 codewords is used for training.

Trained Weights

Only the weights that define the structure of the Tanner graph are trained. The initialization of weight can be either fixed (1.0) or can be random. The performance during both training and testing is better for fixed weight initialization.

Loss Functions

Cross Entropy Loss

Cross entropy loss functions are loss metrics applied for a network that give probability of a binary target vector. This type of loss function penalizes the weights based on the probability of the target bit.

$$Loss = -\frac{1}{N}\sum_{v=1}^{N} t_v \log(o_v) + (1-t_v)\log(1-o_v) \quad (2.2)$$

where $t_v \in \{0, 1\}, v=[1, \ldots, N]$ is the target bit value, and $o_v \in (0, 1]$ is probability output by the network's last layer.

Cross Entropy Multi-Loss

This loss function takes advantage of the fact that SPA algorithm provides check after every iteration. Here the network is penalized for wrong output at every iteration, hence pushing the network to learn weights early.

$$Loss = -\frac{1}{N}\sum_{i=1}^{2L-1}\sum_{v=1}^{N} t_v \log(o_{i,v}) + (1-t_v)\log(1-o_{i,v}) \quad (2.3)$$

where $o_{i,v}, i=[1, 3, \ldots, 2L-1]$ is the output at odd layer i, calculated from $x_{i,e}$ using $$o_{i,v} = \sigma\left(\sum_{e=(v,e)} x_{i,e}\right) \quad (2.4)$$

Cross Entropy Loss Function with Syndrome Check

According to examples of the present disclosure, syndrome check is added to multi-loss function to constrain the network for learning only when there is a decoding failure, so improving Block Error Rates (BLER) rather that Bit Error Rates (BER).

$$Loss = -\frac{1}{N}\sum_{v=1}^{N} I_{\{\hat{o}_{i,v} \times H^T = 0^T\}}(t_v \log(o_{i,v}) + (1-t_v)\log(1-o_{i,v})) \quad (2.5)$$

where I{f} is one when f is True, zero otherwise, and $\hat{o}_{i,v}$ is the hard decision vector at ith layer.

Figure 14:
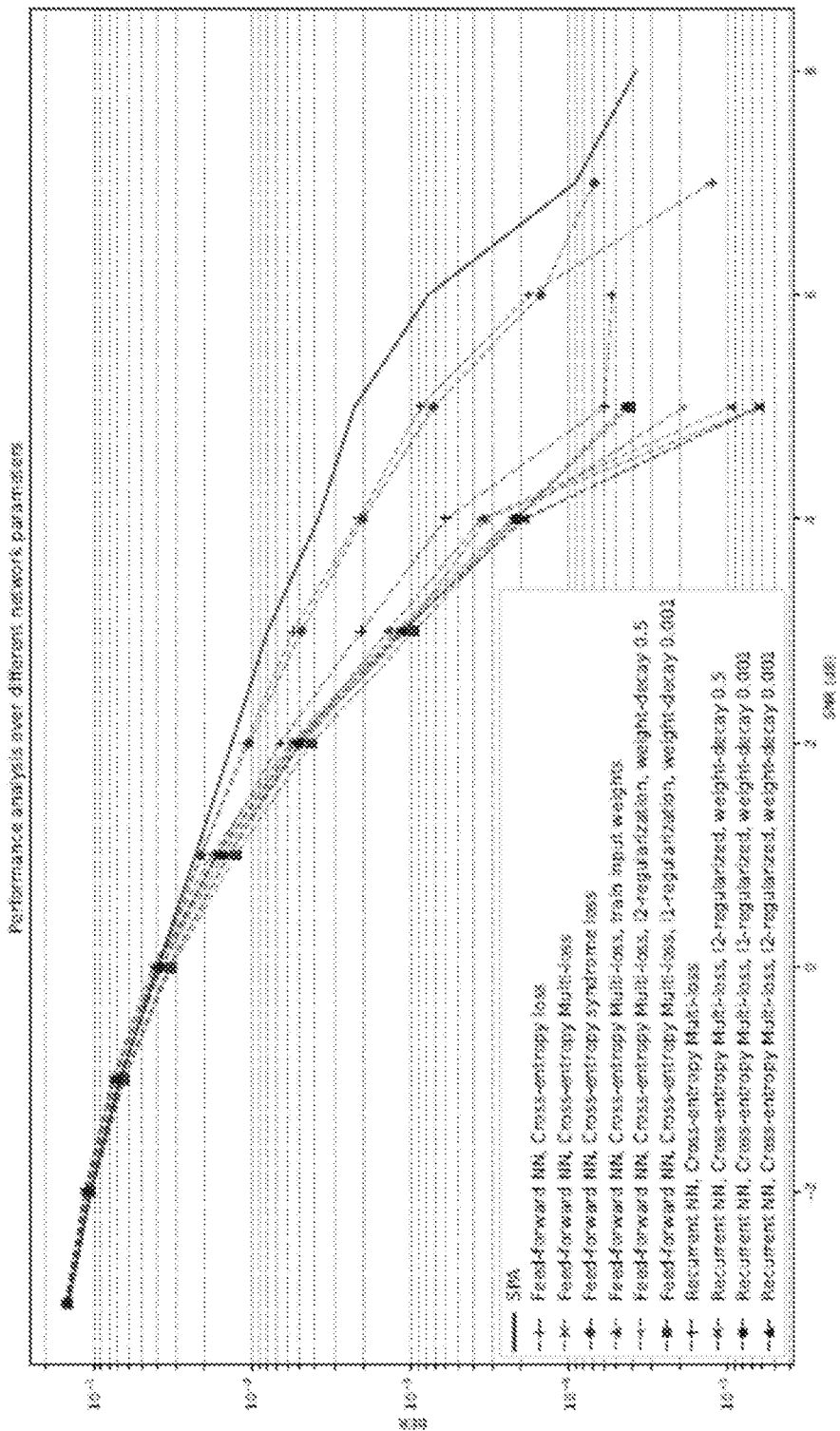
FIG. 14 is a graph illustrating performance analysis over different network parameters.

FIG. 14 is a graph illustrating a comparison of performance according to different parameter settings.

Figure 15:
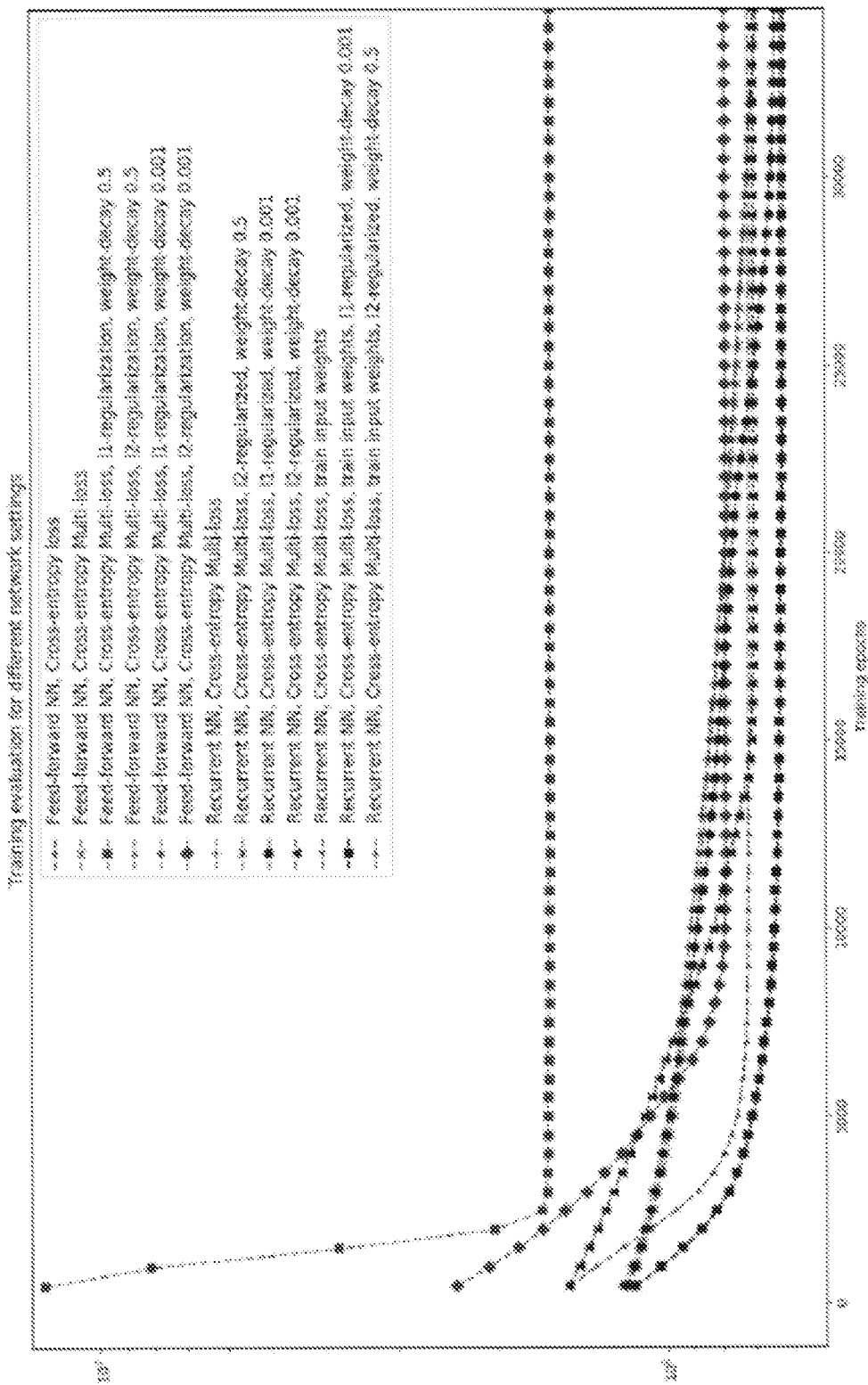
FIG. 15 is a graph illustrating evolution of loss per training epoch for different network parameters.

FIG. 15 illustrates evolution of loss per training epoch for different models. Strong regularization leads to quick learning but stops immaturely. Moderate regularization with RNN architecture performs better.

Results

Edge Weights Analysis

The common training parameters used for training each network are as follows:

Network Architecture: Recurrent Neural network decoder
Regularizer—L2, weight decay: 0.01
Training codewords: zero codewords
Testing codewords: Random binary codewords
Weight numeric quantizer: Float 32
WEIGHT INITIALIZER: FIXED
CLIP SIZE: 20
LOSS FUNCTION: cross entropy multi-loss function OPTIMIZER: RMSPropOptimizer
NUMBER OF ITERATIONS: 5
LEARNING RATE: 0.001
SNR TRAINING: [2.0]
NUMBER OF INPUTS IN TRAINING BATCH: 120
LENGTH OF TRAINING: 262144

Learning to Reduce the Graph Artefacts
Edge Analysis for Hamming (7,4) Code

Figure 16:
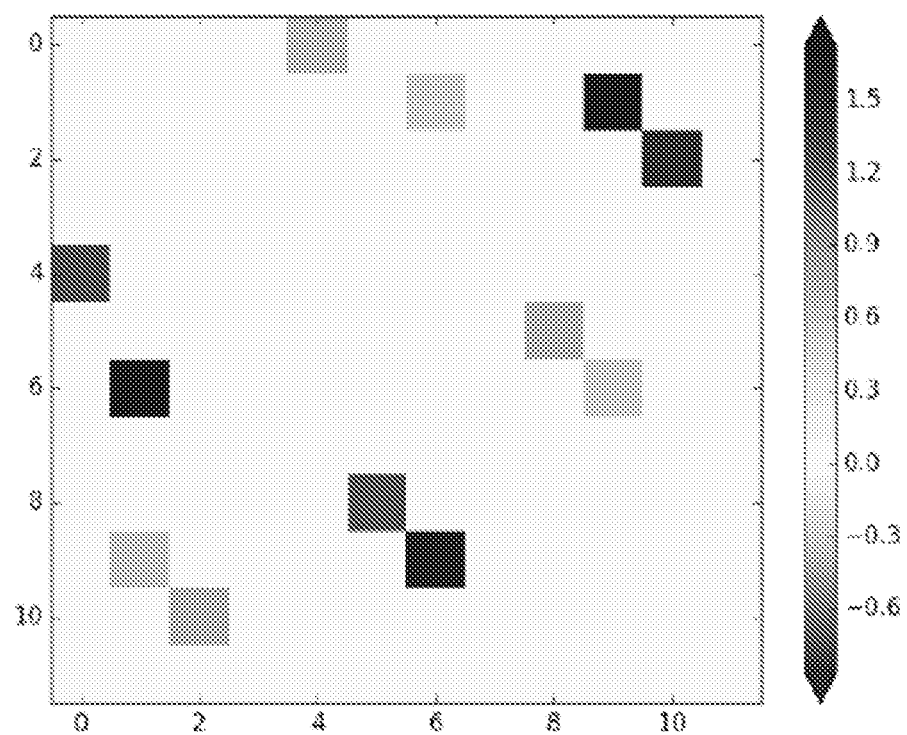
FIGS. 16 to 20 illustrate learned weight distribution over edges for different codes.

FIG. 16 illustrates learned weight distribution over edges for Hamming [7,4] (cf. (1.3)). The effect of cycles is being nullified by assigning complementary weights to set of edges forming the cycle.

Figure 17:
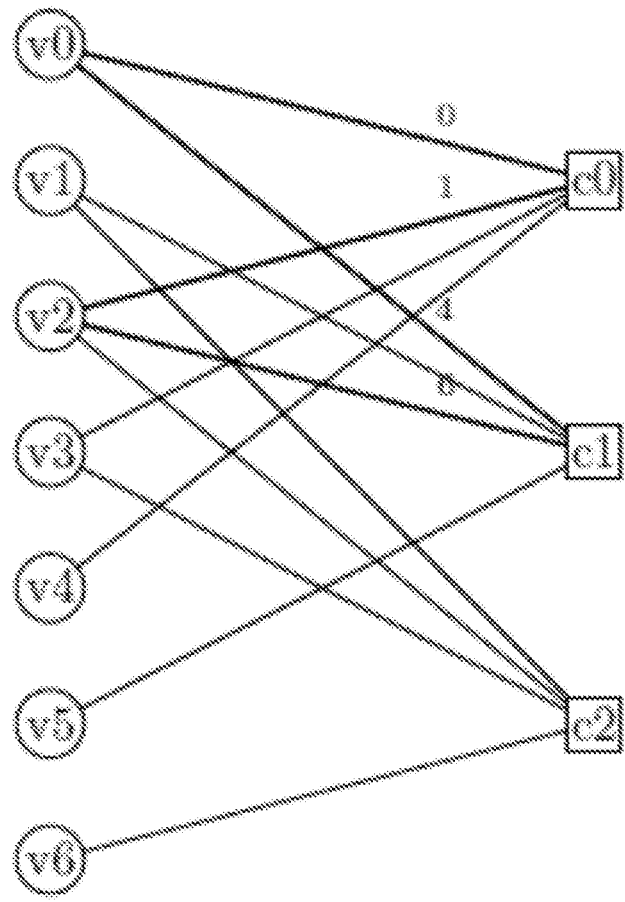

FIG. 17 illustrates the nodes [0,1,4,6] form a cycle. As shown in FIG. 16, the network learns to diminish the effect of cycles by assigning complementary weights to adjacent edges forming cycles.

Edge Analysis for Tree Structured Hamming (7,4) Code

Figures 18, 19:
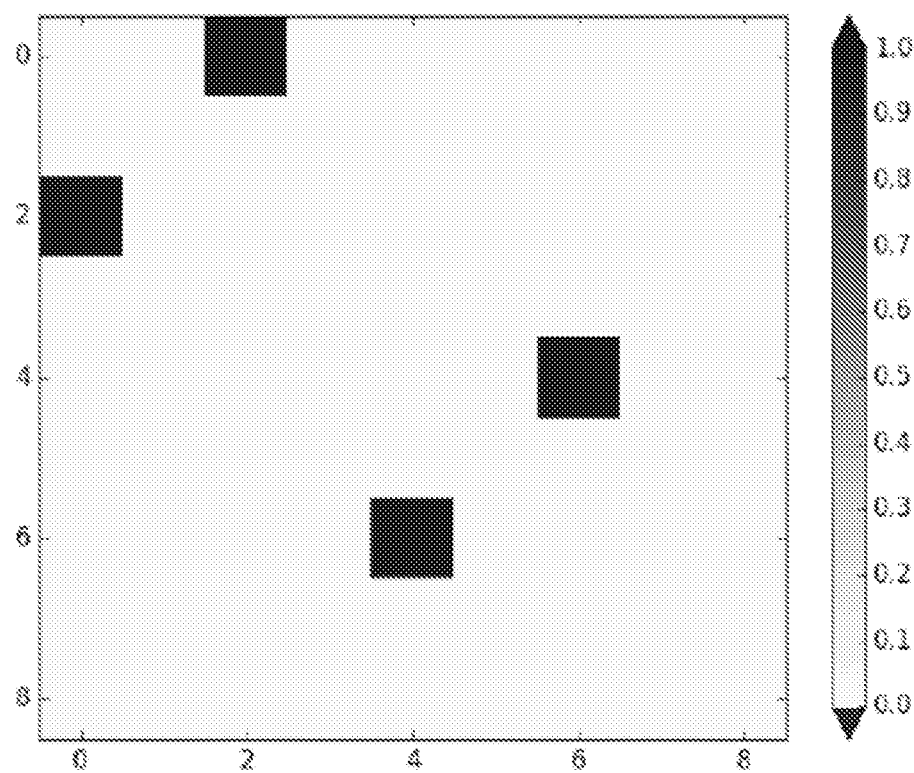

Tree structured Hamming [7,4] is illustrated in FIG. 18. FIG. 19 illustrates learned weight distribution over edges for tree structured Hamming [7,4]. As there are no cycles, the network does not change the weights distribution.

Figure 20:
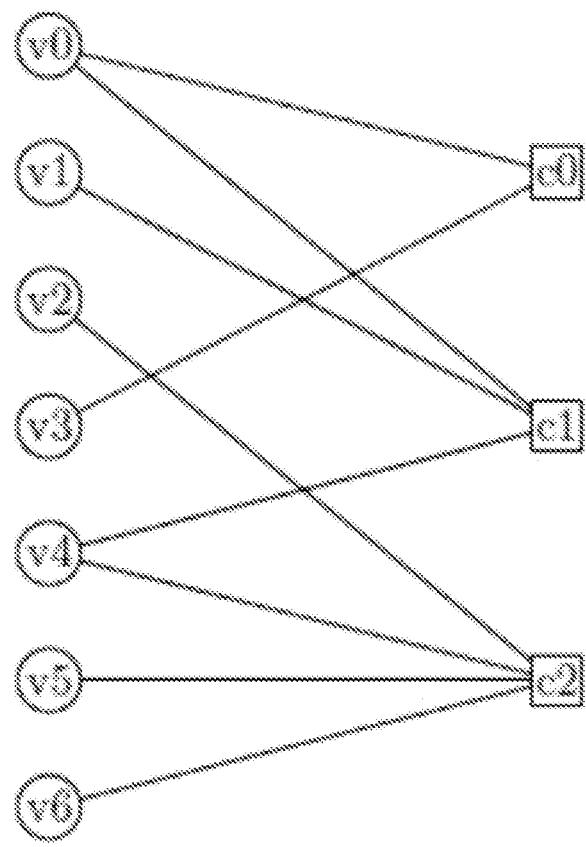

FIG. 20 illustrates that as the tree structure for this code does not have any cycles, the network does not change weights over edges.

Results
Polar (32,16)

Figure 21:
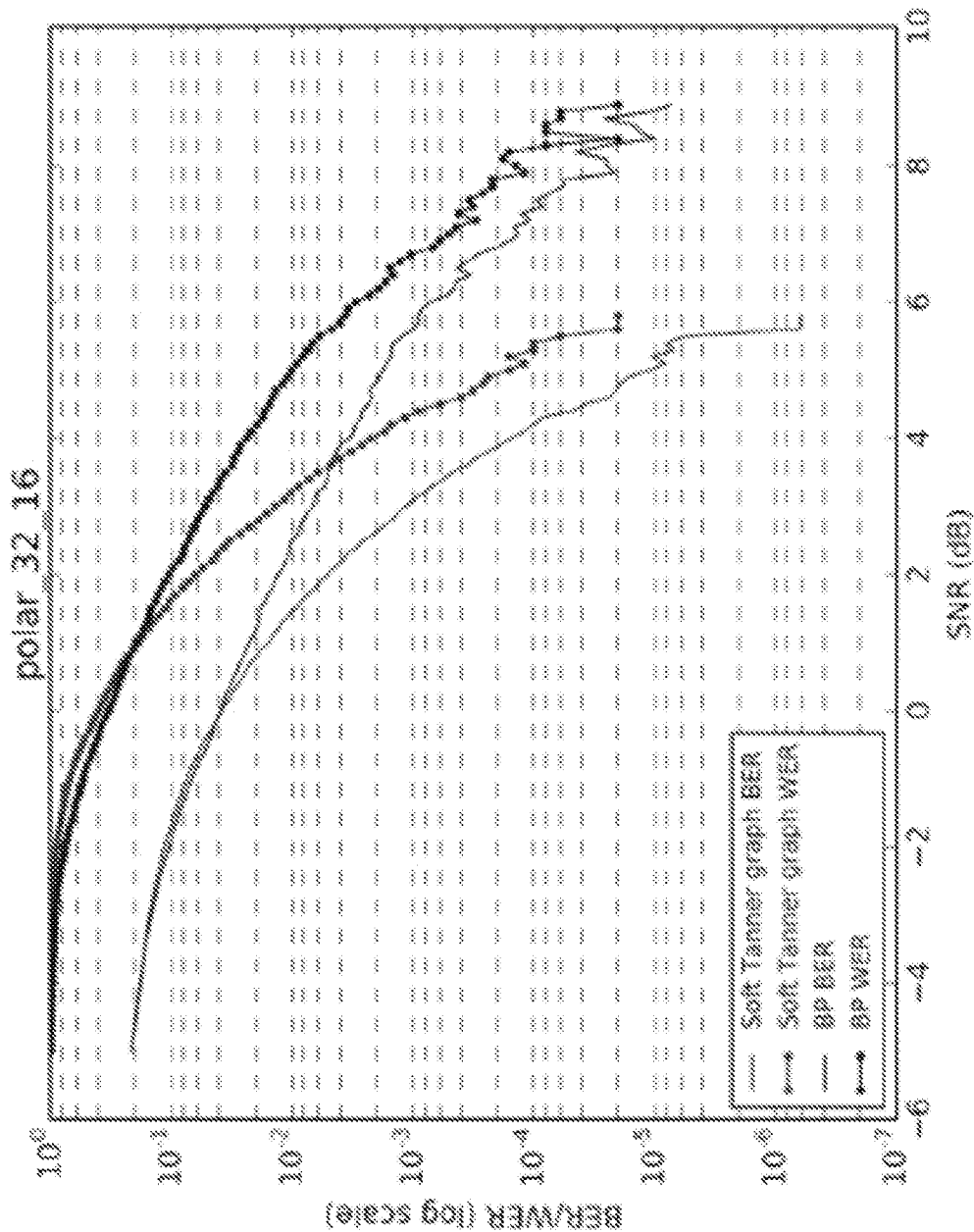
FIGS. 21 to 27 illustrate results obtained according to example of the present disclosure for different codes.
Figure 22:
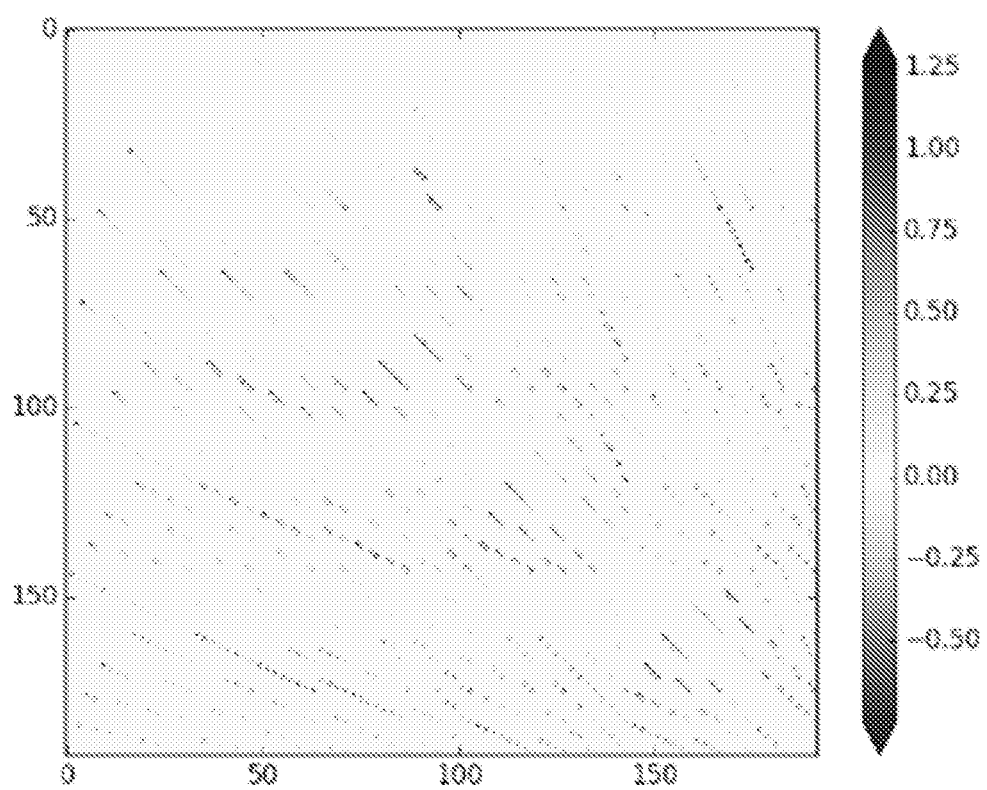
Figure 23:
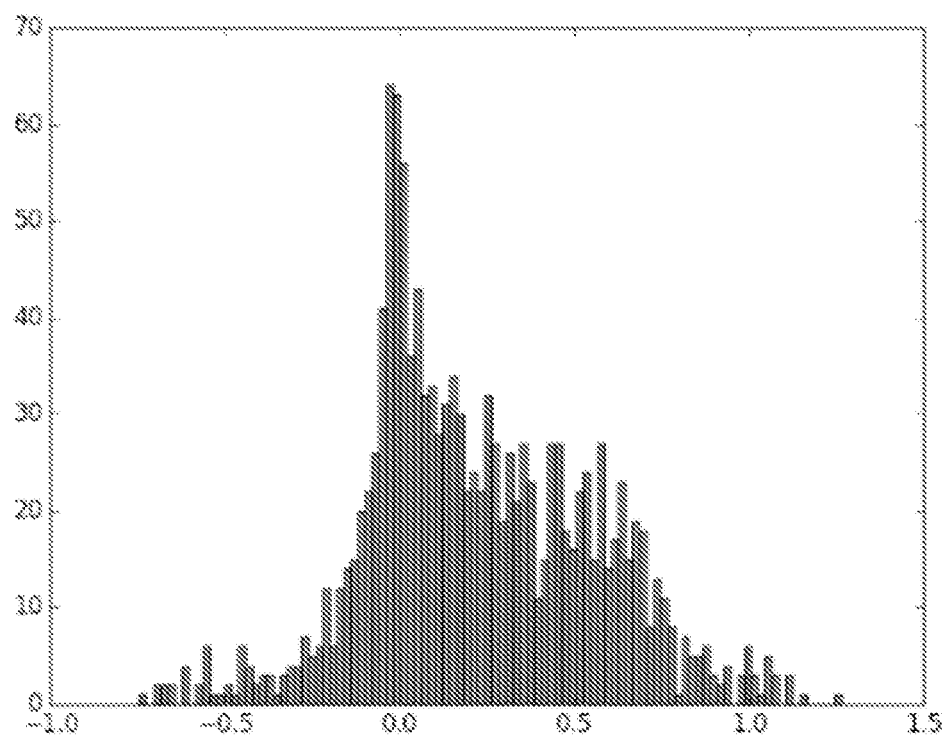

FIG. 21 illustrates results for training with RNN, $2^{18}$ batches, L2 regularization (0.001). FIGS. 22 and 23 illustrate learned weights distribution of Polar [32,16] code.

BCH [63,45]

Figure 24:
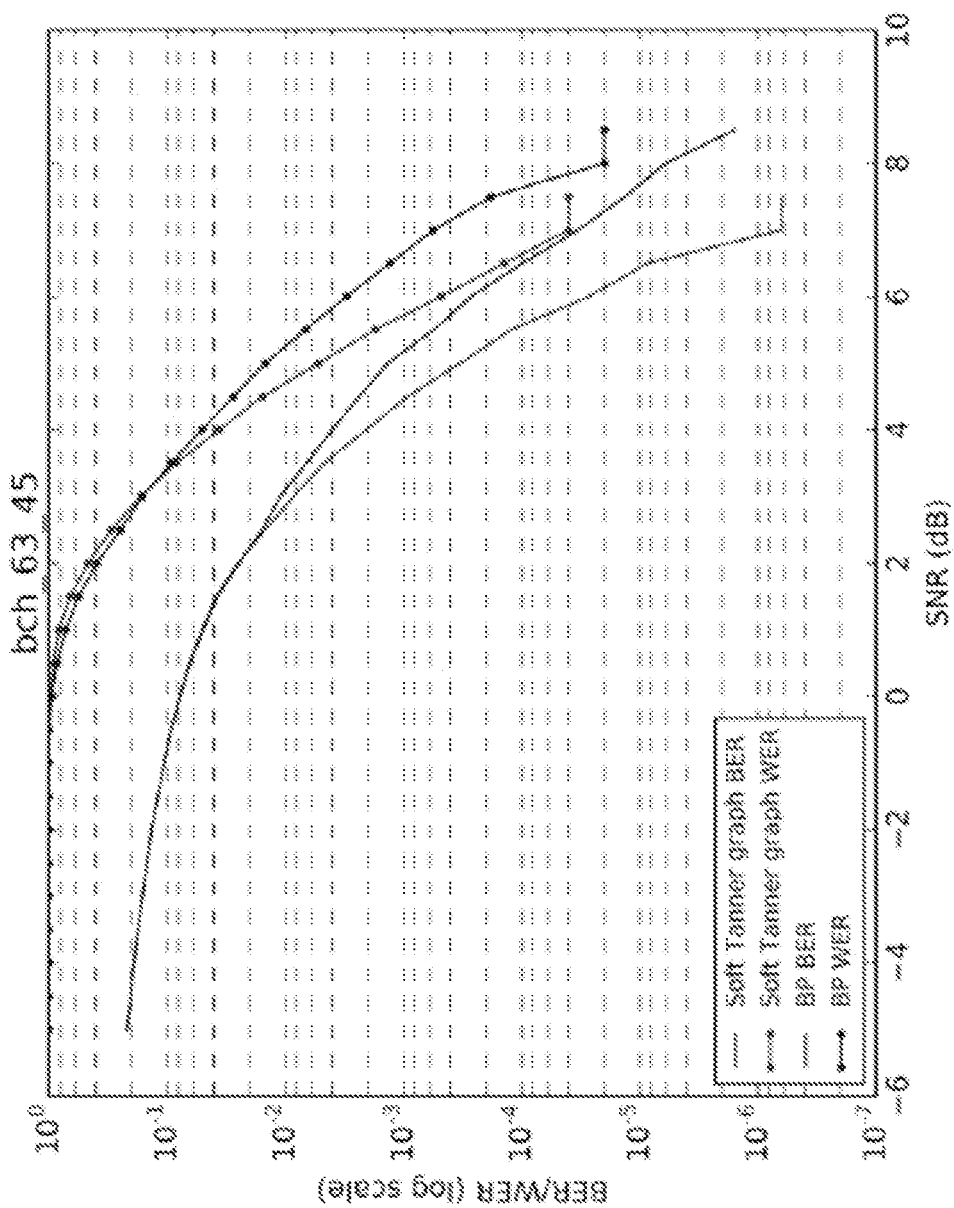

FIG. 24 illustrates results for training with RNN network for $2^{18}$ batches.

LDPC [96,48]

Figure 25:
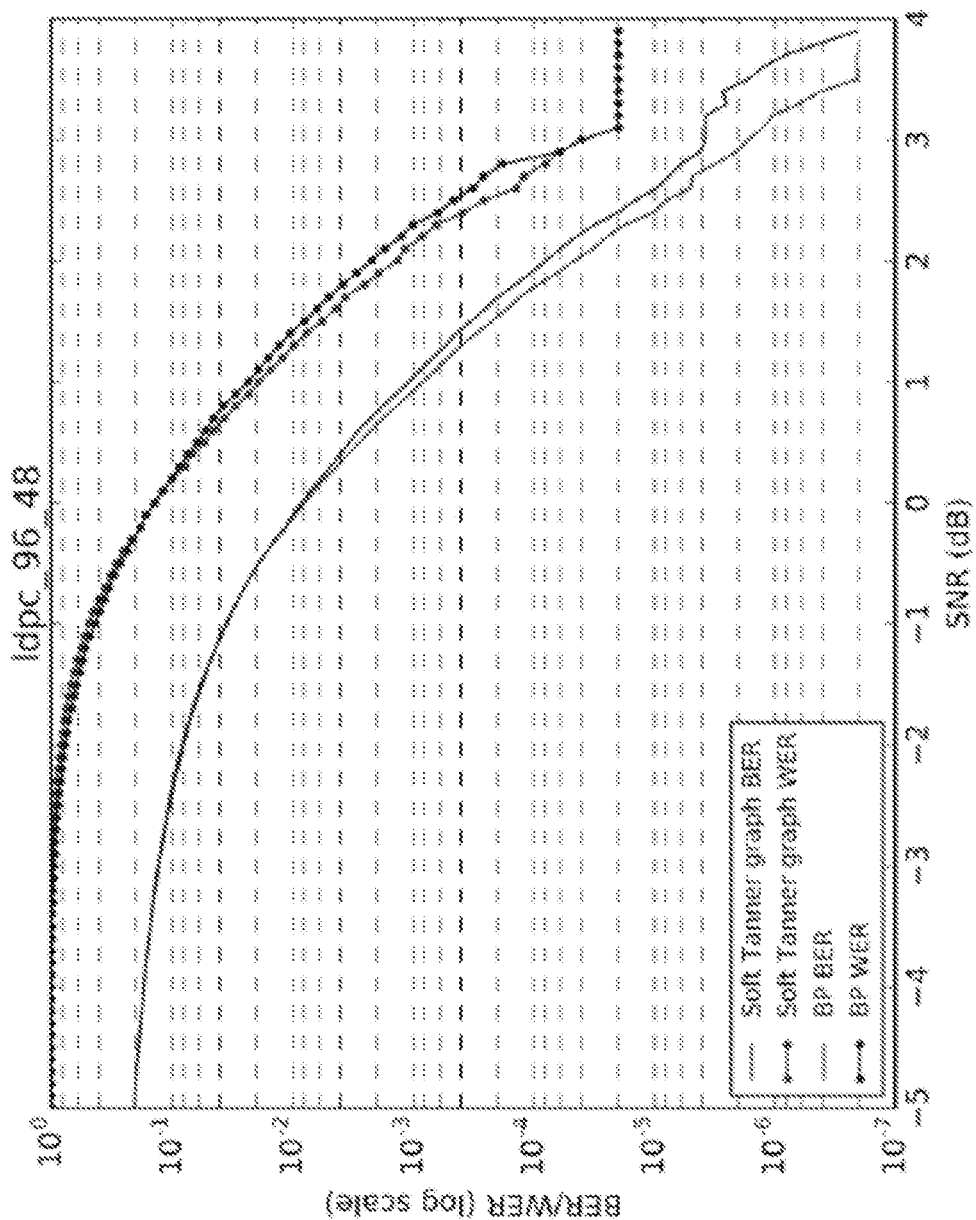

FIG. 25 illustrates results for training with RNN network for $2^{18}$ batches.

Polar (32,24)

Figure 26:
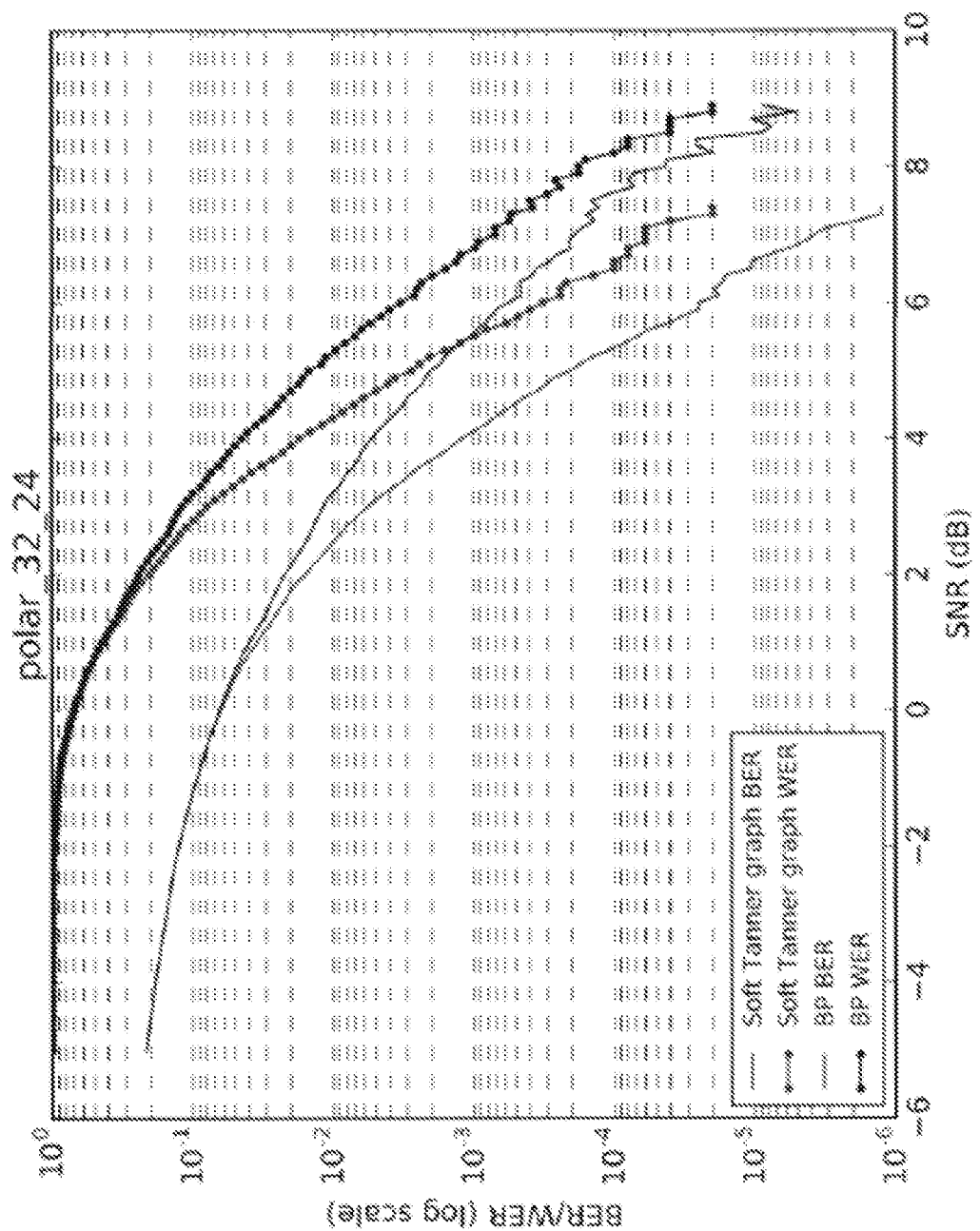

FIG. 26 illustrates results for training with RNN network for $2^{18}$ batches.

Polar (128, 64)

Figure 27:
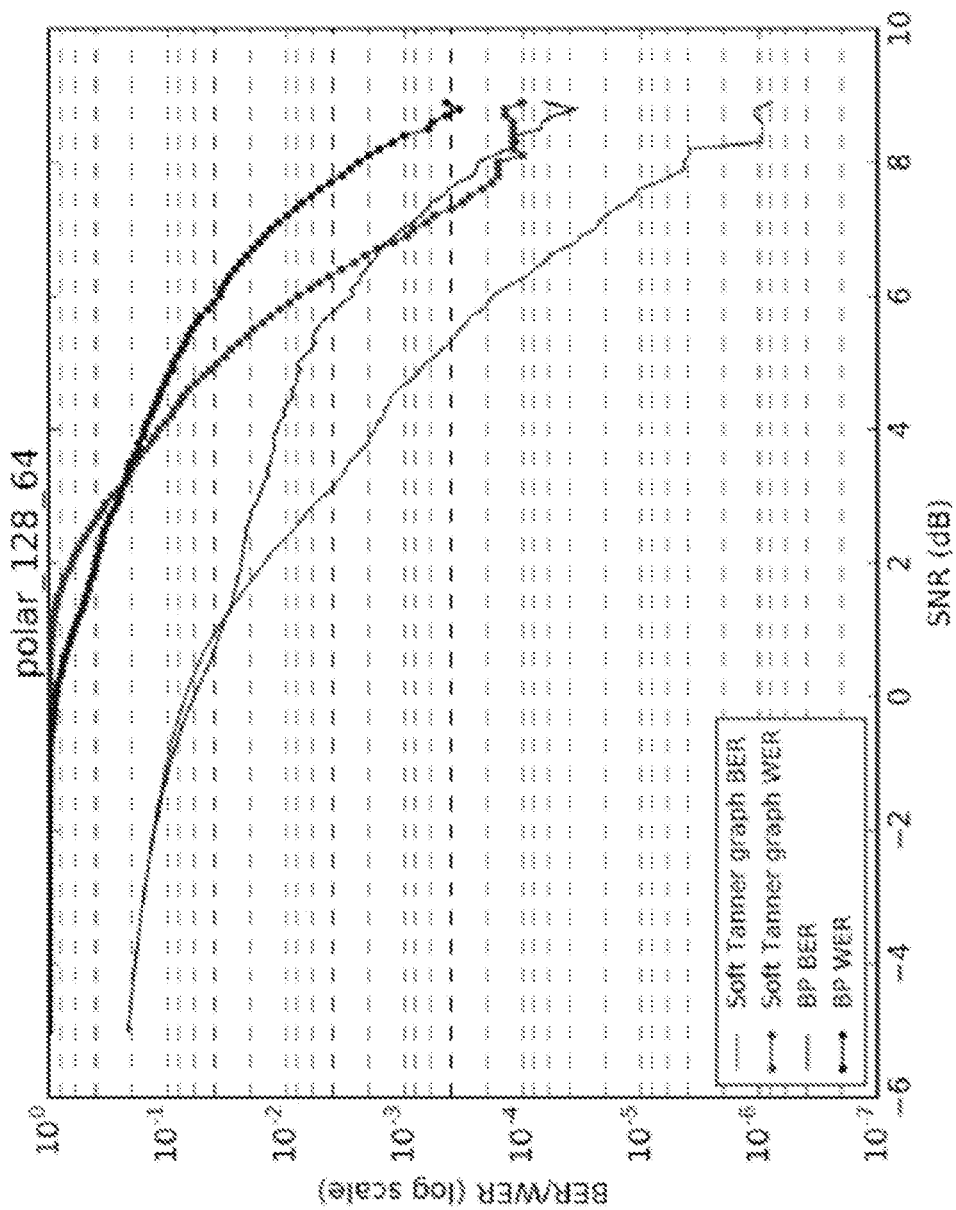

FIG. 27 illustrates results for training with RNN network for $2^{18}$ batches.

Examples of the present disclosure thus provide methods and apparatus according to which a syndrome check may be added to training and decoding. During training, loss may be calculated based on layers up to and including a layer at which the syndrome check is satisfied. The syndrome check may be incorporated into a loss function. Examples of the present disclosure thus also provide a loss metric to be used in a neural network decoder, and an apparatus to implement the computation of the loss metric. The computation of the loss metric can be performed at the most suitable communication network entity, e.g., in an eNB for reduced latency, in a cloud implementation for resource pooling/sharing, in a UE, or in any other entity having a radio receiver, as explained in more detail below.

Figure 28:
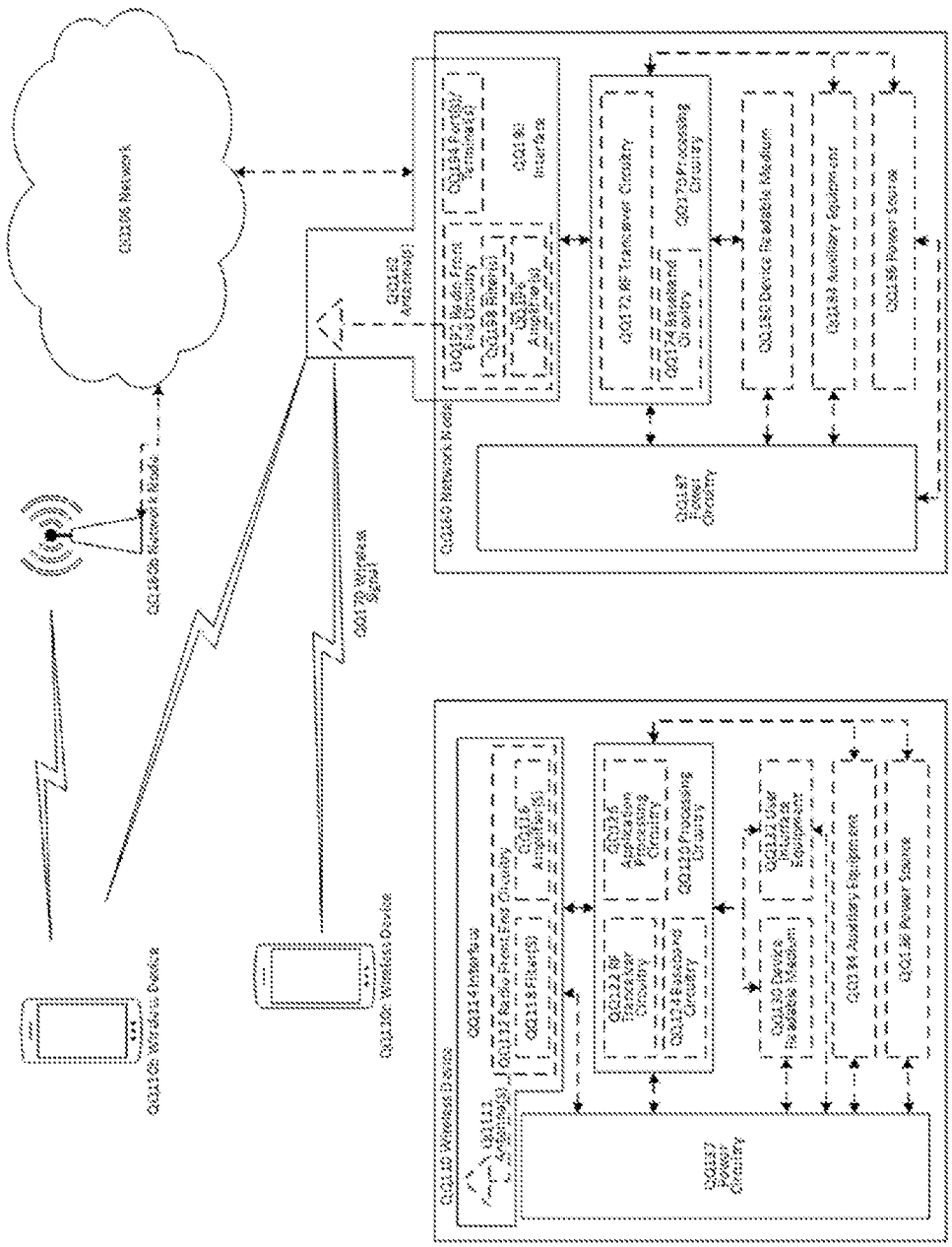
FIG. 28 is a schematic block diagram illustrating a wireless network.

Although the subject matter described herein may be implemented in any appropriate type of system using any suitable components, the embodiments disclosed herein are described in relation to a wireless network, such as the example wireless network illustrated in FIG. 28, which shows a wireless network in accordance with some embodiments. For simplicity, the wireless network of FIG. 28 only depicts network QQ106, network nodes QQ160 and QQ160b, and WDs QQ110, QQ110b, and QQ110c. In practice, a wireless network may further include any additional elements suitable to support communication between wireless devices or between a wireless device and another communication device, such as a landline telephone, a service provider, or any other network node or end device. Of the illustrated components, network node QQ160 and wireless device (WD) QQ110 are depicted with additional detail. The wireless network may provide communication and other types of services to one or more wireless devices to facilitate the wireless devices' access to and/or use of the services provided by, or via, the wireless network.

The wireless network may comprise and/or interface with any type of communication, telecommunication, data, cellular, and/or radio network or other similar type of system. In some embodiments, the wireless network may be configured to operate according to specific standards or other types of predefined rules or procedures. Thus, particular embodiments of the wireless network may implement communication standards, such as Global System for Mobile Communications (GSM), Universal Mobile Telecommunications System (UMTS), Long Term Evolution (LTE), and/or other suitable 2G, 3G, 4G, or 5G standards; wireless local area network (WLAN) standards, such as the IEEE 802.11 standards; and/or any other appropriate wireless communication standard, such as the Worldwide Interoperability for Microwave Access (WiMax), Bluetooth, Z-Wave and/or ZigBee standards.

Network QQ106 may comprise one or more backhaul networks, core networks, IP networks, public switched telephone networks (PSTNs), packet data networks, optical networks, wide-area networks (WANs), local area networks (LANs), wireless local area networks (WLANs), wired networks, wireless networks, metropolitan area networks, and other networks to enable communication between devices.

Network node QQ160 and WD QQ110 comprise various components described in more detail below. These components work together in order to provide network node and/or wireless device functionality, such as providing wireless connections in a wireless network. In different embodiments, the wireless network may comprise any number of wired or wireless networks, network nodes, base stations, controllers, wireless devices, relay stations, and/or any other components or systems that may facilitate or participate in the communication of data and/or signals whether via wired or wireless connections.

As used herein, network node refers to equipment capable, configured, arranged and/or operable to communicate directly or indirectly with a wireless device and/or with other network nodes or equipment in the wireless network to enable and/or provide wireless access to the wireless device and/or to perform other functions (e.g., administration) in the wireless network. Examples of network nodes include, but are not limited to, access points (APs) (e.g., radio access points), base stations (BSs) (e.g., radio base stations, Node Bs, and evolved Node Bs (eNBs)). Base stations may be categorized based on the amount of coverage they provide (or, stated differently, their transmit power level) and may then also be referred to as femto base stations, pico base stations, micro base stations, or macro base stations. A base station may be a relay node or a relay donor node controlling a relay. A network node may also include one or more (or all) parts of a distributed radio base station such as centralized digital units and/or remote radio units (RRUs), sometimes referred to as Remote Radio Heads (RRHs). Such remote radio units may or may not be integrated with an antenna as an antenna integrated radio. Parts of a distributed radio base station may also be referred to as nodes in a distributed antenna system (DAS). Yet further examples of network nodes include multi-standard radio (MSR) equipment such as MSR BSs, network controllers such as radio network controllers (RNCs) or base station controllers (BSCs), base transceiver stations (BTSs), transmission points, transmission nodes, multi-cell/multicast coordination entities (MCEs), core network nodes (e.g., MSCs, MMEs), O&M nodes, OSS nodes, SON nodes, positioning nodes (e.g., E-SMLCs), and/or MDTs. As another example, a network node may be a virtual network node as described in more detail below. More generally, however, network nodes may represent any suitable device (or group of devices) capable, configured, arranged, and/or operable to enable and/or provide a wireless device with access to the wireless network or to provide some service to a wireless device that has accessed the wireless network.

In FIG. 28, network node QQ160 includes processing circuitry QQ170, device readable medium QQ180, interface QQ190, auxiliary equipment QQ184, power source QQ186, power circuitry QQ187, and antenna QQ162. Although network node QQ160 illustrated in the example wireless network of FIG. 28 may represent a device that includes the illustrated combination of hardware components, other embodiments may comprise network nodes with different combinations of components. It is to be understood that a network node comprises any suitable combination of hardware and/or software needed to perform the tasks, features, functions and methods disclosed herein. Moreover, while the components of network node QQ160 are depicted as single boxes located within a larger box, or nested within multiple boxes, in practice, a network node may comprise multiple different physical components that make up a single illustrated component (e.g., device readable medium QQ180 may comprise multiple separate hard drives as well as multiple RAM modules).

Similarly, network node QQ160 may be composed of multiple physically separate components (e.g., a NodeB component and a RNC component, or a BTS component and a BSC component, etc.), which may each have their own respective components. In certain scenarios in which network node QQ160 comprises multiple separate components (e.g., BTS and BSC components), one or more of the separate components may be shared among several network nodes. For example, a single RNC may control multiple NodeB's. In such a scenario, each unique NodeB and RNC pair, may in some instances be considered a single separate network node. In some embodiments, network node QQ160 may be configured to support multiple radio access technologies (RATs). In such embodiments, some components may be duplicated (e.g., separate device readable medium QQ180 for the different RATs) and some components may be reused (e.g., the same antenna QQ162 may be shared by the RATs). Network node QQ160 may also include multiple sets of the various illustrated components for different wireless technologies integrated into network node QQ160, such as, for example, GSM, WCDMA, LTE, NR, WiFi, or Bluetooth wireless technologies. These wireless technologies may be integrated into the same or different chip or set of chips and other components within network node QQ160.

Processing circuitry QQ170 is configured to perform any determining, calculating, or similar operations (e.g., certain obtaining operations) described herein as being provided by a network node. These operations performed by processing circuitry QQ170 may include processing information obtained by processing circuitry QQ170 by, for example, converting the obtained information into other information, comparing the obtained information or converted information to information stored in the network node, and/or performing one or more operations based on the obtained information or converted information, and as a result of said processing making a determination.

Processing circuitry QQ170 may comprise a combination of one or more of a microprocessor, controller, microcontroller, central processing unit, digital signal processor, application-specific integrated circuit, field programmable gate array, or any other suitable computing device, resource, or combination of hardware, software and/or encoded logic operable to provide, either alone or in conjunction with other network node QQ160 components, such as device readable medium QQ180, network node QQ160 functionality. For example, processing circuitry QQ170 may execute instructions stored in device readable medium QQ180 or in memory within processing circuitry QQ170. Such functionality may include providing any of the various wireless features, functions, or benefits discussed herein. In some embodiments, processing circuitry QQ170 may include a system on a chip (SOC).

In some embodiments, processing circuitry QQ170 may include one or more of radio frequency (RF) transceiver circuitry QQ172 and baseband processing circuitry QQ174. In some embodiments, radio frequency (RF) transceiver circuitry QQ172 and baseband processing circuitry QQ174 may be on separate chips (or sets of chips), boards, or units, such as radio units and digital units. In alternative embodiments, part or all of RF transceiver circuitry QQ172 and baseband processing circuitry QQ174 may be on the same chip or set of chips, boards, or units In certain embodiments, some or all of the functionality described herein as being provided by a network node, base station, eNB or other such network device may be performed by processing circuitry QQ170 executing instructions stored on device readable medium QQ180 or memory within processing circuitry QQ170. In alternative embodiments, some or all of the functionality may be provided by processing circuitry QQ170 without executing instructions stored on a separate or discrete device readable medium, such as in a hard-wired manner. In any of those embodiments, whether executing instructions stored on a device readable storage medium or not, processing circuitry QQ170 can be configured to perform the described functionality. The benefits provided by such functionality are not limited to processing circuitry QQ170 alone or to other components of network node QQ160, but are enjoyed by network node QQ160 as a whole, and/or by end users and the wireless network generally.

Device readable medium QQ180 may comprise any form of volatile or non-volatile computer readable memory including, without limitation, persistent storage, solid-state memory, remotely mounted memory, magnetic media, optical media, random access memory (RAM), read-only memory (ROM), mass storage media (for example, a hard disk), removable storage media (for example, a flash drive, a Compact Disk (CD) or a Digital Video Disk (DVD)), and/or any other volatile or non-volatile, non-transitory device readable and/or computer-executable memory devices that store information, data, and/or instructions that may be used by processing circuitry QQ170. Device readable medium QQ180 may store any suitable instructions, data or information, including a computer program, software, an application including one or more of logic, rules, code, tables, etc. and/or other instructions capable of being executed by processing circuitry QQ170 and, utilized by network node QQ160. Device readable medium QQ180 may be used to store any calculations made by processing circuitry QQ170 and/or any data received via interface QQ190.

In some embodiments, processing circuitry QQ170 and device readable medium QQ180 may be considered to be integrated.

Interface QQ190 is used in the wired or wireless communication of signalling and/or data between network node QQ160, network QQ106, and/or WDs QQ110. As illustrated, interface QQ190 comprises port(s)/terminal(s) QQ194 to send and receive data, for example to and from network QQ106 over a wired connection. Interface QQ190 also includes radio front end circuitry QQ192 that may be coupled to, or in certain embodiments a part of, antenna QQ162. Radio front end circuitry QQ192 comprises filters QQ198 and amplifiers QQ196. Radio front end circuitry QQ192 may be connected to antenna QQ162 and processing circuitry QQ170. Radio front end circuitry may be configured to condition signals communicated between antenna QQ162 and processing circuitry QQ170. Radio front end circuitry QQ192 may receive digital data that is to be sent out to other network nodes or WDs via a wireless connection. Radio front end circuitry QQ192 may convert the digital data into a radio signal having the appropriate channel and bandwidth parameters using a combination of filters QQ198 and/or amplifiers QQ196. The radio signal may then be transmitted via antenna QQ162. Similarly, when receiving data, antenna QQ162 may collect radio signals which are then converted into digital data by radio front end circuitry QQ192. The digital data may be passed to processing circuitry QQ170. In other embodiments, the interface may comprise different components and/or different combinations of components.

In certain alternative embodiments, network node QQ160 may not include separate radio front end circuitry QQ192, instead, processing circuitry QQ170 may comprise radio front end circuitry and may be connected to antenna QQ162 without separate radio front end circuitry QQ192. Similarly, in some embodiments, all or some of RF transceiver circuitry QQ172 may be considered a part of interface QQ190. In still other embodiments, interface QQ190 may include one or more ports or terminals QQ194, radio front end circuitry QQ192, and RF transceiver circuitry QQ172, as part of a radio unit (not shown), and interface QQ190 may communicate with baseband processing circuitry QQ174, which is part of a digital unit (not shown).

Antenna QQ162 may include one or more antennas, or antenna arrays, configured to send and/or receive wireless signals. Antenna QQ162 may be coupled to radio front end circuitry QQ190 and may be any type of antenna capable of transmitting and receiving data and/or signals wirelessly. In some embodiments, antenna QQ162 may comprise one or more omni-directional, sector or panel antennas operable to transmit/receive radio signals between, for example, 2 GHz and 66 GHz. An omni-directional antenna may be used to transmit/receive radio signals in any direction, a sector antenna may be used to transmit/receive radio signals from devices within a particular area, and a panel antenna may be a line of sight antenna used to transmit/receive radio signals in a relatively straight line. In some instances, the use of more than one antenna may be referred to as MIMO. In certain embodiments, antenna QQ162 may be separate from network node QQ160 and may be connectable to network node QQ160 through an interface or port.

Antenna QQ162, interface QQ190, and/or processing circuitry QQ170 may be configured to perform any receiving operations and/or certain obtaining operations described herein as being performed by a network node. Any information, data and/or signals may be received from a wireless device, another network node and/or any other network equipment. Similarly, antenna QQ162, interface QQ190, and/or processing circuitry QQ170 may be configured to perform any transmitting operations described herein as being performed by a network node. Any information, data and/or signals may be transmitted to a wireless device, another network node and/or any other network equipment.

Power circuitry QQ187 may comprise, or be coupled to, power management circuitry and is configured to supply the components of network node QQ160 with power for performing the functionality described herein. Power circuitry QQ187 may receive power from power source QQ186. Power source QQ186 and/or power circuitry QQ187 may be configured to provide power to the various components of network node QQ160 in a form suitable for the respective components (e.g., at a voltage and current level needed for each respective component). Power source QQ186 may either be included in, or external to, power circuitry QQ187 and/or network node QQ160. For example, network node QQ160 may be connectable to an external power source (e.g., an electricity outlet) via an input circuitry or interface such as an electrical cable, whereby the external power source supplies power to power circuitry QQ187. As a further example, power source QQ186 may comprise a source of power in the form of a battery or battery pack which is connected to, or integrated in, power circuitry QQ187. The battery may provide backup power should the external power source fail. Other types of power sources, such as photovoltaic devices, may also be used.

Alternative embodiments of network node QQ160 may include additional components beyond those shown in FIG. 28 that may be responsible for providing certain aspects of the network node's functionality, including any of the functionality described herein and/or any functionality necessary to support the subject matter described herein. For example, network node QQ160 may include user interface equipment to allow input of information into network node QQ160 and to allow output of information from network node QQ160. This may allow a user to perform diagnostic, maintenance, repair, and other administrative functions for network node QQ160.

As used herein, wireless device (WD) refers to a device capable, configured, arranged and/or operable to communicate wirelessly with network nodes and/or other wireless devices. Unless otherwise noted, the term WD may be used interchangeably herein with user equipment (UE). Communicating wirelessly may involve transmitting and/or receiving wireless signals using electromagnetic waves, radio waves, infrared waves, and/or other types of signals suitable for conveying information through air. In some embodiments, a WD may be configured to transmit and/or receive information without direct human interaction. For instance, a WD may be designed to transmit information to a network on a predetermined schedule, when triggered by an internal or external event, or in response to requests from the network. Examples of a WD include, but are not limited to, a smart phone, a mobile phone, a cell phone, a voice over IP (VoIP) phone, a wireless local loop phone, a desktop computer, a personal digital assistant (PDA), a wireless cameras, a gaming console or device, a music storage device, a playback appliance, a wearable terminal device, a wireless endpoint, a mobile station, a tablet, a laptop, a laptop-embedded equipment (LEE), a laptop-mounted equipment (LME), a smart device, a wireless customer-premise equipment (CPE). a vehicle-mounted wireless terminal device, etc. A WD may support device-to-device (D2D) communication, for example by implementing a 3GPP standard for sidelink communication, and may in this case be referred to as a D2D communication device. As yet another specific example, in an Internet of Things (IoT) scenario, a WD may represent a machine or other device that performs monitoring and/or measurements, and transmits the results of such monitoring and/or measurements to another WD and/or a network node. The WD may in this case be a machine-to-machine (M2M) device, which may in a 3GPP context be referred to as a machine-type communication (MTC) device. As one particular example, the WD may be a UE implementing the 3GPP narrow band internet of things (NB-IoT) standard. Particular examples of such machines or devices are sensors, metering devices such as power meters, industrial machinery, or home or personal appliances (e.g. refrigerators, televisions, etc.) personal wearables (e.g., watches, fitness trackers, etc.). In other scenarios, a WD may represent a vehicle or other equipment that is capable of monitoring and/or reporting on its operational status or other functions associated with its operation. A WD as described above may represent the endpoint of a wireless connection, in which case the device may be referred to as a wireless terminal. Furthermore, a WD as described above may be mobile, in which case it may also be referred to as a mobile device or a mobile terminal.

As illustrated, wireless device QQ110 includes antenna QQ111, interface QQ114, processing circuitry QQ120, device readable medium QQ130, user interface equipment QQ132, auxiliary equipment QQ134, power source QQ136 and power circuitry QQ137. WD QQ110 may include multiple sets of one or more of the illustrated components for different wireless technologies supported by WD QQ110, such as, for example, GSM, WCDMA, LTE, NR, WiFi, WiMAX, or Bluetooth wireless technologies, just to mention a few. These wireless technologies may be integrated into the same or different chips or set of chips as other components within WD QQ110.

Antenna QQ111 may include one or more antennas or antenna arrays, configured to send and/or receive wireless signals, and is connected to interface QQ114. In certain alternative embodiments, antenna QQ111 may be separate from WD QQ110 and be connectable to WD QQ110 through an interface or port. Antenna QQ111, interface QQ114, and/or processing circuitry QQ120 may be configured to perform any receiving or transmitting operations described herein as being performed by a WD. Any information, data and/or signals may be received from a network node and/or another WD. In some embodiments, radio front end circuitry and/or antenna QQ111 may be considered an interface.

As illustrated, interface QQ114 comprises radio front end circuitry QQ112 and antenna QQ111. Radio front end circuitry QQ112 comprise one or more filters QQ118 and amplifiers QQ116. Radio front end circuitry QQ114 is connected to antenna QQ111 and processing circuitry QQ120, and is configured to condition signals communicated between antenna QQ111 and processing circuitry QQ120. Radio front end circuitry QQ112 may be coupled to or a part of antenna QQ111. In some embodiments, WD QQ110 may not include separate radio front end circuitry QQ112; rather, processing circuitry QQ120 may comprise radio front end circuitry and may be connected to antenna QQ111. Similarly, in some embodiments, some or all of RF transceiver circuitry QQ122 may be considered a part of interface QQ114. Radio front end circuitry QQ112 may receive digital data that is to be sent out to other network nodes or WDs via a wireless connection. Radio front end circuitry QQ112 may convert the digital data into a radio signal having the appropriate channel and bandwidth parameters using a combination of filters QQ118 and/or amplifiers QQ116. The radio signal may then be transmitted via antenna QQ111. Similarly, when receiving data, antenna QQ111 may collect radio signals which are then converted into digital data by radio front end circuitry QQ112. The digital data may be passed to processing circuitry QQ120. In other embodiments, the interface may comprise different components and/or different combinations of components.

Processing circuitry QQ120 may comprise a combination of one or more of a microprocessor, controller, microcontroller, central processing unit, digital signal processor, application-specific integrated circuit, field programmable gate array, or any other suitable computing device, resource, or combination of hardware, software, and/or encoded logic operable to provide, either alone or in conjunction with other WD QQ110 components, such as device readable medium QQ130, WD QQ110 functionality. Such functionality may include providing any of the various wireless features or benefits discussed herein. For example, processing circuitry QQ120 may execute instructions stored in device readable medium QQ130 or in memory within processing circuitry QQ120 to provide the functionality disclosed herein.

As illustrated, processing circuitry QQ120 includes one or more of RF transceiver circuitry QQ122, baseband processing circuitry QQ124, and application processing circuitry QQ126. In other embodiments, the processing circuitry may comprise different components and/or different combinations of components. In certain embodiments processing circuitry QQ120 of WD QQ110 may comprise a SOC. In some embodiments, RF transceiver circuitry QQ122, baseband processing circuitry QQ124, and application processing circuitry QQ126 may be on separate chips or sets of chips. In alternative embodiments, part or all of baseband processing circuitry QQ124 and application processing circuitry QQ126 may be combined into one chip or set of chips, and RF transceiver circuitry QQ122 may be on a separate chip or set of chips. In still alternative embodiments, part or all of RF transceiver circuitry QQ122 and baseband processing circuitry QQ124 may be on the same chip or set of chips, and application processing circuitry QQ126 may be on a separate chip or set of chips. In yet other alternative embodiments, part or all of RF transceiver circuitry QQ122, baseband processing circuitry QQ124, and application processing circuitry QQ126 may be combined in the same chip or set of chips. In some embodiments, RF transceiver circuitry QQ122 may be a part of interface QQ114. RF transceiver circuitry QQ122 may condition RF signals for processing circuitry QQ120.

In certain embodiments, some or all of the functionality described herein as being performed by a WD may be provided by processing circuitry QQ120 executing instructions stored on device readable medium QQ130, which in certain embodiments may be a computer-readable storage medium. In alternative embodiments, some or all of the functionality may be provided by processing circuitry QQ120 without executing instructions stored on a separate or discrete device readable storage medium, such as in a hard-wired manner. In any of those particular embodiments, whether executing instructions stored on a device readable storage medium or not, processing circuitry QQ120 can be configured to perform the described functionality. The benefits provided by such functionality are not limited to processing circuitry QQ120 alone or to other components of WD QQ110, but are enjoyed by WD QQ110 as a whole, and/or by end users and the wireless network generally.

Processing circuitry QQ120 may be configured to perform any determining, calculating, or similar operations (e.g., certain obtaining operations) described herein as being performed by a WD. These operations, as performed by processing circuitry QQ120, may include processing information obtained by processing circuitry QQ120 by, for example, converting the obtained information into other information, comparing the obtained information or converted information to information stored by WD QQ110, and/or performing one or more operations based on the obtained information or converted information, and as a result of said processing making a determination.

Device readable medium QQ130 may be operable to store a computer program, software, an application including one or more of logic, rules, code, tables, etc. and/or other instructions capable of being executed by processing circuitry QQ120. Device readable medium QQ130 may include computer memory (e.g., Random Access Memory (RAM) or Read Only Memory (ROM)), mass storage media (e.g., a hard disk), removable storage media (e.g., a Compact Disk (CD) or a Digital Video Disk (DVD)), and/or any other volatile or non-volatile, non-transitory device readable and/or computer executable memory devices that store information, data, and/or instructions that may be used by processing circuitry QQ120. In some embodiments, processing circuitry QQ120 and device readable medium QQ130 may be considered to be integrated.

User interface equipment QQ132 may provide components that allow for a human user to interact with WD QQ110. Such interaction may be of many forms, such as visual, audial, tactile, etc. User interface equipment QQ132 may be operable to produce output to the user and to allow the user to provide input to WD QQ110. The type of interaction may vary depending on the type of user interface equipment QQ132 installed in WD QQ110. For example, if WD QQ110 is a smart phone, the interaction may be via a touch screen; if WD QQ110 is a smart meter, the interaction may be through a screen that provides usage (e.g., the number of gallons used) or a speaker that provides an audible alert (e.g., if smoke is detected). User interface equipment QQ132 may include input interfaces, devices and circuits, and output interfaces, devices and circuits. User interface equipment QQ132 is configured to allow input of information into WD QQ110, and is connected to processing circuitry QQ120 to allow processing circuitry QQ120 to process the input information. User interface equipment QQ132 may include, for example, a microphone, a proximity or other sensor, keys/buttons, a touch display, one or more cameras, a USB port, or other input circuitry. User interface equipment QQ132 is also configured to allow output of information from WD QQ110, and to allow processing circuitry QQ120 to output information from WD QQ110. User interface equipment QQ132 may include, for example, a speaker, a display, vibrating circuitry, a USB port, a headphone interface, or other output circuitry. Using one or more input and output interfaces, devices, and circuits, of user interface equipment QQ132, WD QQ110 may communicate with end users and/or the wireless network, and allow them to benefit from the functionality described herein.

Auxiliary equipment QQ134 is operable to provide more specific functionality which may not be generally performed by WDs. This may comprise specialized sensors for doing measurements for various purposes, interfaces for additional types of communication such as wired communications etc. The inclusion and type of components of auxiliary equipment QQ134 may vary depending on the embodiment and/or scenario.

Power source QQ136 may, in some embodiments, be in the form of a battery or battery pack. Other types of power sources, such as an external power source (e.g., an electricity outlet), photovoltaic devices or power cells, may also be used. WD QQ110 may further comprise power circuitry QQ137 for delivering power from power source QQ136 to the various parts of WD QQ110 which need power from power source QQ136 to carry out any functionality described or indicated herein. Power circuitry QQ137 may in certain embodiments comprise power management circuitry. Power circuitry QQ137 may additionally or alternatively be operable to receive power from an external power source; in which case WD QQ110 may be connectable to the external power source (such as an electricity outlet) via input circuitry or an interface such as an electrical power cable. Power circuitry QQ137 may also in certain embodiments be operable to deliver power from an external power source to power source QQ136. This may be, for example, for the charging of power source QQ136. Power circuitry QQ137 may perform any formatting, converting, or other modification to the power from power source QQ136 to make the power suitable for the respective components of WD QQ110 to which power is supplied.

Figure 29:
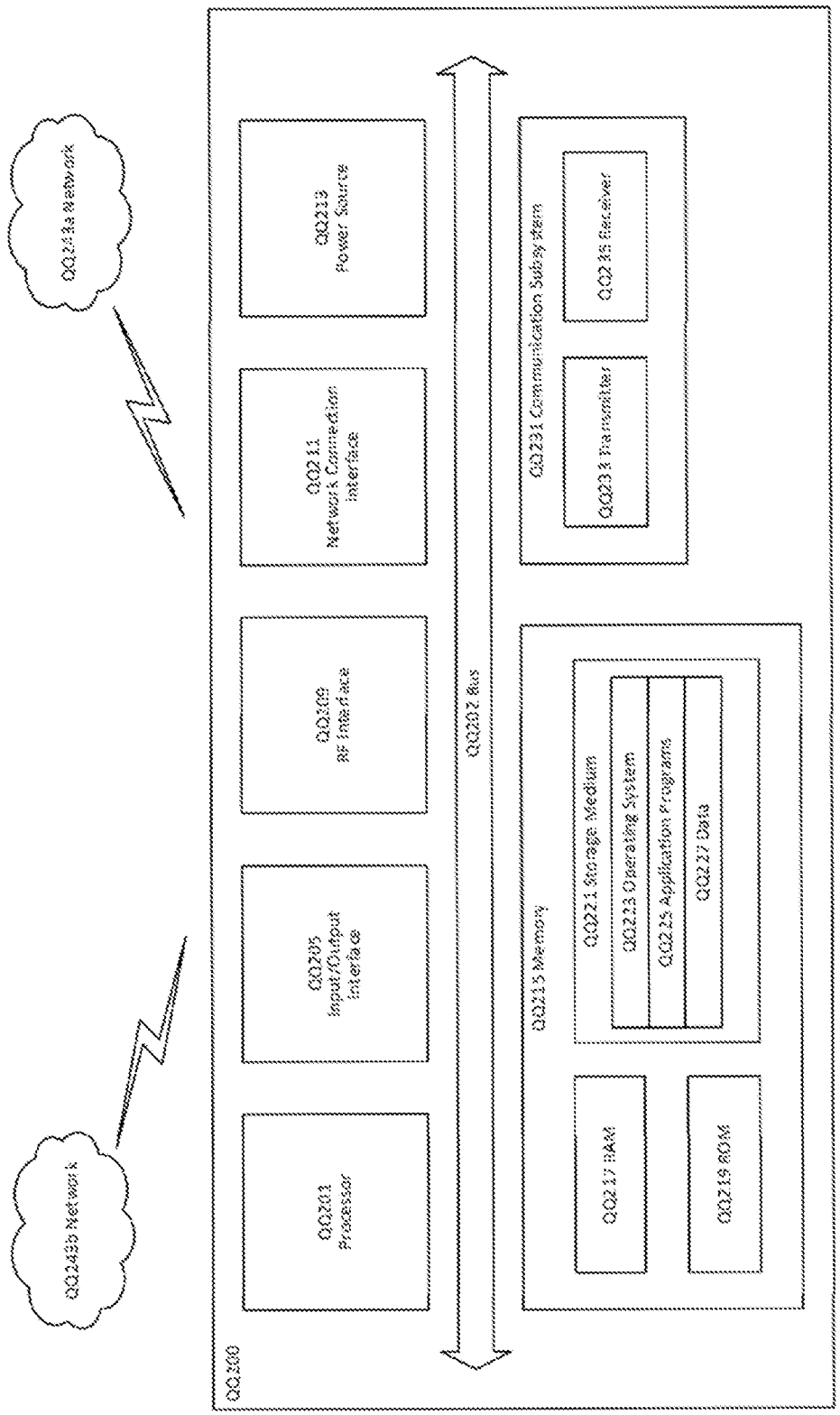
FIG. 29 is a schematic block diagram illustrating a UE.

FIG. 29 illustrates one embodiment of a UE in accordance with various aspects described herein. As used herein, a user equipment or UE may not necessarily have a user in the sense of a human user who owns and/or operates the relevant device. Instead, a UE may represent a device that is intended for sale to, or operation by, a human user but which may not, or which may not initially, be associated with a specific human user. A UE may also comprise any UE identified by the $3^{rd}$ Generation Partnership Project (3GPP), including a NB-IoT UE that is not intended for sale to, or operation by, a human user. UE QQ200, as illustrated in FIG. 29, is one example of a WD configured for communication in accordance with one or more communication standards promulgated by the $3^{rd}$ Generation Partnership Project (3GPP), such as 3GPP's GSM, UMTS, LTE, and/or 5G standards. As mentioned previously, the term WD and UE may be used interchangeable. Accordingly, although FIG. 29 is a UE, the components discussed herein are equally applicable to a WD, and vice-versa.

In FIG. 29, UE QQ200 includes processing circuitry QQ201 that is operatively coupled to input/output interface QQ205, radio frequency (RF) interface QQ209, network connection interface QQ211, memory QQ215 including random access memory (RAM) QQ217, read-only memory (ROM) QQ219, and storage medium QQ221 or the like, communication subsystem QQ231, power source QQ233, and/or any other component, or any combination thereof. Storage medium QQ221 includes operating system QQ223, application program QQ225, and data QQ227. In other embodiments, storage medium QQ221 may include other similar types of information. Certain UEs may utilize all of the components shown in FIG. 29, or only a subset of the components. The level of integration between the components may vary from one UE to another UE. Further, certain UEs may contain multiple instances of a component, such as multiple processors, memories, transceivers, transmitters, receivers, etc.

In FIG. 29, processing circuitry QQ201 may be configured to process computer instructions and data. Processing circuitry QQ201 may be configured to implement any sequential state machine operative to execute machine instructions stored as machine-readable computer programs in the memory, such as one or more hardware-implemented state machines (e.g., in discrete logic, FPGA, ASIC, etc.); programmable logic together with appropriate firmware; one or more stored program, general-purpose processors, such as a microprocessor or Digital Signal Processor (DSP), together with appropriate software; or any combination of the above. For example, the processing circuitry QQ201 may include two central processing units (CPUs). Data may be information in a form suitable for use by a computer.

In the depicted embodiment, input/output interface QQ205 may be configured to provide a communication interface to an input device, output device, or input and output device. UE QQ200 may be configured to use an output device via input/output interface QQ205. An output device may use the same type of interface port as an input device. For example, a USB port may be used to provide input to and output from UE QQ200. The output device may be a speaker, a sound card, a video card, a display, a monitor, a printer, an actuator, an emitter, a smartcard, another output device, or any combination thereof. UE QQ200 may be configured to use an input device via input/output interface QQ205 to allow a user to capture information into UE QQ200. The input device may include a touch-sensitive or presence-sensitive display, a camera (e.g., a digital camera, a digital video camera, a web camera, etc.), a microphone, a sensor, a mouse, a trackball, a directional pad, a trackpad, a scroll wheel, a smartcard, and the like. The presence-sensitive display may include a capacitive or resistive touch sensor to sense input from a user. A sensor may be, for instance, an accelerometer, a gyroscope, a tilt sensor, a force sensor, a magnetometer, an optical sensor, a proximity sensor, another like sensor, or any combination thereof. For example, the input device may be an accelerometer, a magnetometer, a digital camera, a microphone, and an optical sensor.

In FIG. 29, RF interface QQ209 may be configured to provide a communication interface to RF components such as a transmitter, a receiver, and an antenna. Network connection interface QQ211 may be configured to provide a communication interface to network QQ243a. Network QQ243a may encompass wired and/or wireless networks such as a local-area network (LAN), a wide-area network (WAN), a computer network, a wireless network, a telecommunications network, another like network or any combination thereof. For example, network QQ243a may comprise a Wi-Fi network. Network connection interface QQ211 may be configured to include a receiver and a transmitter interface used to communicate with one or more other devices over a communication network according to one or more communication protocols, such as Ethernet, TCP/IP, SONET, ATM, or the like. Network connection interface QQ211 may implement receiver and transmitter functionality appropriate to the communication network links (e.g., optical, electrical, and the like). The transmitter and receiver functions may share circuit components, software or firmware, or alternatively may be implemented separately.

RAM QQ217 may be configured to interface via bus QQ202 to processing circuitry QQ201 to provide storage or caching of data or computer instructions during the execution of software programs such as the operating system, application programs, and device drivers. ROM QQ219 may be configured to provide computer instructions or data to processing circuitry QQ201. For example, ROM QQ219 may be configured to store invariant low-level system code or data for basic system functions such as basic input and output (I/O), startup, or reception of keystrokes from a keyboard that are stored in a non-volatile memory. Storage medium QQ221 may be configured to include memory such as RAM, ROM, programmable read-only memory (PROM), erasable programmable read-only memory (EPROM), electrically erasable programmable read-only memory (EE-PROM), magnetic disks, optical disks, floppy disks, hard disks, removable cartridges, or flash drives. In one example, storage medium QQ221 may be configured to include operating system QQ223, application program QQ225 such as a web browser application, a widget or gadget engine or another application, and data file QQ227. Storage medium QQ221 may store, for use by UE QQ200, any of a variety of various operating systems or combinations of operating systems.

Storage medium QQ221 may be configured to include a number of physical drive units, such as redundant array of independent disks (RAID), floppy disk drive, flash memory, USB flash drive, external hard disk drive, thumb drive, pen drive, key drive, high-density digital versatile disc (HD-DVD) optical disc drive, internal hard disk drive, Blu-Ray optical disc drive, holographic digital data storage (HDDS) optical disc drive, external mini-dual in-line memory module (DIMM), synchronous dynamic random access memory (SDRAM), external micro-DIMM SDRAM, smartcard memory such as a subscriber identity module or a removable user identity (SIM/RUIM) module, other memory, or any combination thereof. Storage medium QQ221 may allow UE QQ200 to access computer-executable instructions, application programs or the like, stored on transitory or non-transitory memory media, to off-load data, or to upload data. An article of manufacture, such as one utilizing a communication system may be tangibly embodied in storage medium QQ221, which may comprise a device readable medium.

In FIG. 29, processing circuitry QQ201 may be configured to communicate with network QQ243b using communication subsystem QQ231. Network QQ243a and network QQ243b may be the same network or networks or different network or networks. Communication subsystem QQ231 may be configured to include one or more transceivers used to communicate with network QQ243b. For example, communication subsystem QQ231 may be configured to include one or more transceivers used to communicate with one or more remote transceivers of another device capable of wireless communication such as another WD, UE, or base station of a radio access network (RAN) according to one or more communication protocols, such as IEEE 802.QQ2, CDMA, WCDMA, GSM, LTE, UTRAN, WiMax, or the like. Each transceiver may include transmitter QQ233 and/or receiver QQ235 to implement transmitter or receiver functionality, respectively, appropriate to the RAN links (e.g., frequency allocations and the like). Further, transmitter QQ233 and receiver QQ235 of each transceiver may share circuit components, software or firmware, or alternatively may be implemented separately.

In the illustrated embodiment, the communication functions of communication subsystem QQ231 may include data communication, voice communication, multimedia communication, short-range communications such as Bluetooth, near-field communication, location-based communication such as the use of the global positioning system (GPS) to determine a location, another like communication function, or any combination thereof. For example, communication subsystem QQ231 may include cellular communication, Wi-Fi communication, Bluetooth communication, and GPS communication. Network QQ243b may encompass wired and/or wireless networks such as a local-area network (LAN), a wide-area network (WAN), a computer network, a wireless network, a telecommunications network, another like network or any combination thereof. For example, network QQ243b may be a cellular network, a Wi-Fi network, and/or a near-field network. Power source QQ213 may be configured to provide alternating current (AC) or direct current (DC) power to components of UE QQ200.

The features, benefits and/or functions described herein may be implemented in one of the components of UE QQ200 or partitioned across multiple components of UE QQ200. Further, the features, benefits, and/or functions described herein may be implemented in any combination of hardware, software or firmware. In one example, communication subsystem QQ231 may be configured to include any of the components described herein. Further, processing circuitry QQ201 may be configured to communicate with any of such components over bus QQ202. In another example, any of such components may be represented by program instructions stored in memory that when executed by processing circuitry QQ201 perform the corresponding functions described herein. In another example, the functionality of any of such components may be partitioned between processing circuitry QQ201 and communication subsystem QQ231. In another example, the non-computationally intensive functions of any of such components may be implemented in software or firmware and the computationally intensive functions may be implemented in hardware.

Figure 30:
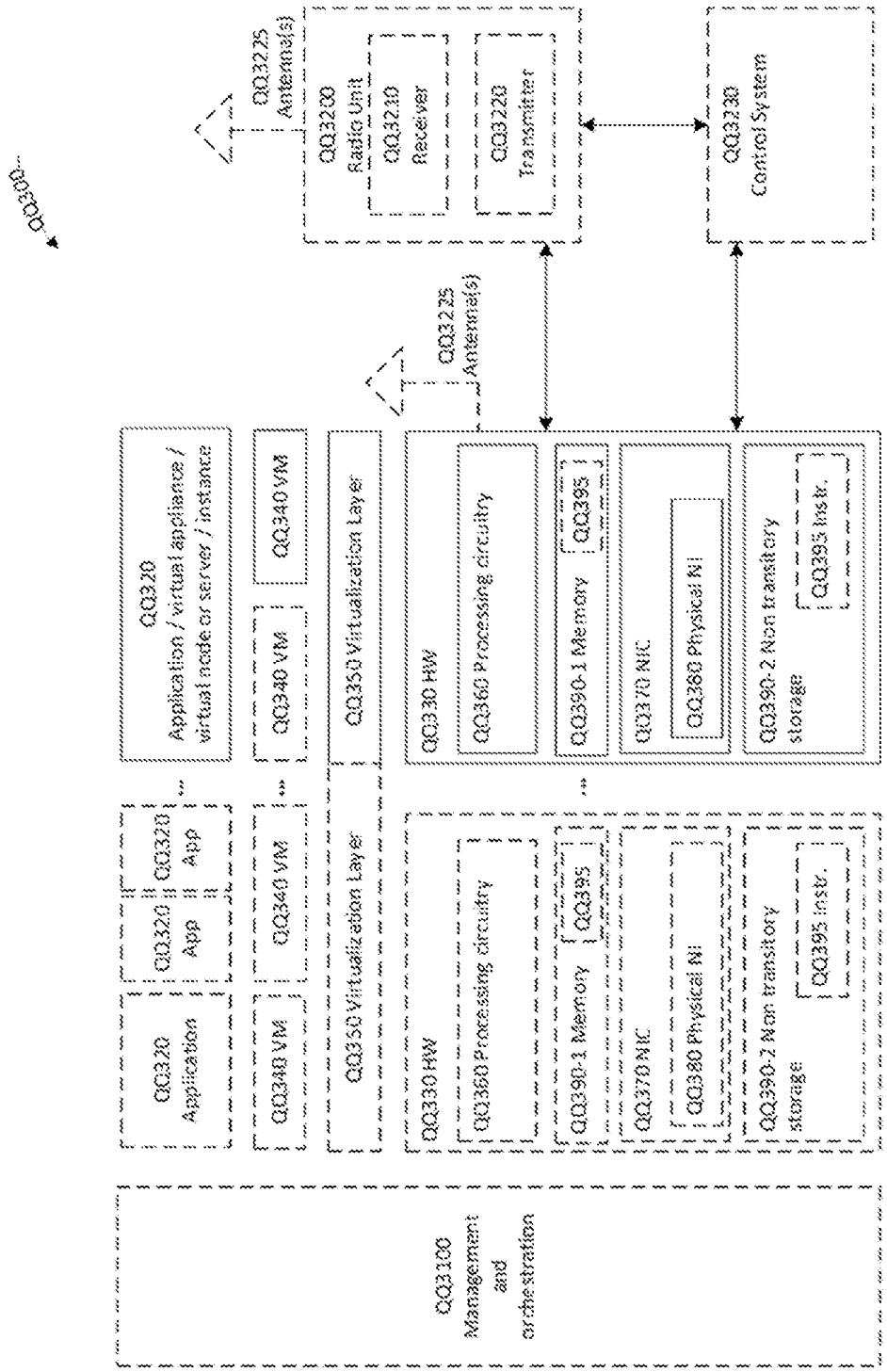
FIG. 30 is a schematic block diagram illustrating a virtualization environment.

FIG. 30 is a schematic block diagram illustrating a virtualization environment QQ300 in which functions implemented by some embodiments may be virtualized. In the present context, virtualizing means creating virtual versions of apparatuses or devices which may include virtualizing hardware platforms, storage devices and networking resources. As used herein, virtualization can be applied to a node (e.g., a virtualized base station or a virtualized radio access node) or to a device (e.g., a UE, a wireless device or any other type of communication device) or components thereof and relates to an implementation in which at least a portion of the functionality is implemented as one or more virtual components (e.g., via one or more applications, components, functions, virtual machines or containers executing on one or more physical processing nodes in one or more networks).

In some embodiments, some or all of the functions described herein may be implemented as virtual components executed by one or more virtual machines implemented in one or more virtual environments QQ300 hosted by one or more of hardware nodes QQ330. Further, in embodiments in which the virtual node is not a radio access node or does not require radio connectivity (e.g., a core network node), then the network node may be entirely virtualized.

The functions may be implemented by one or more applications QQ320 (which may alternatively be called software instances, virtual appliances, network functions, virtual nodes, virtual network functions, etc.) operative to implement some of the features, functions, and/or benefits of some of the embodiments disclosed herein. Applications QQ320 are run in virtualization environment QQ300 which provides hardware QQ330 comprising processing circuitry QQ360 and memory QQ390. Memory QQ390 contains instructions QQ395 executable by processing circuitry QQ360 whereby application QQ320 is operative to provide one or more of the features, benefits, and/or functions disclosed herein.

Virtualization environment QQ300, comprises general-purpose or special-purpose network hardware devices QQ330 comprising a set of one or more processors or processing circuitry QQ360, which may be commercial off-the-shelf (COTS) processors, dedicated Application Specific Integrated Circuits (ASICs), or any other type of processing circuitry including digital or analog hardware components or special purpose processors. Each hardware device may comprise memory QQ390-1 which may be non-persistent memory for temporarily storing instructions QQ395 or software executed by processing circuitry QQ360. Each hardware device may comprise one or more network interface controllers (NICs) QQ370, also known as network interface cards, which include physical network interface QQ380. Each hardware device may also include non-transitory, persistent, machine-readable storage media QQ390-2 having stored therein software QQ395 and/or instructions executable by processing circuitry QQ360. Software QQ395 may include any type of software including software for instantiating one or more virtualization layers QQ350 (also referred to as hypervisors), software to execute virtual machines QQ340 as well as software allowing it to execute functions, features and/or benefits described in relation with some embodiments described herein.

Virtual machines QQ340, comprise virtual processing, virtual memory, virtual networking or interface and virtual storage, and may be run by a corresponding virtualization layer QQ350 or hypervisor. Different embodiments of the instance of virtual appliance QQ320 may be implemented on one or more of virtual machines QQ340, and the implementations may be made in different ways.

During operation, processing circuitry QQ360 executes software QQ395 to instantiate the hypervisor or virtualization layer QQ350, which may sometimes be referred to as a virtual machine monitor (VMM). Virtualization layer QQ350 may present a virtual operating platform that appears like networking hardware to virtual machine QQ340.

As shown in FIG. 30, hardware QQ330 may be a stand-alone network node with generic or specific components. Hardware QQ330 may comprise antenna QQ3225 and may implement some functions via virtualization. Alternatively, hardware QQ330 may be part of a larger cluster of hardware (e.g. such as in a data center or customer premise equipment (CPE)) where many hardware nodes work together and are managed via management and orchestration (MANO) QQ3100, which, among others, oversees lifecycle management of applications QQ320.

Virtualization of the hardware is in some contexts referred to as network function virtualization (NFV). NFV may be used to consolidate many network equipment types onto industry standard high volume server hardware, physical switches, and physical storage, which can be located in data centers, and customer premise equipment.

In the context of NFV, virtual machine QQ340 may be a software implementation of a physical machine that runs programs as if they were executing on a physical, non-virtualized machine. Each of virtual machines QQ340, and that part of hardware QQ330 that executes that virtual machine, be it hardware dedicated to that virtual machine and/or hardware shared by that virtual machine with others of the virtual machines QQ340, forms a separate virtual network elements (VNE).

Still in the context of NFV, Virtual Network Function (VNF) is responsible for handling specific network functions that run in one or more virtual machines QQ340 on top of hardware networking infrastructure QQ330 and corresponds to application QQ320 in FIG. 30.

In some embodiments, one or more radio units QQ3200 that each include one or more transmitters QQ3220 and one or more receivers QQ3210 may be coupled to one or more antennas QQ3225. Radio units QQ3200 may communicate directly with hardware nodes QQ330 via one or more appropriate network interfaces and may be used in combination with the virtual components to provide a virtual node with radio capabilities, such as a radio access node or a base station.

In some embodiments, some signalling can be effected with the use of control system QQ3230 which may alternatively be used for communication between the hardware nodes QQ330 and radio units QQ3200.

Figure 31:
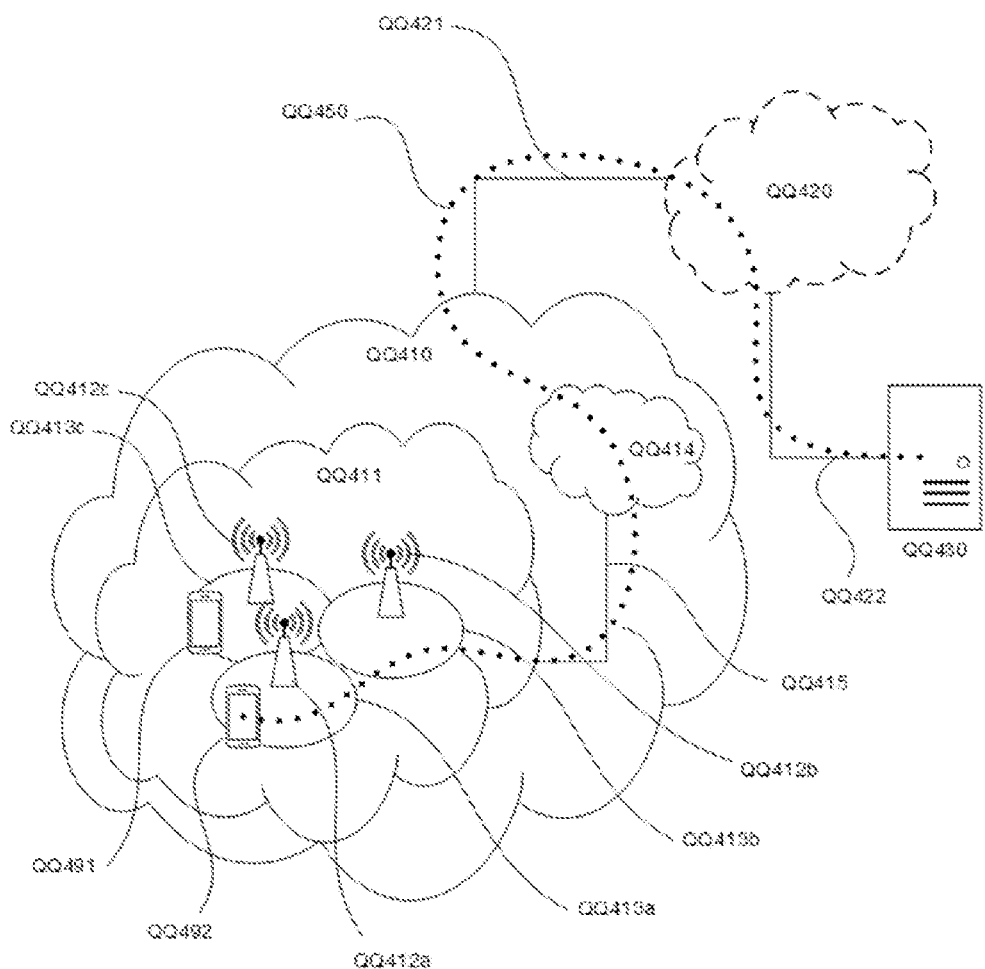
FIG. 31 is a schematic block diagram illustrating a telecommunication network connected via an intermediate network to a host computer.

FIG. 31 illustrates a telecommunication network connected via an intermediate network to a host computer in accordance with some embodiments. With reference to FIG. 31, in accordance with an embodiment, a communication system includes telecommunication network QQ410, such as a 3GPP-type cellular network, which comprises access network QQ411, such as a radio access network, and core network QQ414. Access network QQ411 comprises a plurality of base stations QQ412a, QQ412b, QQ412c, such as NBs, eNBs, gNBs or other types of wireless access points, each defining a corresponding coverage area QQ413a, QQ413b, QQ413c. Each base station QQ412a, QQ412b, QQ412c is connectable to core network QQ414 over a wired or wireless connection QQ415. A first UE QQ491 located in coverage area QQ413c is configured to wirelessly connect to, or be paged by, the corresponding base station QQ412c. A second UE QQ492 in coverage area QQ413a is wirelessly connectable to the corresponding base station QQ412a. While a plurality of UEs QQ491, QQ492 are illustrated in this example, the disclosed embodiments are equally applicable to a situation where a sole UE is in the coverage area or where a sole UE is connecting to the corresponding base station QQ412.

Telecommunication network QQ410 is itself connected to host computer QQ430, which may be embodied in the hardware and/or software of a standalone server, a cloud-implemented server, a distributed server or as processing resources in a server farm. Host computer QQ430 may be under the ownership or control of a service provider, or may be operated by the service provider or on behalf of the service provider. Connections QQ421 and QQ422 between telecommunication network QQ410 and host computer QQ430 may extend directly from core network QQ414 to host computer QQ430 or may go via an optional intermediate network QQ420. Intermediate network QQ420 may be one of, or a combination of more than one of, a public, private or hosted network; intermediate network QQ420, if any, may be a backbone network or the Internet; in particular, intermediate network QQ420 may comprise two or more sub-networks (not shown).

The communication system of FIG. 31 as a whole enables connectivity between the connected UEs QQ491, QQ492 and host computer QQ430. The connectivity may be described as an over-the-top (OTT) connection QQ450. Host computer QQ430 and the connected UEs QQ491, QQ492 are configured to communicate data and/or signaling via OTT connection QQ450, using access network QQ411, core network QQ414, any intermediate network QQ420 and possible further infrastructure (not shown) as intermediaries. OTT connection QQ450 may be transparent in the sense that the participating communication devices through which OTT connection QQ450 passes are unaware of routing of uplink and downlink communications. For example, base station QQ412 may not or need not be informed about the past routing of an incoming downlink communication with data originating from host computer QQ430 to be forwarded (e.g., handed over) to a connected UE QQ491. Similarly, base station QQ412 need not be aware of the future routing of an outgoing uplink communication originating from the UE QQ491 towards the host computer QQ430.

Figure 32:
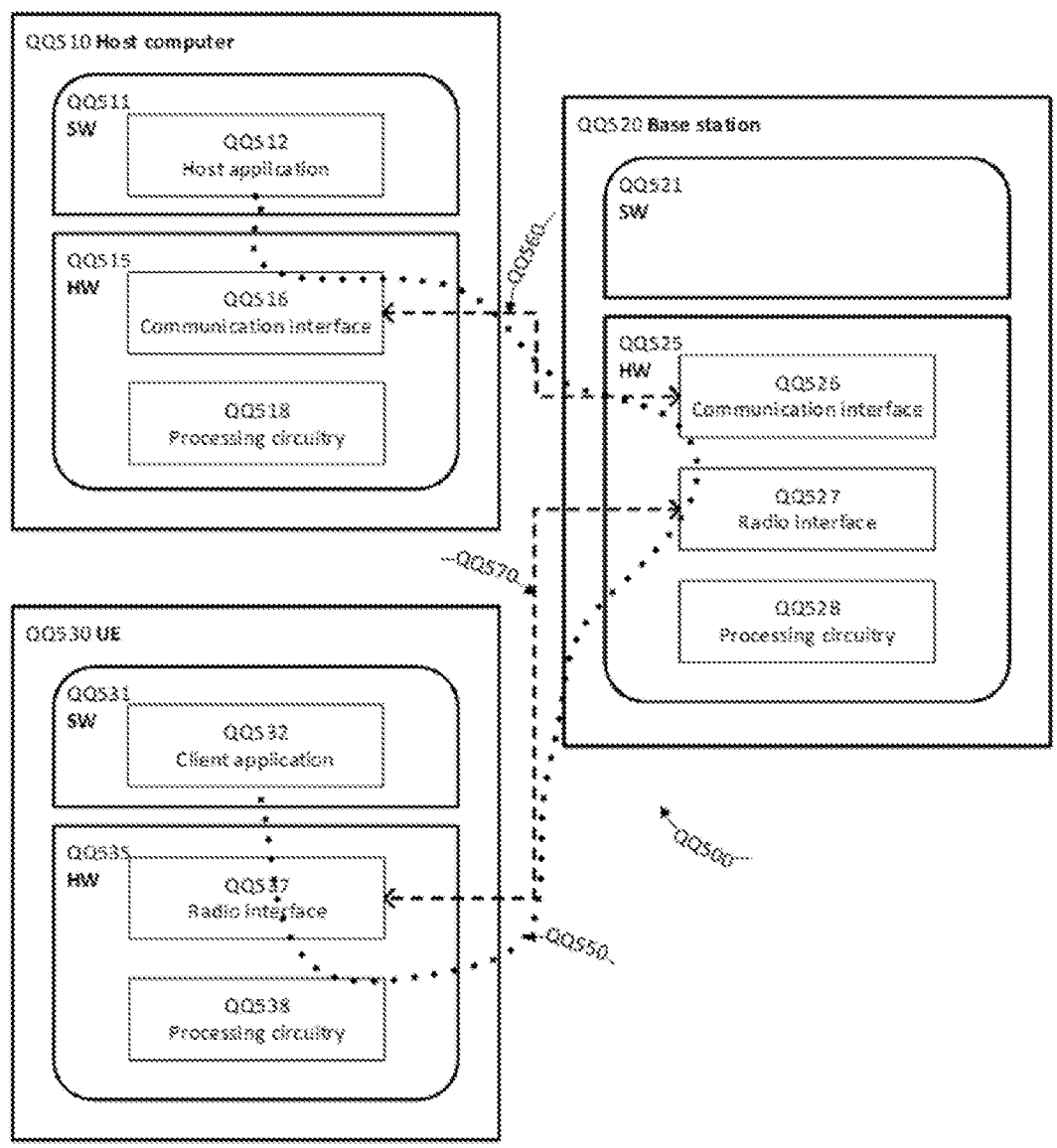
FIG. 32 is a schematic block diagram illustrating a host computer communicating via a base station with a user equipment over a partially wireless connection.

FIG. 32 illustrates a host computer communicating via a base station with a user equipment over a partially wireless connection in accordance with some embodiments. Example implementations, in accordance with an embodiment, of the UE, base station and host computer discussed in the preceding paragraphs will now be described with reference to FIG. 32. In communication system QQ500, host computer QQ510 comprises hardware QQ515 including communication interface QQ516 configured to set up and maintain a wired or wireless connection with an interface of a different communication device of communication system QQ500. Host computer QQ510 further comprises processing circuitry QQ518, which may have storage and/or processing capabilities. In particular, processing circuitry QQ518 may comprise one or more programmable processors, application-specific integrated circuits, field programmable gate arrays or combinations of these (not shown) adapted to execute instructions. Host computer QQ510 further comprises software QQ511, which is stored in or accessible by host computer QQ510 and executable by processing circuitry QQ518. Software QQ511 includes host application QQ512. Host application QQ512 may be operable to provide a service to a remote user, such as UE QQ530 connecting via OTT connection QQ550 terminating at UE QQ530 and host computer QQ510. In providing the service to the remote user, host application QQ512 may provide user data which is transmitted using OTT connection QQ550.

Communication system QQ500 further includes base station QQ520 provided in a telecommunication system and comprising hardware QQ525 enabling it to communicate with host computer QQ510 and with UE QQ530. Hardware QQ525 may include communication interface QQ526 for setting up and maintaining a wired or wireless connection with an interface of a different communication device of communication system QQ500, as well as radio interface QQ527 for setting up and maintaining at least wireless connection QQ570 with UE QQ530 located in a coverage area (not shown in FIG. 32) served by base station QQ520. Communication interface QQ526 may be configured to facilitate connection QQ560 to host computer QQ510. Connection QQ560 may be direct or it may pass through a core network (not shown in FIG. 32) of the telecommunication system and/or through one or more intermediate networks outside the telecommunication system. In the embodiment shown, hardware QQ525 of base station QQ520 further includes processing circuitry QQ528, which may comprise one or more programmable processors, application-specific integrated circuits, field programmable gate arrays or combinations of these (not shown) adapted to execute instructions. Base station QQ520 further has software QQ521 stored internally or accessible via an external connection.

Communication system QQ500 further includes UE QQ530 already referred to. Its hardware QQ535 may include radio interface QQ537 configured to set up and maintain wireless connection QQ570 with a base station serving a coverage area in which UE QQ530 is currently located. Hardware QQ535 of UE QQ530 further includes processing circuitry QQ538, which may comprise one or more programmable processors, application-specific integrated circuits, field programmable gate arrays or combinations of these (not shown) adapted to execute instructions. UE QQ530 further comprises software QQ531, which is stored in or accessible by UE QQ530 and executable by processing circuitry QQ538. Software QQ531 includes client application QQ532. Client application QQ532 may be operable to provide a service to a human or non-human user via UE QQ530, with the support of host computer QQ510. In host computer QQ510, an executing host application QQ512 may communicate with the executing client application QQ532 via OTT connection QQ550 terminating at UE QQ530 and host computer QQ510. In providing the service to the user, client application QQ532 may receive request data from host application QQ512 and provide user data in response to the request data. OTT connection QQ550 may transfer both the request data and the user data. Client application QQ532 may interact with the user to generate the user data that it provides.

It is noted that host computer QQ510, base station QQ520 and UE QQ530 illustrated in FIG. 32 may be similar or identical to host computer QQ430, one of base stations QQ412a, QQ412b, QQ412c and one of UEs QQ491, QQ492 of FIG. 31, respectively. This is to say, the inner workings of these entities may be as shown in FIG. 32 and independently, the surrounding network topology may be that of FIG. 31.

In FIG. 32, OTT connection QQ550 has been drawn abstractly to illustrate the communication between host computer QQ510 and UE QQ530 via base station QQ520, without explicit reference to any intermediary devices and the precise routing of messages via these devices. Network infrastructure may determine the routing, which it may be configured to hide from UE QQ530 or from the service provider operating host computer QQ510, or both. While OTT connection QQ550 is active, the network infrastructure may further take decisions by which it dynamically changes the routing (e.g., on the basis of load balancing consideration or reconfiguration of the network).

Wireless connection QQ570 between UE QQ530 and base station QQ520 is in accordance with the teachings of the embodiments described throughout this disclosure. One or more of the various embodiments improve the performance of OTT services provided to UE QQ530 using OTT connection QQ550, in which wireless connection QQ570 forms the last segment. More precisely, the teachings of these embodiments may improve the network performance and data accuracy, and thereby provide benefits such as better responsiveness and reduced user waiting time.

A measurement procedure may be provided for the purpose of monitoring data rate, latency and other factors on which the one or more embodiments improve. There may further be an optional network functionality for reconfiguring OTT connection QQ550 between host computer QQ510 and UE QQ530, in response to variations in the measurement results. The measurement procedure and/or the network functionality for reconfiguring OTT connection QQ550 may be implemented in software QQ511 and hardware QQ515 of host computer QQ510 or in software QQ531 and hardware QQ535 of UE QQ530, or both. In embodiments, sensors (not shown) may be deployed in or in association with communication devices through which OTT connection QQ550 passes; the sensors may participate in the measurement procedure by supplying values of the monitored quantities exemplified above, or supplying values of other physical quantities from which software QQ511, QQ531 may compute or estimate the monitored quantities. The reconfiguring of OTT connection QQ550 may include message format, retransmission settings, preferred routing etc.; the reconfiguring need not affect base station QQ520, and it may be unknown or imperceptible to base station QQ520. Such procedures and functionalities may be known and practiced in the art. In certain embodiments, measurements may involve proprietary UE signaling facilitating host computer QQ510's measurements of throughput, propagation times, latency and the like. The measurements may be implemented in that software QQ511 and QQ531 causes messages to be transmitted, in particular empty or 'dummy' messages, using OTT connection QQ550 while it monitors propagation times, errors etc.

Figure 33:
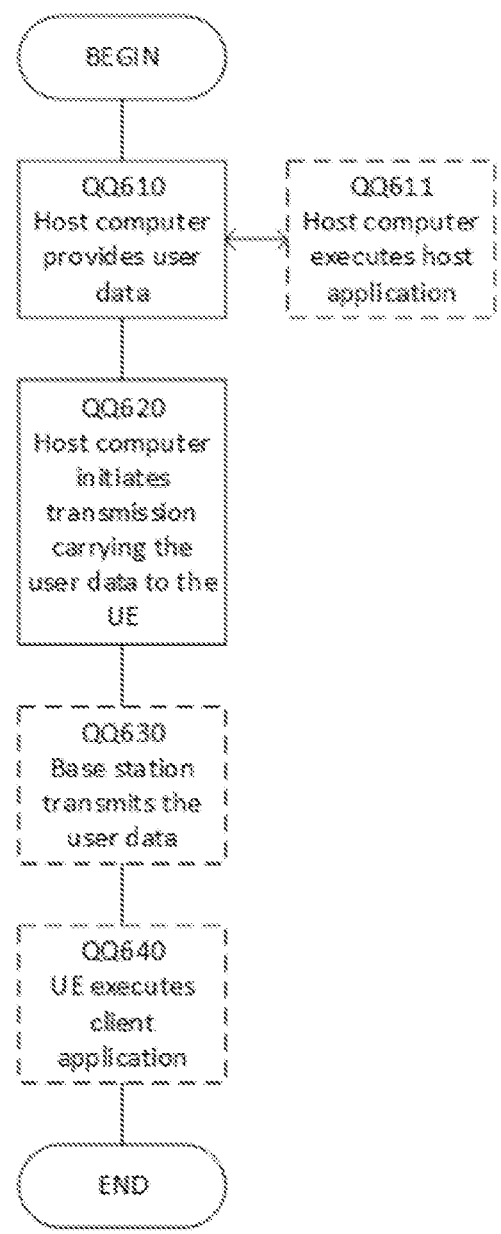
FIGS. 33 to 36 are flowcharts illustrating methods implemented in a communication system.

FIG. 33 is a flowchart illustrating a method implemented in a communication system including a host computer, a base station and a user equipment, in accordance with one embodiment. The communication system includes a host computer, a base station and a UE which may be those described with reference to FIGS. 31 and 32. For simplicity of the present disclosure, only drawing references to FIG. 33 will be included in this section. In step QQ610, the host computer provides user data. In substep QQ611 (which may be optional) of step QQ610, the host computer provides the user data by executing a host application. In step QQ620, the host computer initiates a transmission carrying the user data to the UE. In step QQ630 (which may be optional), the base station transmits to the UE the user data which was carried in the transmission that the host computer initiated, in accordance with the teachings of the embodiments described throughout this disclosure. In step QQ640 (which may also be optional), the UE executes a client application associated with the host application executed by the host computer.

Figure 34:
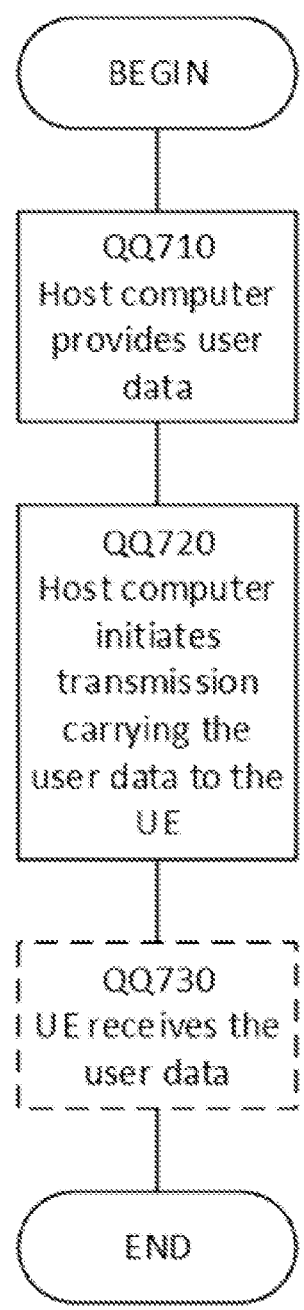

FIG. 34 is a flowchart illustrating a method implemented in a communication system including a host computer, a base station and a user equipment, in accordance with one embodiment. The communication system includes a host computer, a base station and a UE which may be those described with reference to FIGS. 31 and 32. For simplicity of the present disclosure, only drawing references to FIG. 34 will be included in this section. In step QQ710 of the method, the host computer provides user data. In an optional substep (not shown) the host computer provides the user data by executing a host application. In step QQ720, the host computer initiates a transmission carrying the user data to the UE. The transmission may pass via the base station, in accordance with the teachings of the embodiments described throughout this disclosure. In step QQ730 (which may be optional), the UE receives the user data carried in the transmission.

Figure 35:
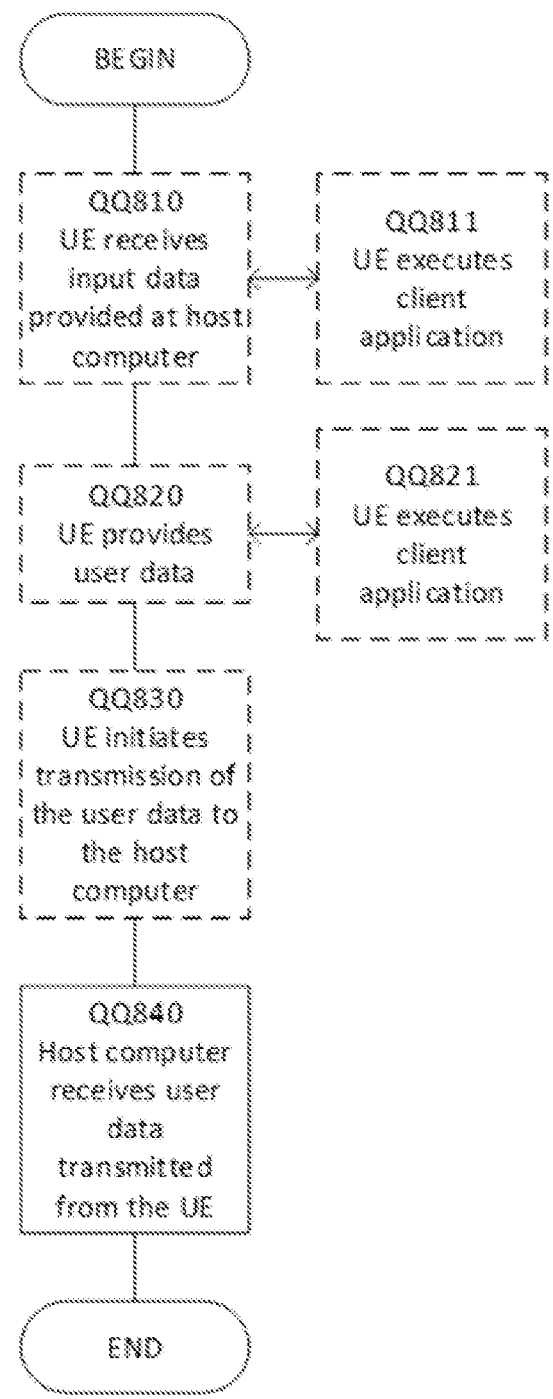

FIG. 35 is a flowchart illustrating a method implemented in a communication system including a host computer, a base station and a user equipment, in accordance with one embodiment. The communication system includes a host computer, a base station and a UE which may be those described with reference to FIGS. 31 and 32. For simplicity of the present disclosure, only drawing references to FIG. 35 will be included in this section. In step QQ810 (which may be optional), the UE receives input data provided by the host computer. Additionally or alternatively, in step QQ820, the UE provides user data. In substep QQ821 (which may be optional) of step QQ820, the UE provides the user data by executing a client application. In substep QQ811 (which may be optional) of step QQ810, the UE executes a client application which provides the user data in reaction to the received input data provided by the host computer. In providing the user data, the executed client application may further consider user input received from the user. Regardless of the specific manner in which the user data was provided, the UE initiates, in substep QQ830 (which may be optional), transmission of the user data to the host computer. In step QQ840 of the method, the host computer receives the user data transmitted from the UE, in accordance with the teachings of the embodiments described throughout this disclosure.

Figure 36:
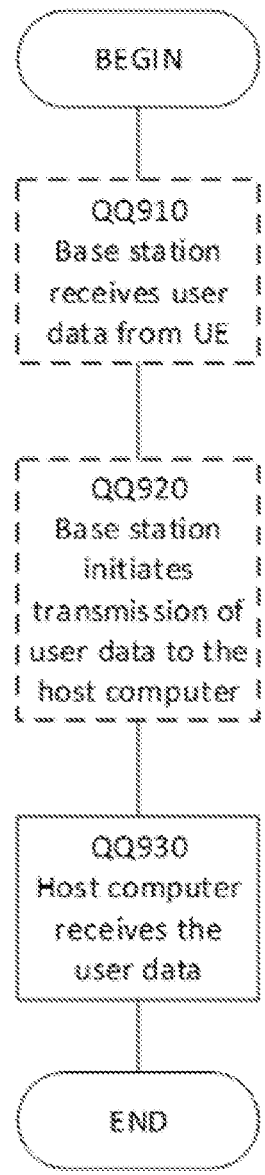

FIG. 36 is a flowchart illustrating a method implemented in a communication system including a host computer, a base station and a user equipment, in accordance with one embodiment. The communication system includes a host computer, a base station and a UE which may be those described with reference to FIGS. 31 and 32. For simplicity of the present disclosure, only drawing references to FIG. 36 will be included in this section. In step QQ910 (which may be optional), in accordance with the teachings of the embodiments described throughout this disclosure, the base station receives user data from the UE. In step QQ920 (which may be optional), the base station initiates transmission of the received user data to the host computer. In step QQ930 (which may be optional), the host computer receives the user data carried in the transmission initiated by the base station.

Any appropriate steps, methods, features, functions, or benefits disclosed herein may be performed through one or more functional units or modules of one or more virtual apparatuses. Each virtual apparatus may comprise a number of these functional units. These functional units may be implemented via processing circuitry, which may include one or more microprocessor or microcontrollers, as well as other digital hardware, which may include digital signal processors (DSPs), special-purpose digital logic, and the like. The processing circuitry may be configured to execute program code stored in memory, which may include one or several types of memory such as read-only memory (ROM), random-access memory (RAM), cache memory, flash memory devices, optical storage devices, etc. Program code stored in memory includes program instructions for executing one or more telecommunications and/or data communications protocols as well as instructions for carrying out one or more of the techniques described herein. In some implementations, the processing circuitry may be used to cause the respective functional unit to perform corresponding functions according to one or more embodiments of the present disclosure.

Additional Information

The following additional information discusses machine intelligence in FEC decoding and channel estimation, including using a neural network which may be trained and used for decoding according to examples of the present disclosure. The additional information discusses an example communication system and neural network as introduced above.

Analytical models and functional-block based structure for communications systems limit its end-to-end performance. Learning discriminative models for communication systems using data-driven approaches from Machine learning can improve performance. Machine Learning based algorithms can lead to reliability (low error-rate), generatility, low latency (low complexity), and energy efficiency in communication system design.

The proposed approach is to make use of already gained knowledge in the field of information theory and radio communication to design deep learning algorithms for specialized tasks. FEC decoding: Sum-Product Algorithm (SPA) over Factor graph of linear block codes. Phase estimation: Time-series prediction of phase errors in M-PSK modulated single carrier AWGN channel. Decoding by joint optimization over factor graph of channel parameters and code constraints.

Decoder Design—Introduction to Coding Theory, Factor Graphs and Decoding Algorithms)

FIG. 1 illustrates an AWGN channel model. $\xi(\cdot)$ is the encoding function and $\chi(\cdot)$ define the code constraints over elements of Linear Block Codes Over Binary Field F2

Code C(n, M) over binary field $F_2$ with length n and cardinality M, is a collection of M elements from $\mathbb{F}_2^n$, i.e. M codewords out of total $2^n$ possible codewords.

Rate of a Code C(n, M) is the ratio of amount of information bits per transmission symbol or codeword bits, i.e.

$$r = \frac{1}{n}\log_2 M$$

Hamming distance $d_H$ between two codewords u, v is the number of positions at which u differs from v.

Minimum distance $d_{min}$ of a Code C is the minimum hamming distance between any codewords u, v∈ $\mathcal{C}$, u≠v Maximum number of errors that can be corrected using a Code C is given by $$t \leq \left\lfloor \frac{d_{min}-1}{2} \right\rfloor$$

A linear block code C over $F_2$ is a closed set of all codewords defined under n-tuple addition, i.e. x-x'∈C, ∀X,x'∈ C.

The linear code of length n and dimensionality k, span over a subspace of $2^n$ using $2^k$ codewords. Linear codes are usually represented as C[n, k]

Generator matrix G∈ $\mathbb{F}^{k \times n}$ of a linear code C contains the k linearly independent rows of C.

Parity matrix H∈ $\mathbb{F}^{(n-k) \times n}$ forms the basis for the dual code $$C^\perp = \{v \in \mathbb{F}_2^n : xv^T = 0, \forall\, x \in C\}, \text{ such that } Hx^T = 0^T, \forall\, x \in C$$

$$\hat{Y}MAP = argmax_{\bar{y}:\bar{s}\in C}\, p(\bar{y}\mid \bar{r}) = \qquad (1)$$

$$argmax_{\bar{y}:H\bar{s}^T=0^T}\, p(\bar{r}\mid \bar{y})p(\bar{y}) = argmax_{\bar{y}\in\{\pm1\}^n}\left(\prod_{i=1}^n p(r_i\mid y_i)p(y_i)\right)1_{\bar{s}\in C}$$

$$\hat{Y}ML = argmax_{\bar{y}:\bar{s}\in C}\, p(\bar{r}\mid \bar{y})argmax_{\bar{y}:H\bar{s}^T=0^T}\, p(\bar{r}\mid \bar{y}) = \qquad (2)$$

$$argmax_{\bar{y}\in\{\pm1\}^n}\left(\prod_{i=1}^n p(r_i\mid y_i)\right)1_{\bar{s}\in C}$$

where 1f is an indicator function which is 1 if f is true, 0 otherwise. Here we assume the channel to be memoryless.

In order to find the optimal codeword $\bar{y}$, one has to look into all possible $\bar{s}\in \mathbb{F}_2^k$ codewords to find a codeword that satisfies equation 2. ML decoding problem is NP-Complete. Complexity of ML decoding code C[n, k] is given by:

$$\frac{c}{k} 2^{min(n-k,k)}$$

where c is an implementation dependent constant. ML decoding complexity is exponential in n. Iterative Decoding methods provide sub-optimal approach for decoding with low complexity.

Factor Graphs

Factor graphs provide a systematic method to apply distributive law (ab+ac=a(b+c)) to reduce computational complexity of marginalization over multivariate functions. For example consider function $f$ with factorization f (x1, x2, x3, x4, x5)=$f$1(x1, x5) $f$2(x1, x4) $f$3(x2, x3, x4) $f$4(x4)

$f$(x1) can be computed by marginalizing other variables.

$$f(x_1) = \sum_{\sim x_1} f(x_1, x_2, x_3, x_4) = \quad (3)$$

$$\underbrace{\sum_{\sim x_1} f_1(x_1, x_5) f_2(x_1, x_4) f_3(x_2, x_3, x_4) f_4(x_4)}_{\text{marginal of products}} =$$

$$\underbrace{\left[\sum_{x_5} f_1(x_1, x_5)\right] \left[\sum_{x_4} f_2(x_1, x_4) f_4(x_4) \left(\sum_{x_2, x_3} f_3(x_2, x_3, x_4)\right)\right]}_{\text{product of marginals}}$$

where ~x1 denotes the set containing all xi except x1.

Figure 37:
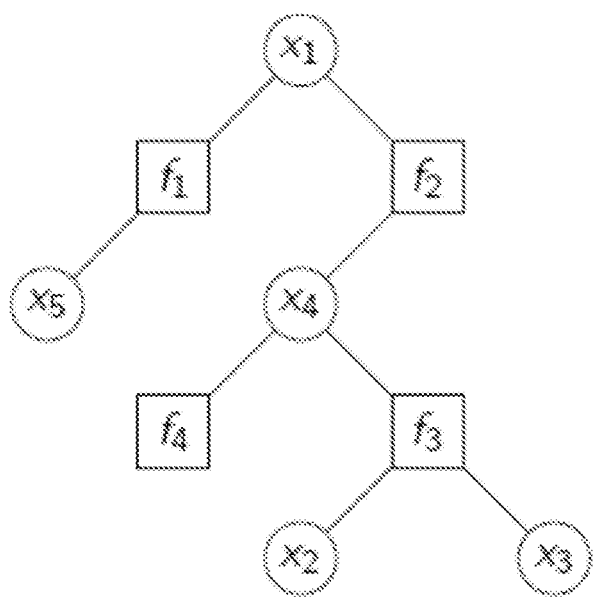
FIG. 37 is a factor graph of a function.

FIG. 37 illustrates a factor graph of function ƒ(x1, x2, x3, x4, x5).

Factor graph is a bipartite graph, where variables and their functions can be stacked into two columns of connected nodes.

Figure 38:
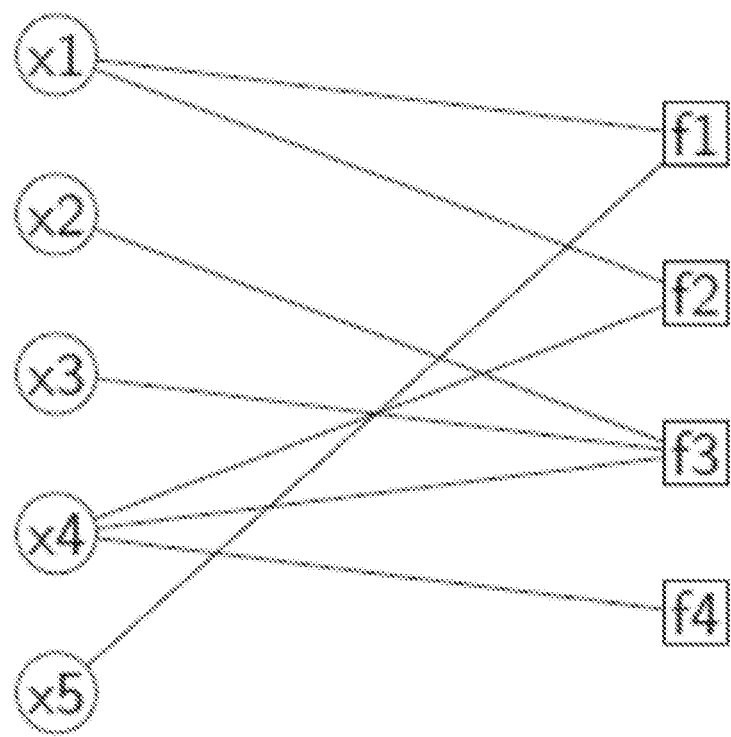
FIG. 38 is a bipartite graph representation of the function of FIG. 37.

FIG. 38 illustrates a bitrate graph representation of ƒ.

Marginalisation via Message Passing

Message passing algorithm on factor graphs works by sending messages (functions of X), along the edges of the graph. Messages represent marginals of parts of the function, and these parts are combined to form the marginal of the whole function.

Message from variable (x) to local function (ƒ), $$\mu_{x \to f}(x) = \prod_{h \in n(x) \setminus \{f\}} \mu_{h \to x}(x)$$

Message from local function (ƒ) to variable (x), $$\mu_{f \to x}(x) = \sum_{\sim \{x\}} \left( f(X) \prod_{y \in n(f) \setminus \{x\}} \mu_{y \to f}(y) \right)$$

Figure 39:
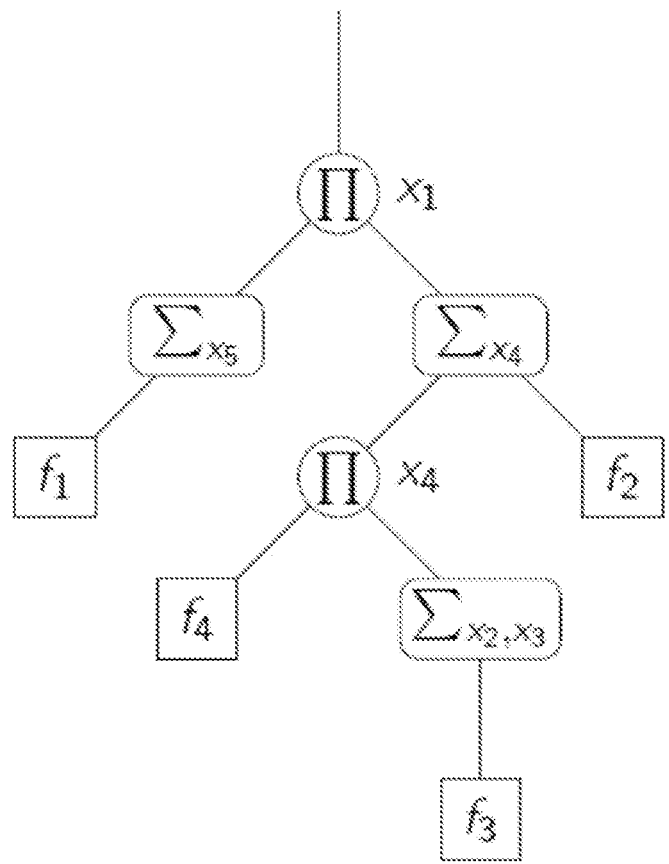
FIG. 39 is a factor graph of a function.

FIG. 39 illustrates a factor graph of function ƒ(x1, x2, x3, x4, x5).

Bipartite or Tanner graph of code is determined by parity check matrix $H_{[n-k,n]}$ with n–k check nodes and n variable nodes. A variable node vi is connected with a check node cj if H[i,j]=1. Variable node v send messages as the Likelihood Ratio given by, $$\gamma_v = \ln \frac{p(r_v \mid y_v = +1)}{p(r_v \mid y_v = -1)}, \forall v \in \mathbb{V} \quad (4)$$

where ln is log with base e, introduced to get simplified expressions in terms of sums rather than product. A Check node c calculates belief for a connected variable node v by marginalizing over all variable nodes connected to c except v.

$$\eta_{v,c} = \sum_{v' \in V_c/v} f_c(\mathcal{V}_c) \prod_{v' \in V_c/v} \mu_{v' \to c}(v') = \quad (5)$$

$$2 \tanh^{-1} \prod_{v' \in V_c/v} \tanh\left(\frac{\gamma(v', c)}{2}\right)$$

where second expression is obtained for $\mu_{v \to c}(v) = \gamma_{v'}$ and simplified using expression $$\tanh(x) = \frac{1 - e^{-x}}{1 + e^{-x}}.$$

The variable node v adds up the LLR values received from all c∈$C_v$ and the LLR value initially set from the received signal. In further iterations, LLR values sent by v to c will not contain LLR value that c calculated for v in the previous step.

$$\gamma_v = LLR_v + \sum_{c' \in C_v/v} \eta_{v,c'} \quad (6)$$

FIG. 2 illustrates the Tanner graph of the parity check matrix of the illustrated hamming (7, 4) code.

Tanner Graphs with Cycles

Limitation of Cycle-Free Codes

Any binary linear code C[n, k] of rate r that has cycle free tanner graph, consists of at least $$\frac{2r-1}{2}n$$

codewords with hamming weight 2. Low hamming weight leads to small $d_{min}$, and hence poor performing codes since number of correctable bits t∝$d_{min}$. SPA for Tanner graphs with cycles SPA does not perform MAP-decoding for Tanner graphs with cycles. However, although sub-optimal, SPA gives excellent performance of certain family of codes such as LDPC codes, which are designed in away to reduce cycles with small girth. The iterative nature of SPA algorithm increases the latency of the decoder. For codes with many small girth cycles such as BCH or polar codes, SPA performs poorly.

Figure 40:
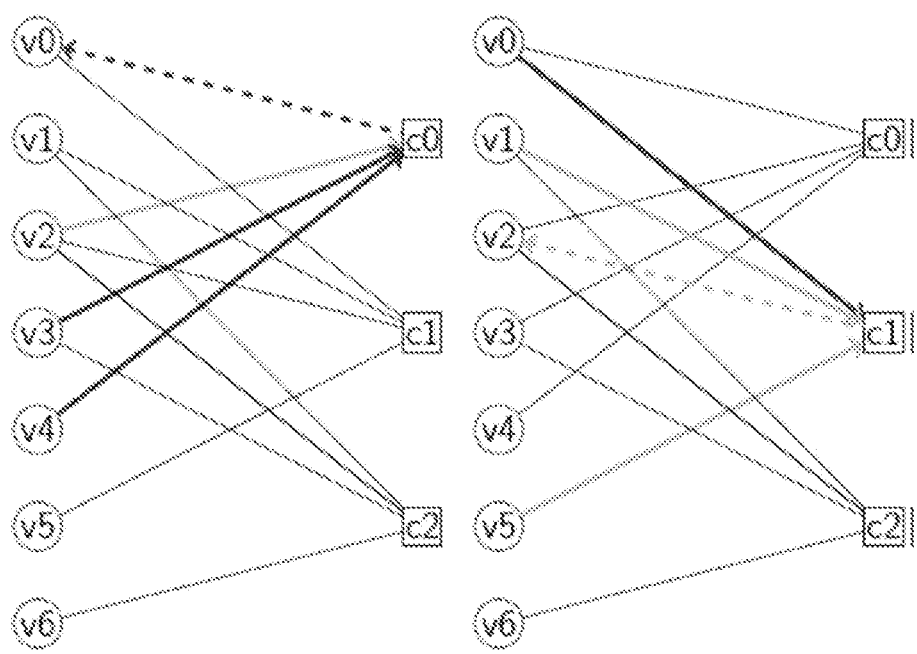
FIG. 40 illustrates SPA over a Tanner graph with no cycles.

FIG. 40 illustrates SPA over Tanner graph with cycles. Nodes v0 and v2 form a cycle with c0 and c1. The information received by node v0 contains information of v2, and in next iteration, v2 will receive its own information back from v0. There will be no exact expression for marginalization of v0 or v2.

Related work to the present discussion includes iterative decoding of using SPA: Soft iterative decoding of binary linear code (Hagenauer et. al., Iterative decoding of binary block and convolutional codes, 1996), and Computing approximate marginals in graphs with cycles by reparametrization to obtain alternative tree structure (Wainwright et. al., Tree-based reparameterization framework for analysis of sum-product and related algorithms, 2003). Further related work includes Decoding of structured codes using machine learning: Learning structure of linear codes using a deep neural network (Nachmani et. al., Learning to Decode Linear Codes Using Deep Learning, 2016), and Using the code structure to design deep neural network for implementing SPA (Gruber et. al., On Deep Learning-Based Channel Decoding, 2017).

The present disclosure provides contributions in the analysis of deep learning methods for decoding linear block codes, implementation of Sum Product Algorithm over Neural networks and analysis of hyper-parameters used in training Neural networks based decoding algorithm.

Sum Product Algorithm Over Edges

Consider an unrolled version of a tanner graph, unrolled 2L times corresponding to L iterations of SPA. Message $x_{i,e}$ is passed on an edge e=(v, c) connecting a variable node v to check node c in ith, i=1, 2, . . . , 2L layer of unrolled version of the graph. Initially variable node v will pass LLR values (cf. (4)). For odd values of i, (cf. 6), $$X_{i,e=(v,c)} = LLR_v + \sum_{\substack{e'=(v,c') \\ \forall c' \in \mathbb{C}_v/v}} X_{i-1,e'} \quad (8)$$

For even values of i, (cf. 5), $$X_{i,e=(c,v)} = 2\tanh^{-1} \prod_{\substack{e'=(c,v') \\ \forall v' \in v_c/v}} \tanh\left(\frac{X_{i-1,e=(c,v')}}{2}\right) \quad (9)$$

Final output at layer 2L is obtained by adding up all the messages reaching v, $$O_v = LLR_v + \sum_{e'=c',v} X_{2L,e'} \quad (10)$$

Figure 41:
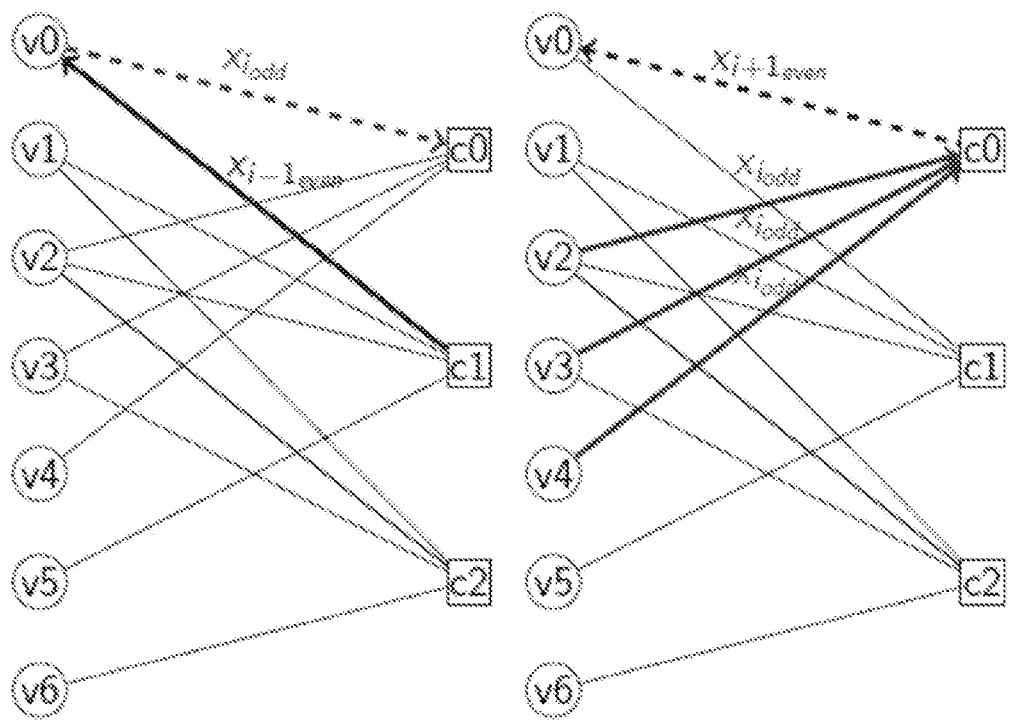
FIG. 41 illustrates SPA over a Tanner graph.

FIG. 41 illustrates SPA over the edges of Tanner graph. At any ith (odd) iterations, information sent on edge e=(v0; c0) (shown in dashed line on left of Figure) is calculated from the information coming from all the edges incident on v0 (shown in bold on left of Figure) using equation 8. In next iteration, when i is even, information sent on edge e=(c0; v0) (shown in dashed on right of Figure).

Equations 8, 9, 10 can be re-written in order to include weights that can be learned by neural networks. At first layer we perform eq. 8 and 9, in one step $$X_{0,e=(c,v)} = 2\tanh^{-1}\left(\prod_{e'=(c,v'),v' \neq v} \tanh\frac{1}{2}LLR_{v'}\right) \quad (11)$$

At any odd layer i, $$x_{i,e=(v,c)} = \tanh\frac{1}{2}\left(W_{i,v}LLR_v + \sum_{e'=(v,c'),c' \neq v} W_{i,e,e'} X_{i-1,e'}\right) \quad (12)$$

At any even layer i, $$X_{i,e=(c,v)} = 2\tanh^{-1}\left(\prod_{e'=(c,v'),v' \neq v} X_{i-1,e'}\right) \quad (13)$$

At the last layer, $$o_v = \sigma\left(W_{2L+1,v}LLR_v + \sum_{e'=(v,c')} W_{2L+1,v,e'} X_{2L,e'}\right) \quad (14)$$

where $\sigma=(1+e^{-x})^{-1}$ is a sigmoid function that is added to get the output of the network as probability of bit. Learn-able weights are: $W_{i,v}$, $W_{i,e,e'}$, $W_{2L+1,v}$ and $W_{2L+1,v,e'}$.

FIG. 3 illustrates Neural network decoder architecture for hamming (7,4) code given in FIG. 2, with 9 hidden layers corresponding to 5 full iterations of SPA algorithm. The first hidden layer, shown in green, applies operations of odd and even layers at a single node (cf. (11)). The hidden layers shown in red are odd hidden layers (cf. (12)), and shown in blue are even hidden layers (cf. (13)). The bold black rectangles beside the odd hidden layer nodes represent the input LLRs.

Network Parameters

Loss Function:

Cross entropy loss (output of last layer):

$$\text{Loss} = -\frac{1}{N}\sum_{v=1}^{N} t_v \log(O_v) + (1-t_v)\log(1-o_v) \quad (15)$$

where $t_v \in \{0, 1\}$, v=[1, . . . , N] is the target bit value, and $o_v \in (0, 1]$ is probability output by the networks last layer.

Cross entropy multi-loss (sum of losses from outputs at every even layer):

$$\text{Loss} = -\frac{1}{N}\sum_{i=1}^{2L-1}\sum_{v=1}^{N} t_v \log(O_{i,v}) + (1-t_v)\log(1-o_{i,v}) \quad (16)$$

where $o_{i,v}$, i=[1, 3, . . . , 2L-1] is the output at odd layer i, calculated from $x_{i,e}$ using $$o_{i,v} = \sigma\left(\sum_{e=(v,c)} X_{i,e}\right) \quad (17)$$

Cross entropy loss function with syndrome check:

$$\text{Loss} = -\frac{1}{N}\sum_{v=1}^{N} 1_{\{\hat{o}_{i,v} \times H^T = 0^T\}}(t_v \log(o_{i,v}) + (1-t_v)\log(1-o_{i,v})) \quad (18)$$

where $\hat{o}_{i,v}$ is the hard decision vector at ith layer.

Optimizer: Stochastic Gradient descent optimizer with adaptive learning rate: RMS-Prop optimizer, learning rate: 0.001

Network Architecture

Feed forward: Train weights at each iteration separately

Recurrent neural network: Train over same weights at every iteration

Training Inputs and Targets

Zero codeword: Performance of SPA depends only on the error patterns in the received bits, but is independent of their actual values.

The inputs to the network are LLR values calculated for AWGN channel with BPSK modulation, i.e.

$$LLR = -\frac{2y}{\sigma_n^2}.$$

Output is the probability of each bit, compared with the target value of that bit, using Loss functions.
Number of SPA iterations (2L)
Number of weights to learn per iteration ∝ number of edges x number of iterations.
Weight Initialization
Fixed weight initialization: weight=1.0 for connected edges
Random weight initialization: Random normal weight initialization over connected edges
Training Set SNR
SNR of the noisy channel inflicts random error patterns in the training input. Extreme values of SNR will lead to too many or too few errors, hence restricting the network to learn error patterns from the structure in the code. Training data can be created using:
1) Fixed SNR,
2) Range of SNR,
3) Decreasing or increasing SNR for entire training.
Tested range of SNR values: [−2; 6)
Regularization:
LLR values are clipped at input and even layers to be in a range [−20; 20]. This is necessary to keep the numerical values within the computational limits. Adding weight regularization to loss function will keep the data from over-fitting the model.
L1 regularization: Push weights towards zeros, leads to sparsity.
L2 regularization: Keep numerical value of weights close to zero.
Weight decay coefficient: Multiplicative factor that influences the regularization intensity.
The normalized validation score is calculated for a training SNR value ρt by averaging over the ratio of BER for Neural Network Decoder (NND) and SPA, evaluated at range of test SNR values ρv using the network trained at SNR ρt.

$$NVS(\rho_t) = \frac{1}{S}\sum_{v=1}^{S}\frac{BER_{NND}(\rho_t, \rho_v)}{BER_{SPA}(\rho_v)} \quad (19)$$

Figure 42:
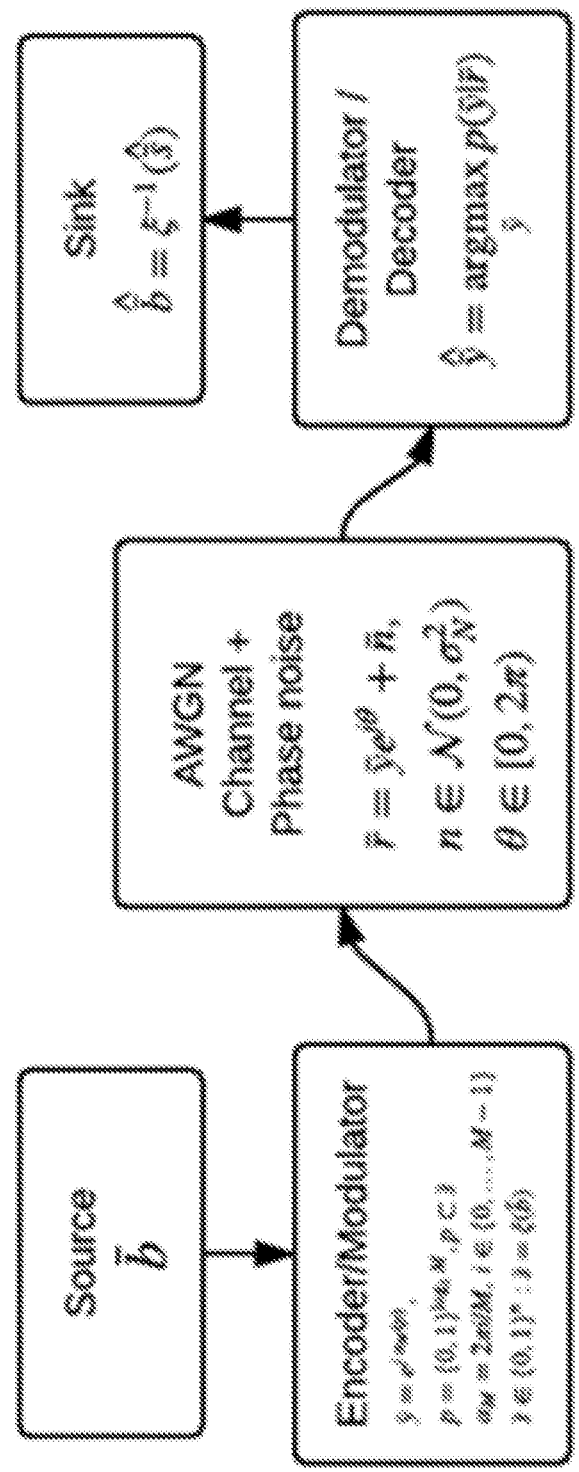
FIG. 42 illustrates a system model.

FIG. 13 illustrates comparison of SNR values for training (Polar [32,16]).
FIG. 14, FIG. 14 is a graph illustrating a comparison of performance according to different parameter settings.
FIGS. 21 to 27 as discussed above illustrate results which may be achieved according to examples of the present disclosure.
Conclusions
Neural networks are capable of learning from the structure of the linear block codes. Performance is improved by reducing the effects of Tanner graph artefacts such as cycles or trapping sets by learning to introduce complimentary weights over edges. Various parameters affect training and test performance. These parameters maybe different for different family of codes.
Future Work
Hyper-parameter optimization: Find best set of parameters for different family of codes. Performance of neural network decoder in more realistic channels with multipath fading and phase noise.
Channel Synchronisation
Motivation
Deep learning algorithms can learn and track time-varying patterns in communication channel. Phase error synchronization is critical in systems working at high frequency. Joining channel synchronizer and decoder into single block can improve performance.
Approach
Deep learning algorithms for channel synchronization. Code-aided carrier-phase estimation or code-aided channel estimation in general. Analyse different methods for joint optimization in presence of continuous and discrete random variables
FIG. 42 illustrates a system model. The phase noise $e^{j\theta}$ is added due noise in the oscillators. Phase noise in oscillators is an accumulator process, which can be modelled as Random walk, i.e. $\theta_t=(\theta_{t-1}+w_k) \mod 2\pi$, $w_k \sim N(0, \sigma^2_w)$. In a single carrier system, the phase noise leads to arbitrary rotation of complex symbol by θ, which leads to error is decoding the symbol. We use non-offset M-PSK modulation scheme.
Phase Error: Theoretical Model
Oscillator output is typically perturbed by short and long term instabilities. Phase noise from oscillators can be classified as Shot noise (S(f)=2ql), Thermal noise (S(f)=4 kT/R) and Flicker noise (S(f)∝1/f).
Simplified heuristic models of phase noise.

Constant phase model $\theta_t=\theta_0$ (21)

where $\theta_0 \in [0, 2\pi)$.

Random walk phase model $\theta_t=(\theta_{t-1}+w_k) \mod 2\pi$ (22)

where $w_k \sim N(0, \sigma w^2)$.

$$p(b_i|\bar{r}) = \sum_{\sim b_i} p(\bar{b}|\bar{r}) \propto \sum_{\sim b_i} \oint_\theta p(\bar{b}|\bar{r},\bar{\theta})p(\bar{\theta})d\bar{\theta} \propto$$

$$\sum_{\sim b_i} 1_{\bar{b}\in C} \oint_\theta p(\bar{y}|\bar{r},\bar{\theta})p(\bar{\theta})d\bar{\theta} \propto \sum_{\sim b_i} 1_{\bar{b}\in C} \oint_\theta \left(\prod_i p(r_i|y_i,\theta_i)\right)p(\bar{\theta})d\bar{\theta}$$

$$p(r_i|y_i,\theta_i) = (2\pi\sigma^2)^{-1/2}e^{(-|r_i-y_ie^{j\theta_i}|^2/2\sigma^2)}$$

where $1_{\bar{b}\in C}$ is enforcing the code constraints.
For random walk phase model, $$p(\bar{\theta}) = \prod_i p(\theta_i|\theta_{i-1}) = \prod_i (2\pi\sigma_w^2)^{-1/2}\sum_{n\in Z}e^{-((\theta_i-\theta_{i-1})+n2\pi)^2/2\sigma_w^2} \quad (23)$$

Figure 43:
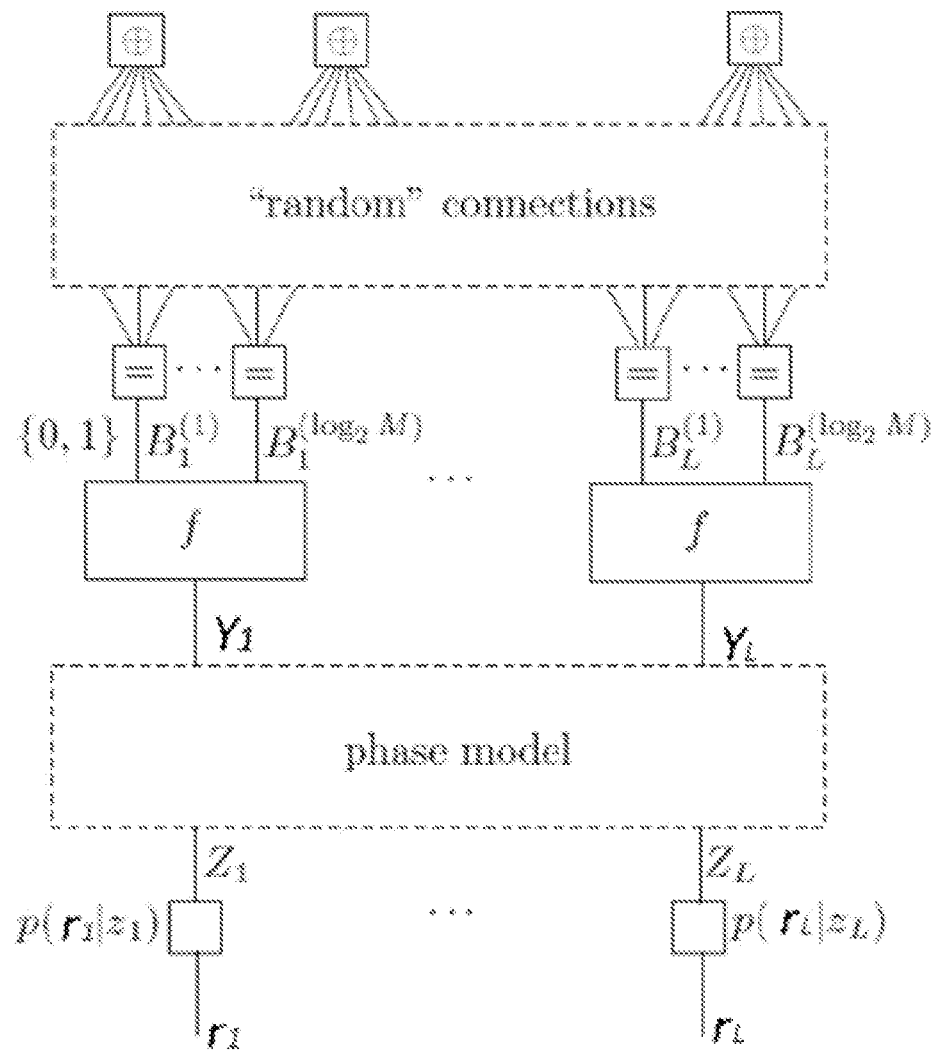
FIG. 43 is a factor graph of a decoder and phase estimator.
Figure 44:
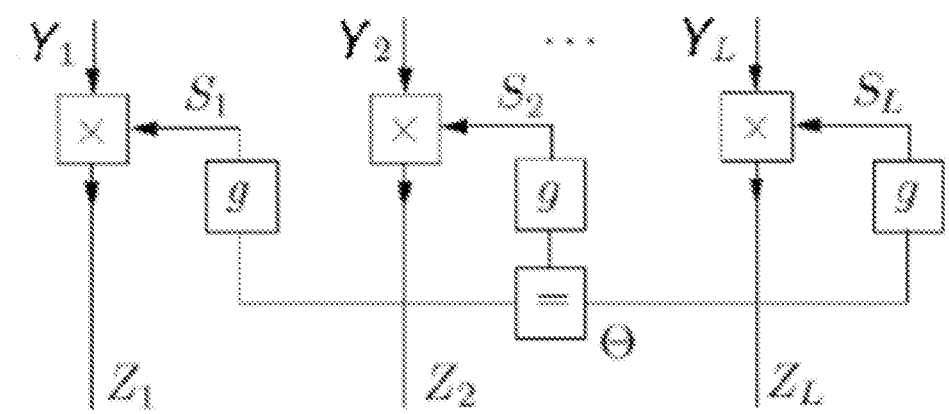
FIG. 44 is a factor graph of a constant phase model.
Figure 45:
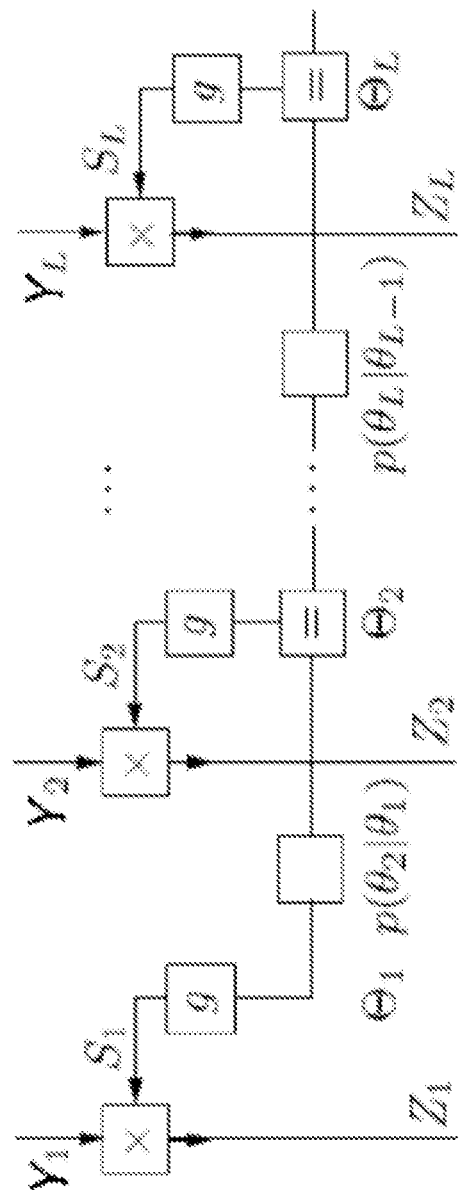
FIG. 45 is a factor graph of a random walk phase model.

Factor Graph Representation
FIG. 43 illustrates factor graph of decoder and phase estimator. $y_i$ is the received signal, $Z_i=X_ie^{j\Theta i}$, $X_i$ are symbols, $B_i^{(j)}$ are bit values from ith symbol.
Phase Models
FIG. 44 illustrates factor graph of constant Phase model i.e., $(\theta_t=\theta_0)$. The equality node copy the same message across connected nodes.
FIG. 45 illustrates factor graph of Random walk phase model, i.e. $(\theta_t=\theta_{t-1}+w_t, w_t \sim N(0, \sigma^2_w))$. $p(\theta_i|\theta_i-1)$ is given by eq. (23).
Schedule
1 Initialize by passing $p(r_i|z_i)$ towards phase model.
2 One or more iterations in the graph of phase model to update the value of $p(\theta_i)$ using forward/backward sweep in the graph.

Figure 46:
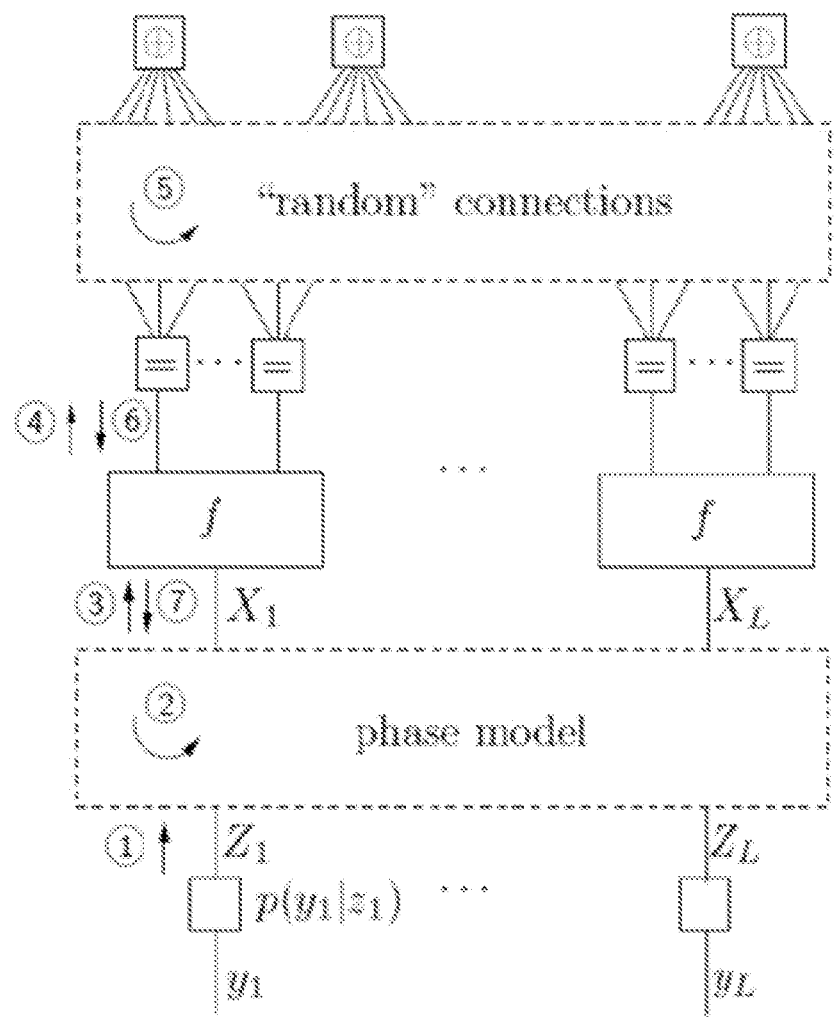
FIG. 46 illustrates message update schedule for factor graph.
Figure 47:
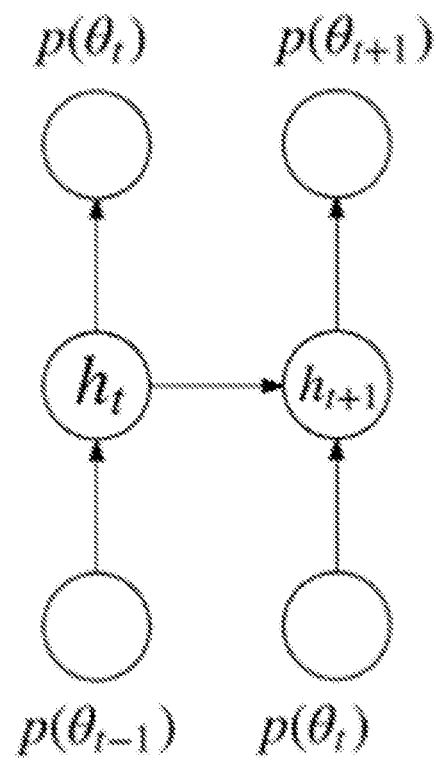
FIG. 47 illustrates implementation using recurrent neural networks.

3 Send p(y_i|r_i) towards mapper node f.
4 Convert symbol probability p(y_i) to LLR of the corresponding bits.
5 One or more iterations of decoder algorithm to update the LLR values.
6 Calculate symbol probability from LLR.
7 Send updated p(y_i|r_i) back to phase model.
Iterate step (2) to (7) until convergence or available time is over.
FIG. 46 illustrates message update schedule for factor graph.
Implementation Using Recurrent Neural Networks
FIG. 47 illustrates implementation using Recurrent neural network (RNN). RNN will keep track of phase errors. Current estimate of phase error will be based on the networks hidden state and previous estimate of phase error. The phase estimator p(θ) will marginalize the message p(X; θ) to provide p(X), probability of symbol. Decoder will update the symbol probability and send this message back to the marginal nodes. Based on the new p(θ), the RNN will update its hidden state for next time step.

ABBREVIATIONS

At least some of the following abbreviations may be used in this disclosure. If there is an inconsistency between abbreviations, preference should be given to how it is used above. If listed multiple times below, the first listing should be preferred over any subsequent listing(s).
AWGN Additive White Gaussian Noise
BCH Bose-Chaudhuri-Hocquenghem (class of codes named after inventors)
BER Bit Error Rate
BLER Block Error Rate
DNN Deep Neural Network
NN Neural Network
NND Neural Network Decoder
LLR Log Likelihood Ratio
SNR Signal-to-Noise Ratio
SPA Sum Product Algorithm

The invention claimed is:

1. A method for training a Neural Network (NN) to recover a codeword of a Forward Error Correction (FEC) code from a received signal, wherein layers of the NN implement sequential iterations of a Sum Product Algorithm (SPA), and wherein the received signal comprises a transmitted codeword and added noise, the method comprising:
inputting to an input layer of the NN a representation of message bits obtained from a received noisy signal;
propagating the representation through the NN; and
optimising trainable parameters of the NN to minimise a loss function;
wherein propagating the representation through the NN comprises, at even layers of the NN:
generating an intermediate output representation;
generating an intermediate output codeword from the intermediate output representation; and
performing a syndrome check on the generated intermediate output codeword; and
wherein optimising the trainable parameters of the NN to minimise the loss function comprises:
if the syndrome check is unsatisfied, continuing optimisation of the trainable parameters; and
if the syndrome check is satisfied, ceasing the optimisation of the trainable parameters after optimisation at a layer at which the syndrome check is satisfied.

2. The method as claimed in claim 1, wherein performing the syndrome check on the generated intermediate output codeword comprises checking whether the generated intermediate output codeword satisfies conditions for a codeword to be a member of a codebook to which a training codeword belongs.

3. The method as claimed in claim 1, wherein optimising the trainable parameters of the NN to minimise the loss function comprises minimising the loss function calculated on the basis of at least one intermediate output representation selected from the set comprising intermediate output representations available at layers up to and including the layer at which the syndrome check is satisfied.

4. The method as claimed in claim 1, wherein the loss function is a cross entropy loss function calculated on the basis of the intermediate output representation at the layer at which the syndrome check is satisfied.

5. The method as claimed in claim 1, wherein the loss function comprises:

$$\text{Loss} = \frac{-1}{N} \sum_{v=1}^{N} 1_{\{\hat{o}_{i,v} \times H^T = 0^T\}} (t_v \log(o_{i,v}) + (1 - t_v)\log(1 - o_{i,v}))$$

wherein: N is a number of bits in the transmitted codeword,
I{f} is an indicator function,
H is a parity check matrix of a code to which the transmitted codeword belongs,
o(i,v) is an output representation of the NN at i-th layer of the network corresponding to v-th bit in the transmitted codeword,
$\hat{o}_{i,v}$ is a vector of the intermediate output codeword at the i-th layer, and
tv is a target value of the v-th bit of the transmitted codeword.

6. The method as claimed in claim 1, wherein the loss function is a cross entropy multi-loss function calculated on the basis of all intermediate output representations at layers up to and including the layer at which the syndrome check is satisfied.

7. The method as claimed in claim 1, wherein the loss function comprises:

$$\text{Loss} = \frac{-1}{MN} \sum_{i=2,4,\ldots}^{2M} \left( \sum_{v=1}^{N} (t_v \log(o_{i,v}) + (1 - t_v)\log(1 - o_{i,v})) \right)$$

wherein: N is a number of bits in the transmitted codeword,
o(i,v) is an output representation of the NN at ith layer of the network corresponding to v-th bit in the transmitted codeword,
tv is a target value of the with bit of the transmitted codeword,
2L is a number of hidden layers in the NN, and
if the syndrome check is satisfied at an even layer k: 0<k<2L, then 2M=k, else 2M=2L.

8. The method as claimed in claim 2, wherein the training codeword comprises a codeword of a binary linear block code.

9. The method as claimed in claim 1, wherein the representation of message bits obtained from a received noisy signal that is input to the input layer of the NN comprises an array of Log-Likelihood Ratios (LLRs) of the individual message bits obtained from the received noisy signal.

10. The method as claimed in claim 1, wherein the NN comprises a Neural Network Decoder (NND).

11. The method as claimed in claim 1, further comprising using an optimal SNR range for training the NN to achieve optimal performance for a code and communication channel under consideration.

12. A method for decoding a received signal using a Neural Network (NN), wherein layers of the NN implement sequential iterations of a Sum Product Algorithm (SPA), and wherein the received signal comprises a transmitted codeword of a Forward Error Correction (FEC) code and added noise, the method comprising:
  inputting to an input layer of the NN a representation of message bits obtained from the received noisy signal;
  propagating the representation through the NN; and
  outputting a recovered codeword from the NN;
    wherein propagating the received signal through the NN comprises, at even layers of the NN:
      generating an intermediate output representation;
      generating an intermediate output codeword from the intermediate output representation;
      performing a syndrome check on the generated intermediate output codeword;
      if the syndrome check is unsatisfied, continuing propagation of the representation through the NN; and
      if the syndrome check is satisfied:
        ceasing the propagation of the representation through the NN at a layer at which the syndrome check is satisfied, and
        identifying the intermediate output codeword for which the syndrome check is satisfied as the recovered codeword for outputting from the NN.

13. The method as claimed in claim 12, wherein performing the syndrome check on the generated intermediate output codeword comprises checking whether the generated intermediate output codeword satisfies conditions for a codeword to be a member of a codebook to which the transmitted codeword belongs.

14. The method as claimed in claim 12, wherein the transmitted codeword comprises a codeword of a binary linear block code.

15. The method as claimed in claim 12, wherein the representation of message bits obtained from a received noisy signal that is input to the input layer of the NN comprises an array of Log-Likelihood Ratios (LLRs) of the individual message bits obtained from the received noisy signal.

16. The method as claimed in claim 12, wherein the NN comprises a Neural Network Decoder (NND).

17. The method as claimed in claim 12, wherein the transmitted codeword comprises at least one of:
  a test codeword received during a testing phase of the NN; or
  a codeword received during an online phase of the NN.

18. A computer program product comprising a non transitory computer readable medium having stored thereon a computer program comprising computer readable program instructions which, when executed on at least one processor, cause the at least one processor to carry out the method according to claim 1.

19. A computer program product comprising a non transitory computer readable medium having stored thereon a computer program comprising computer readable program instructions which, when executed on at least one processor, cause the at least one processor to carry out the method according to claim 12.

20. A controller for training a Neural Network (NN) to recover a codeword of a Forward Error Correction (FEC) code from a received signal, wherein layers of the NN implement sequential iterations of a Sum Product Algorithm (SPA), and wherein the received signal comprises a transmitted codeword and added noise, the controller comprising a processor and a memory, the memory containing instructions executable by the processor such that the controller is operable to:
  input to an input layer of the NN a representation of message bits obtained from a received noisy signal;
  propagate the representation through the NN; and
  optimise trainable parameters of the NN to minimise a loss function;
    wherein propagating the representation through the NN comprises, at even layers of the NN:
      generating an intermediate output representation;
      generating an intermediate output codeword from the intermediate output representation; and
      performing a syndrome check on the generated intermediate output codeword; and
    wherein optimising the trainable parameters of the NN to minimise the loss function comprises:
      if the syndrome check is unsatisfied, continuing optimisation of the trainable parameters; and
      if the syndrome check is satisfied, ceasing the optimisation of the trainable parameters after optimisation at a layer at which the syndrome check is satisfied.

21. A controller for training a Neural Network (NN) to recover a codeword of a Forward Error Correction (FEC) code from a received signal, wherein layers of the NN implement sequential iterations of a Sum Product Algorithm (SPA), and wherein the received signal comprises a transmitted codeword and added noise, the controller adapted to:
  input to an input layer of the NN a representation of message bits obtained from a received noisy signal;
  propagate the representation through the NN; and
  optimise trainable parameters of the NN to minimise a loss function;
    wherein propagating the representation through the NN comprises, at even layers of the NN:
      generating an intermediate output representation;
      generating an intermediate output codeword from the intermediate output representation; and
      performing a syndrome check on the generated intermediate output codeword; and
    wherein optimising the trainable parameters of the NN to minimise the loss function comprises:
      if the syndrome check is unsatisfied, continuing optimisation of the trainable parameters; and
      if the syndrome check is satisfied, ceasing the optimisation of the trainable parameters after optimisation at a layer at which the syndrome check is satisfied.

22. A controller for decoding a received signal using a Neural Network (NN), wherein layers of the NN implement sequential iterations of a Sum Product Algorithm (SPA), and wherein the received signal comprises a transmitted codeword of a Forward Error Correction (FEC) code and added noise, the controller comprising a processor and a memory, the memory containing instructions executable by the processor such that the controller is operable to:

input to an input layer of the NN a representation of message bits obtained from the received noisy signal;
propagate the representation through the NN; and
output a recovered codeword from the NN;
  wherein propagating the representation through the NN comprises, at even layers of the NN:
    generating an intermediate output representation;
    generating an intermediate output codeword from the intermediate output representation performing a syndrome check on the generated intermediate output codeword;
    if the syndrome check is unsatisfied, continuing propagation of the representation through the NN; and
    if the syndrome check is satisfied:
      ceasing the propagation of the representation through the NN at a layer at which the syndrome check is satisfied, and
      identifying the intermediate output codeword for which the syndrome check is satisfied as the recovered codeword for outputting from the NN.

23. A controller for decoding a received signal using a Neural Network (NN), wherein layers of the NN implement sequential iterations of a Sum Product Algorithm (SPA), and wherein the received signal comprises a transmitted codeword of a Forward Error Correction (FEC) code and added noise, the controller adapted to:
  input to an input layer of the NN a representation of message bits obtained from the received noisy signal;
  propagate the representation through the NN; and
  output a recovered codeword from the NN;
    wherein propagating the representation through the NN comprises, at even layers of the NN:
      generating an intermediate output representation;
      generating an intermediate output codeword from the intermediate output representation;
      performing a syndrome check on the generated intermediate output codeword;
      if the syndrome check is unsatisfied, continuing propagation of the representation through the NN; and
      if the syndrome check is satisfied:
        ceasing the propagation of the representation through the NN at a layer at which the syndrome check is satisfied, and
        identifying the intermediate output codeword for which the syndrome check is satisfied as the recovered codeword for outputting from the NN.

24. A system comprising a plurality of network nodes configured to:
  receive a signal comprising a transmitted codeword of a Forward Error Correction (FEC) code and added noise;
  input to an input layer of a Neural Network (NN) a representation of message bits obtained from the received noisy signal, wherein layers of the NN implement sequential iterations of a Sum Product Algorithm (SPA);
  propagate the representation through the NN; and
  output a recovered codeword from the NN;
    wherein propagating the representation through the NN comprises, at even layers of the NN:
      generating an intermediate output representation;
      generating an intermediate output codeword from the intermediate output representation;
      performing a syndrome check on the generated intermediate output codeword;
      if the syndrome check is unsatisfied, continuing propagation of the representation through the NN; and
      if the syndrome check is satisfied:
        ceasing the propagation of the representation through the NN at a layer at which the syndrome check is satisfied, and
        identifying the intermediate output codeword for which the syndrome check is satisfied as the recovered codeword for outputting from the NN.

25. The system as claimed in claim 24, wherein the system comprises a base station node and a processing node, and wherein the base station node is configured to receive the signal and the processing node is configured to propagate the representation through the NN and output a recovered codeword from the NN.

* * * * *